United States Patent
Clampitt et al.

(10) Patent No.: US 11,910,601 B2
(45) Date of Patent: Feb. 20, 2024

(54) MICROELECTRONIC DEVICES WITH SOURCE REGION VERTICALLY BETWEEN TIERED DECKS, AND RELATED METHODS AND SYSTEMS

(71) Applicant: Micron Technology, Inc., Boise, ID (US)

(72) Inventors: Darwin A. Clampitt, Wilder, ID (US); John D. Hopkins, Meridian, ID (US); Matthew J. King, Boise, ID (US); Roger W. Lindsay, Boise, ID (US); Kevin Y. Titus, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 216 days.

(21) Appl. No.: 17/141,968

(22) Filed: Jan. 5, 2021

(65) Prior Publication Data

US 2022/0216229 A1    Jul. 7, 2022

(51) Int. Cl.
*H10B 43/27* (2023.01)
*H01L 23/522* (2006.01)
*H10B 41/27* (2023.01)

(52) U.S. Cl.
CPC ......... *H10B 43/27* (2023.02); *H01L 23/5226* (2013.01); *H10B 41/27* (2023.02)

(58) Field of Classification Search
None
See application file for complete search history.

(56) References Cited

U.S. PATENT DOCUMENTS

| | | |
|---|---|---|
| 9,837,312 B1 | 12/2017 | Tan et al. |
| 10,186,426 B2 | 1/2019 | Kanarik et al. |
| 2017/0062460 A1* | 3/2017 | Nishida ................. H10B 43/27 |
| 2019/0096901 A1* | 3/2019 | Dai ........................ H10B 43/10 |
| 2019/0319040 A1* | 10/2019 | Ishii ...................... H10B 41/30 |
| 2021/0118899 A1 | 4/2021 | King |
| 2021/0142841 A1* | 5/2021 | Nishikawa ............... G11C 7/14 |

OTHER PUBLICATIONS

Clampitt et al., Semiconductor Device Including Stacked Data Lines, U.S. Appl. No. 16/664,280, filed Oct. 25, 2019, 75 pages.
LAM Blog Staff, New Atomic Layer Etching Capability Enables Continued Device Scaling, https://blog.lamresearch.com/new-atomic-layer-ething-capability-enables-continued-device-scaling, Sep. 6, 2016, 3 pages.

* cited by examiner

*Primary Examiner* — Sarah K Salerno
(74) *Attorney, Agent, or Firm* — TraskBritt

(57) ABSTRACT

A microelectronic device includes a pair of stack structures. The pair comprises a lower stack structure and an upper stack structure overlying the lower stack structure. The lower stack structure and the upper stack structure each comprise a vertically alternating sequence of insulative structures and conductive structures arranged in tiers. A source region is vertically interposed between the lower stack structure and the upper stack structure. A first array of pillars extends through the upper stack structure, from proximate the source region toward a first drain region above the upper stack structure. A second array of pillars extend through the lower stack structure, from proximate the source region toward a second drain region below the lower stack structure. Additional microelectronic devices are also disclosed, as are related methods and electronic systems.

23 Claims, 68 Drawing Sheets

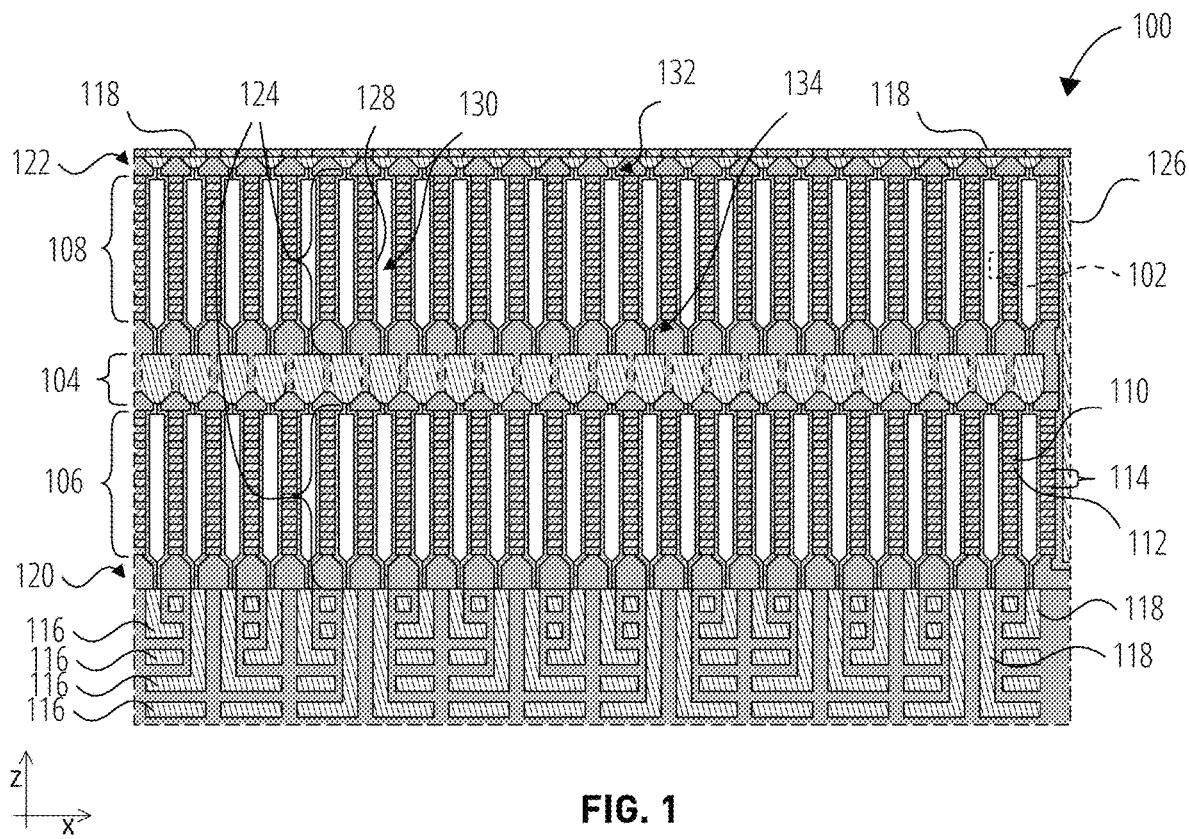
FIG. 1
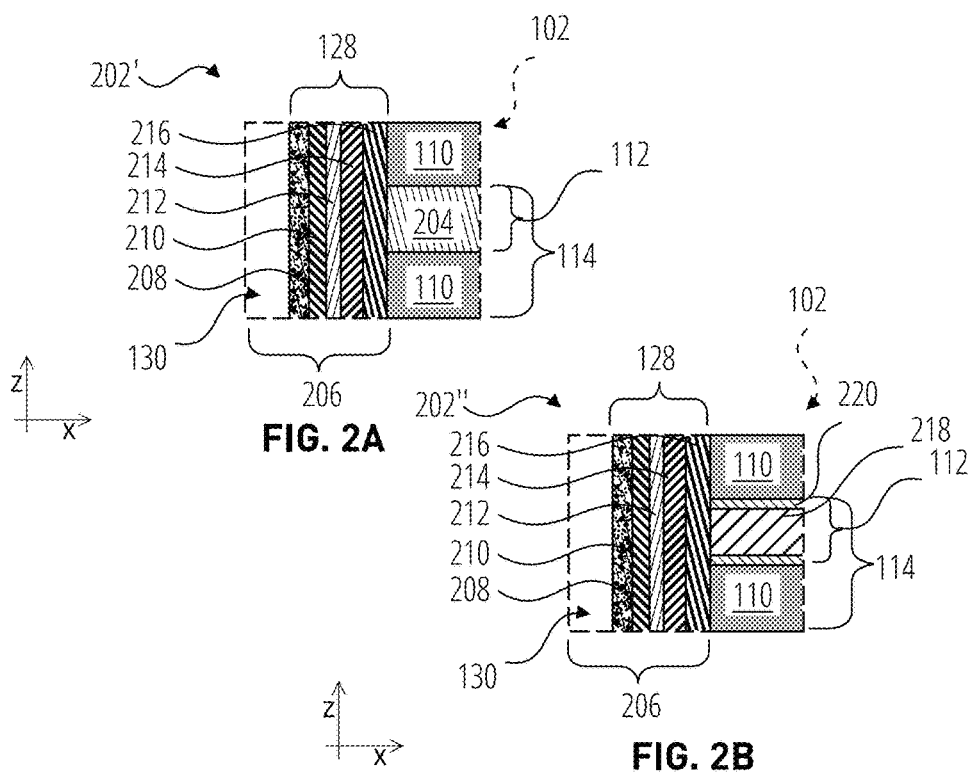
FIG. 2A
FIG. 2B

MICROELECTRONIC DEVICES WITH SOURCE REGION VERTICALLY BETWEEN TIERED DECKS, AND RELATED METHODS AND SYSTEMS

TECHNICAL FIELD

Embodiments of the disclosure relate to the field of microelectronic device design and fabrication. More particularly, the disclosure relates to methods for forming microelectronic devices (e.g., memory devices, such as 3D NAND memory devices) having tiered stack structures that include vertically alternating conductive structures and insulative structures, to related systems, and to methods for forming such structures and devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line).

In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source line. A 3D NAND memory device also includes electrical connections between, e.g., access lines (e.g., word lines) and other conductive structures of the device so that the memory cells of the vertical strings can be selected for writing, reading, and erasing operations.

Forming 3D NAND memory devices tends to present challenges. For example, the electrical resistance exhibited by material of channel structures may place practical limitations on the vertical height of the channel. Limitations on channel height effectively limits the number of word line tiers that may be included in a stack of tiers between the drain end and the source end. Accordingly, designing and fabricating microelectronic devices, such as 3D NAND memory devices, continues to present challenges.

BRIEF DESCRIPTION OF THE DRAWINGS

FIG. 1 is a cross-sectional, elevational, schematic illustration of a microelectronic device structure, wherein an interdeck source region is vertically interposed between a pair of tiered decks, in accordance with embodiments of the disclosure.

FIG. 2A is a cross-sectional, elevational, schematic illustration of a memory cell, in accordance with embodiments of the disclosure, the illustrated area corresponding to box 102 of FIG. 1.

FIG. 2B is a cross-sectional, elevational, schematic illustration of a memory cell, in accordance with embodiments of the disclosure, the illustrated area corresponding to box 102 of FIG. 1, wherein a conductive structure includes a conductive liner material.

FIG. 3A through FIG. 35C illustrate various stages of processing to fabricate the microelectronic device structure of FIG. 1, in accordance with embodiments of the disclosure, wherein:

FIG. 3A is a top plan, schematic illustration of the microelectronic device structure during a stage of processing.

FIG. 27 is a top plan, schematic illustration of the microelectronic device structure during a stage of processing following that of FIG. 26A through FIG. 26C.

FIG. 35C is a cross-sectional, elevational, schematic illustration taken along section line C-C of FIG. 35A.

DETAILED DESCRIPTION

Figure 3A:
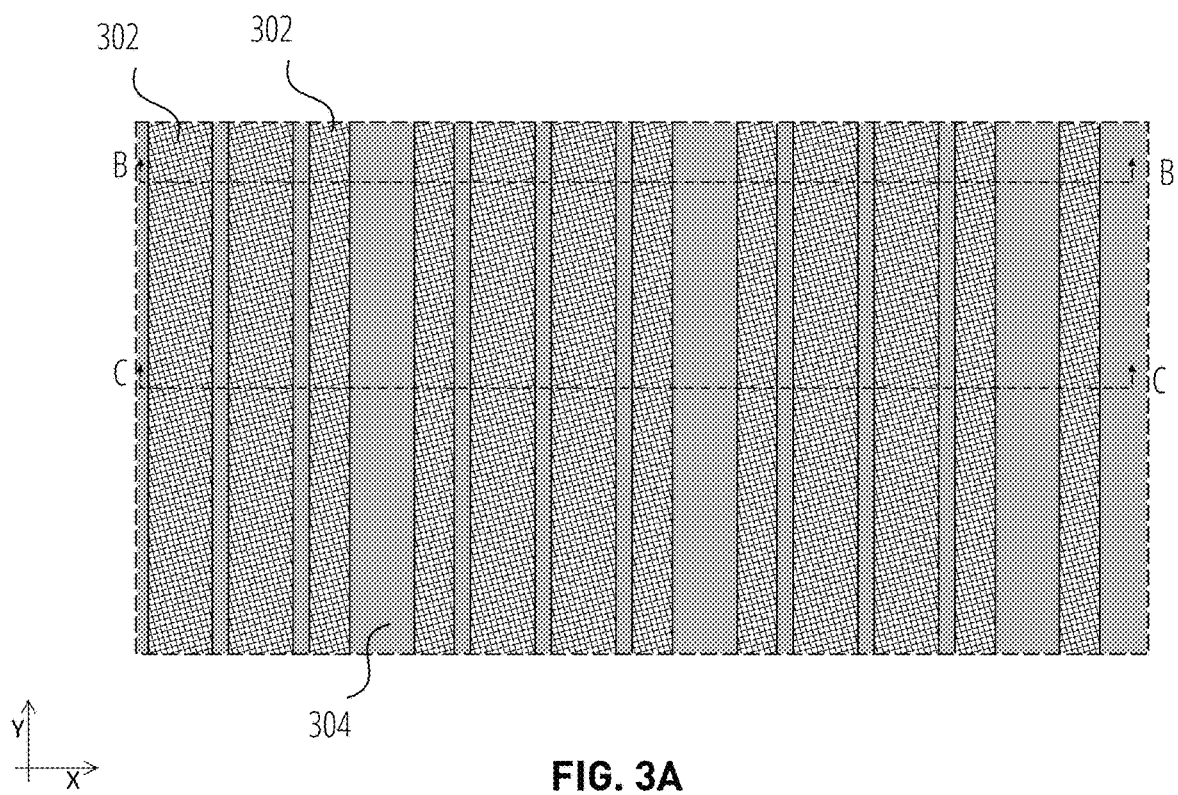

Structures (e.g., microelectronic device structures), apparatus (e.g., microelectronic devices), and systems (e.g., electronic systems), in accordance with embodiments of the disclosure, include a pair of decks—each deck including a stack of vertically alternating conductive structures and insulative structures arranged in tiers through which pillars vertically extend—with a source region vertically interposed between the decks (also referred to herein as an "interdeck source region"), a drain region below the lower deck, and another drain region above the upper deck. Pillars of the lower deck extend between the lower drain region and the inter-deck source region, while pillars of an upper deck extend between the upper drain region and the inter-deck source region. Accordingly, the source-to-drain distance—and therefore the channel height of the pillars—is effectively about half what it would be if the source region were below the lower deck, one drain region above the upper deck, and the pillars extending through both decks from source region to drain region. In the latter device structure, a channel material's electrical resistance may effectively limit the number (e.g., quantity) of word line tiers—between source region and drain region (e.g., between the bottom of the lower deck and the top of the second deck)—to, say, "N" number of word line tiers. In contrast, according to the embodiments of the disclosure with the interdeck source region, the resistance limitations of the same channel material may enable about twice N ("2N") number (e.g., quantity) of word line tiers in the two-deck structure, with N number of tiers in the lower deck and a second N number of tiers in the upper deck. Therefore, the microelectronic device with the interdeck source region facilitates an increased number of word line tiers in the structure and less limitation due to channel material resistance.

As used herein, the terms "opening," "trench," "slit," "recess," "void," and "seam" mean and include a volume extending through or into at least one structure or at least one material, leaving a gap in that at least one structure or at least one material, or a volume extending between structures or materials, leaving a gap between the structures or materials. Unless otherwise described, an "opening," "trench," "slit," and/or "recess" is not necessarily empty of material. That is, an "opening," "trench," "slit," or "recess" is not necessarily void space. An "opening," "trench," "slit," or "recess" formed in or between structures or materials may comprise structure(s) or material(s) other than that in or between which the opening is formed. And, structure(s) or material(s) "exposed" within an opening, trench, slit, or recess is/are not necessarily in contact with an atmosphere or non-solid environment. Structure(s) or material(s) "exposed" within an opening, trench, slit, or recess may be adjacent or in contact with other structure(s) or material(s) that is/are disposed within the opening, trench, slit, or recess. In contrast, unless otherwise described, a "void" and/or "seam" may be substantially or wholly empty of material. A "void" or "seam" formed in or between structures or materials may not comprise structure(s) or material(s) other than that in or between which the "void" or "seam" is formed. And, structure(s) or material(s) "exposed" within a "void" or "seam" may be in contact with an atmosphere or non-solid environment.

As used herein, the terms "trench," "slit," and "seam" mean and include an elongate opening, while the terms "opening" and "void" may include either or both an elongate opening or elongate void, respectively, and/or a non-elongate opening or a non-elongate void.

As used herein, the terms "substrate" and "base structure" mean and include a base material or other construction upon which components, such as those within memory cells, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the term "insulative," when used in reference to a material or structure, means and includes a material or structure that is electrically insulating. An "insulative" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_{-x}$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "sacrificial," when used in reference to a material or structure, means and includes a material or structure that is formed during a fabrication process but which is removed (e.g., substantially removed) prior to completion of the fabrication process.

As used herein, the term "horizontal" means and includes a direction that is parallel to a primary surface of the substrate on which the referenced material or structure is located. The width and length of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The width of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The length of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "vertical" means and includes a direction that is perpendicular to a primary surface of the substrate on which a referenced material or structure is located. The height of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along an indicated "X" axis in a horizontal plane (e.g., at a certain elevation, if identified), defining a maximum distance, along such "X" axis in the horizontal plane, of the material or structure in question. For example, a "width" of a structure that is at least partially hollow, or that is at least partially filled with one or more other material(s), is the horizontal dimension between outermost edges or sidewalls of the structure, such as an outer "X"-axis diameter for a hollow or filled, cylindrical structure.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question. For example, a "length" of a structure that is at least partially hollow, or that is at least partially filled with one or more other material(s), is the horizontal dimension between outermost edges or sidewalls of the structure, such as an outer "Y"-axis diameter for a hollow or filled, cylindrical structure.

As used herein, the terms "thickness" or "thinness" mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material, structure, or sub-structure relative to at least two other materials, structures, or sub-structures. The term "between" may encompass both a disposition of one material, structure, or sub-structure directly adjacent the other materials, structures, or sub-structures and a disposition of one material, structure, or sub-structure indirectly adjacent to the other materials, structures, or sub-structures.

As used herein, the term "proximate" is a spatially relative term used to describe disposition of one material, structure, or sub-structure near to another material, structure, or sub-structure. The term "proximate" includes dispositions of indirectly adjacent to, directly adjacent to, and internal to.

As used herein, the term "neighboring," when referring to a material or structure, means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is next most proximate to the particular structure of material Y. The "neighboring" material or structure may be directly or indirectly proximate the structure or material of the identified composition or characteristic.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—means and includes the parameter, property, or condition of the two such structures, materials, features, or portions being equal, substantially equal, or about equal, at least in terms of respective dispositions of such structures, materials, features, or portions. For example, two structures having a "consistent" thickness as one another may each define a same, substantially same, or about the same thickness at X lateral distance from a feature, despite the two structures being at different elevations along the feature. As another example, one structure having a "consistent" width may have two portions that each define a same, substantially same, or about the same width at elevation Y1 of such structure as at elevation Y2 of such structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, reference to an element as being "on" or "over" another element means and includes the element being directly on top of, adjacent to (e.g., laterally adjacent to, longitudinally adjacent to, vertically adjacent to), underneath, or in direct contact with the other element. It also includes the element being indirectly on top of, adjacent to (e.g., laterally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the primary surface of the substrate or base structure(s) on which the reference material or structure is located. As used herein, a "level" and an "elevation" are each defined by a horizontal plane parallel to the primary surface. "Lower levels" and "lower elevations" are nearer to the primary surface of the substrate, while "higher levels" and "higher elevations" are further from the primary surface. Unless otherwise specified, these spatially relative terms are intended to encompass different orientations of the materials in addition to the orientation as depicted in the figures. For example, the materials in the figures may be inverted, rotated, etc., with the spatially relative "elevation" descriptors remaining constant because the referenced primary surface would likewise be respectively reoriented as well.

As used herein, the terms "comprising," "including," "having," and grammatical equivalents thereof are inclusive or open-ended terms that do not exclude additional, unrecited elements or method steps, but these terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a composition (e.g., gas) described as "comprising," "including," and/or "having" a species may be a composition that, in some embodiments, includes additional species as well and/or a composition that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, a "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, in order to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1, illustrated, in elevational cross-sectional view, is a microelectronic device structure 100 that includes an interdeck source region 104 vertically interposed between a lower deck 106 and an upper deck 108. Each of the lower deck 106 and the upper deck 108 includes a stack structure of vertically alternating insulative structures 110 and conductive structures 112 arranged in tiers 114. Below the lower deck 106 is a region that includes bit lines 116 with bit line contacts 118, the latter extending between the bit lines 116 and a lower drain region 120 upon which the lower deck 106 is disposed. Above the upper deck 108 is an upper drain region 122 to which additional bit line contacts 118 extend. The bit line contacts 118 above the upper drain region 122 are in connection with additional bit lines that may be configured much like the bit lines 116 below the lower drain region 120.

In some embodiments, the bit lines 116 and bit line contacts 118 below the lower deck 106 and below the lower drain region 120—and, in some embodiments, also the additional bit lines and the additional bit line contacts 118 above the upper deck 108 and above the upper drain region 122—may be configured so that the bit lines 116 are in a stacked configuration with multiple levels of the bit lines 116. The bit lines 116 of different elevations may have different lateral widths from one another to enable physical contact between the bit line contacts 118 and their respective bit lines 116. For example, and as illustrated in FIG. 1, bit lines 116 at lower elevations may be laterally wider than bit lines 116 at higher elevations. (Correspondingly, the bit lines above the upper drain region 122 may also be stacked but, inversely, may be laterally wider at higher elevations and laterally thinner at lower elevations.) Methods for forming stacked bit lines 116 and respective bit line contacts 118 are known in the art and so are not described in detail herein.

Within each of the lower deck 106 and the upper deck 108, pillars 124 substantially vertically extend between the interdeck source region 104 and a respective one of the lower drain region 120 and the upper drain region 122. That is, within the lower deck 106, pillars 124 extend between the interdeck source region 104 and the lower drain region 120; while, within the upper deck 108, pillars 124 extend between the interdeck source region 104 and the upper drain region 122.

Additional contacts 126 may be included, in the microelectronic device structure 100, adjacent the lower deck 106 and/or the upper deck 108. These contacts 126 may provide electrical communication between other electronic components of the electronic device that includes the microelectronic device structure 100.

The pillars 124 may effectuate the formation of strings of memory cells of a memory device (e.g., a memory device including the microelectronic device structure 100 of FIG. 1). With reference to FIG. 2A and FIG. 2B, illustrated, in enlarged elevational cross-sectional view, are memory cells 202 (e.g., memory cell 202' of FIG. 2A and memory cell 202" of FIG. 2B) that may be provided in the microelectronic device structure 100 of FIG. 1. Each of the illustrations of FIG. 2A and FIG. 2B may represent a simplified enlarged view of box 102 of FIG. 1. Reference to one "memory cell 202" or multiple "memory cells 202" equally refer to one or multiple of any of the illustrated memory cell 202' of FIG. 2A and/or the illustrated memory cell 202" of FIG. 2B.

The memory cells 202 are in the vicinity of at least one of the tiers 114, with at least one of the insulative structures 110 vertically adjacent at least one of the conductive structures 112. The conductive structures 112 may be formed of and include conductive material(s) 204 formed by a so-called "replacement gate" process, discussed further below.

Adjacent the tiers 114, with the insulative structures 110 and the conductive structures 112, are materials of one of the pillars 124 (partially illustrated, in FIG. 2A and FIG. 2B, as a pillar portion 206, which may be about half of the lateral width, e.g., the diameter, of the pillar 124). As illustrated in the pillar portion 206, each of the pillars 124 includes cell materials 128 that may laterally surround an insulative void 130 (e.g., air) at an axial center of the pillar 124.

The cell materials 128 include at least a channel material 208. The channel material 208 may be horizontally interposed between the insulative void 130 and the tiers 114 of the decks (e.g., the lower deck 106, the upper deck 108). The channel material 208 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 208 includes amorphous silicon or polysilicon. In some embodiments, the channel material 208 includes a doped semiconductor material.

The channel material 208 may fully enclose (e.g., both laterally and vertically), and therefore define, the insulative void 130. As illustrated in FIG. 1, and as discussed further below, the channel material 208 (along with others of the cell materials 128) may adjoin at both a top and bottom of each pillar 124 to effectively "pinch off" and close the insulative void 130 at an upper pinch-off portion 132 and at a lower pinch-off portion 134. At a base of each of the insulative voids 130, the cell materials 128 may taper downward in lateral width (e.g., in lateral diameter) from a level of a lowest tier 114 of the respective deck (e.g., the lower deck 106, the upper deck 108) to the lower pinch-off portion 134, at which the cell materials 128 from opposing lateral sides of the pillars 124 come into contact without an interposed void and may extend vertically downward to form a "stem" portion consisting of or consisting essentially of the cell materials 128 (without interposed void space). Accordingly, the cell materials 128 may define a "Y" shape in elevational cross-section.

In some embodiments, the cell materials 128 of the memory cells 202 also include a tunnel dielectric material 210 (also referred to as a "tunneling dielectric material"), which may be horizontally adjacent the channel material 208; a memory material 212, which may be horizontally adjacent the tunnel dielectric material 210; a dielectric blocking material 214 (also referred to as a "charge blocking material"), which may be horizontally adjacent the memory material 212; and a dielectric blocking material 214, which may be horizontally adjacent the dielectric blocking material 214.

The tunnel dielectric material 210 may be formed of and include a dielectric material through which charge tunneling can be performed under suitable electrical bias conditions, such as through hot-carrier injection or by Fowler-Nordheim tunneling induced charge transfer. The tunnel dielectric material 210 may be formed of and include one or more of silicon oxide, silicon nitride, silicon oxynitride, dielectric metal oxides (e.g., aluminum oxide and hafnium oxide), dielectric metal oxynitride, dielectric metal silicates, alloys thereof, and/or combinations thereof. In some embodiments, the tunnel dielectric material 210 comprises silicon dioxide or silicon oxynitride.

The memory material 212 may comprise a charge trapping material or a conductive material. The memory material 212 may be formed of and include one or more of silicon nitride, silicon oxynitride, polysilicon (e.g., doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 212 comprises silicon nitride.

The dielectric blocking material 214 may be formed of and include a dielectric material, such as, for example, one or more of an oxide (e.g., silicon dioxide), a nitride (e.g., silicon nitride), an oxynitride (e.g., silicon oxynitride), or another material. In some embodiments, the dielectric blocking material 214 comprises silicon oxynitride.

In some embodiments, the tunnel dielectric material 210, the memory material 212, and the dielectric blocking material 214 together may form a structure configured to trap a charge, such as, for example, an oxide-nitride-oxide (ONO) structure. In some such embodiments, the tunnel dielectric material 210 comprises silicon dioxide, the memory material 212 comprises silicon nitride, and the dielectric blocking material 214 comprises silicon dioxide.

The dielectric barrier material 216 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride).

In some embodiments of memory cells, such as with the memory cell 202' of FIG. 2A, the dielectric barrier material 216 may be horizontally adjacent one of the levels of the conductive structures 112 of one of the tiers 114 of one of the decks (e.g., the lower deck 106, the upper deck 108). The channel material 208 may be horizontally interposed between the insulative void 130 and the tunnel dielectric material 210; the tunnel dielectric material 210 may be horizontally interposed between the channel material 208 and the memory material 212; the memory material 212 may be horizontally interposed between the tunnel dielectric material 210 and the dielectric blocking material 214; the dielectric blocking material 214 may be horizontally interposed between the memory material 212 and the dielectric barrier material 216; and the dielectric barrier material 216 may be horizontally interposed between the dielectric blocking material 214 and the level of the conductive structure 112.

With reference to FIG. 2B, illustrated is a memory cell 202", in accordance with embodiments of the disclosure, wherein the microelectronic device structure 100 has been formed by a replacement gate process. One or more (e.g., all) the memory cells 202' of FIG. 2A may be replaced with the memory cell 202" of FIG. 2B. The memory cell 202" may include multiple conductive material(s) 204 (FIG. 2A) within the conductive structures 112 of the tiers 114. For example, the conductive structures 112 may include a conductive material 218 within a conductive liner material 220. The conductive liner material 220 may be directly adjacent upper and lower surfaces of the insulative structures 110. The conductive material 218 may be directly vertically between portions of the conductive liner material 220. The conductive liner material 220 may comprise, for example, a seed material that enables formation of the conductive material 218 during fabrication of the memory cell 202". The conductive liner material 220 may be formed of and include, for example, a metal (e.g., titanium, tantalum), a metal nitride (e.g., tungsten nitride, titanium nitride, tantalum nitride), or another material. In some embodiments, the conductive liner material 220 comprises titanium nitride, and the conductive material 218 comprises tungsten.

In other embodiments, the conductive liner material 220 is not included, and the conductive material 218 may be directly adjacent to, and in physical contact with, the insulative structures 110, such as with the conductive material(s) 204 of the memory cell 202' of FIG. 2A, as discussed above.

Accordingly, each of the pillars 124 (FIG. 1) may provide a string of memory cells 202 extending vertically, or at least partially vertically, through one of the decks (e.g., the lower deck 106, the upper deck 108) from the interdeck source region 104 toward one of a pair of drain regions (e.g., toward the lower drain region 120 or the upper drain region 122). With the source region (e.g., the interdeck source region 104) vertically interposed between the two decks (e.g., between the upper deck 108 and the lower deck 106), each channel region (formed by the channel material 208) extends a height of only about one-half the combined height of the decks, from the lowest elevation of the lower deck 106 to the highest elevation of the upper deck 108. Accordingly, the number of (e.g., quantity of) tiers 114 in each of the decks (e.g., in each of the lower deck 106 and the upper deck 108) may be increased (e.g., scaled up) significantly—compared to a structure with channel material extending between a source region at a bottom of a lower deck and a drain region at a top of an upper deck, or vice versa—until reaching the limitations of the electrical resistance exhibited by the channel material 208. Thus, the configuration of the source region (e.g., the interdeck source region 104) being vertically interposed between the pillars of the tiered decks (e.g., between the lower deck 106 and the upper deck 108) enables inclusion of a greater number of functional word line tiers (e.g., provided by the conductive structures 112) and a greater number of memory cells 202 (e.g., the memory cell 202' of FIG. 2A, the memory cell 202" of FIG. 2B) in the microelectronic device structure 100.

Accordingly, disclosed is a microelectronic device comprising a pair of stack structures. The pair comprises a lower stack structure and an upper stack structure overlying the lower stack structure. The lower stack structure and the upper stack structure each comprise a vertically alternating sequence of insulative structures and conductive structures arranged in tiers. A source region is vertically interposed between the lower stack structure and the upper stack structure. A first array of pillars extends—through the upper stack structure—from proximate the source region toward a first drain region above the upper stack structure. A second array of pillars extends—through the lower stack structure—from proximate the source region toward a second drain region below the lower stack structure.

With reference to FIG. 3A through FIG. 35C, illustrated are various stages for forming a microelectronic device, such as one including the microelectronic device structure 100 of FIG. 1. For ease of illustration, the referenced illustrations are generally single-plane illustrations not including illustrations of elements behind the plane illustrated, except were indicated in the discussion below.

Figure 3B:
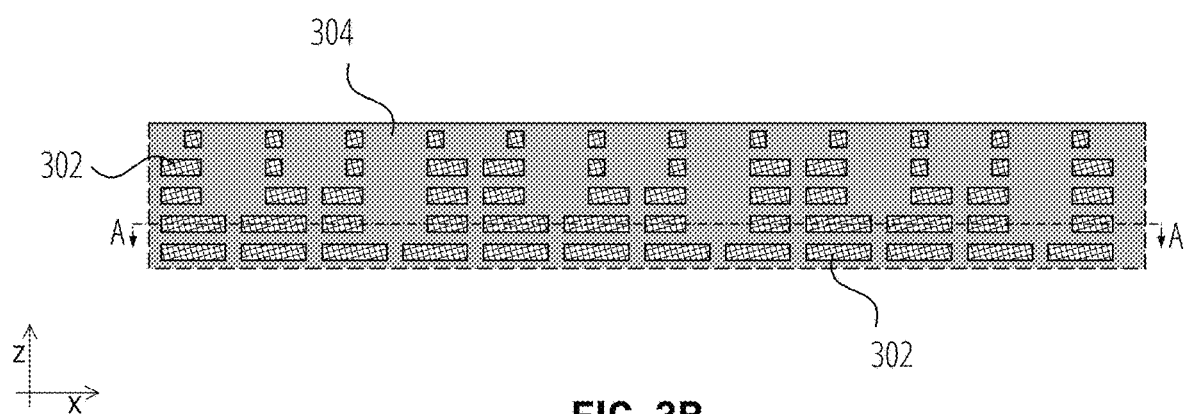
FIG. 3B is a cross-sectional, elevational, schematic illustration of the structure illustrated in FIG. 3A, wherein the view of FIG. 3A corresponds to the elevation at section line A-A of FIG. 3B, and wherein the view of FIG. 3B corresponds to section line B-B of FIG. 3A as well as to section line C-C of FIG. 3A.

With reference to FIG. 3A and FIG. 3B, sacrificial line structures 302—of the general shape and orientation of the bit lines 116 to be formed—may be formed in or otherwise supported by a base structure 304. Accordingly, the sacrificial line structures 302 may be elongate structures extending in the "Y"-axis direction. The sacrificial line structures 302 may have varying lateral (e.g., "X"-axis) widths at various elevations in the base structure 304. For example, the sacrificial line structures 302 at a lowest elevation may be laterally wider than the sacrificial line structures 302 at a highest elevation. At some elevations, such as that illustrated in plan view in FIG. 3A, laterally adjacent sacrificial line structures 302 may have different lateral widths from one another. As discussed above, this difference in lateral widths may accommodate the inclusion of the bit line contacts 118 (FIG. 1) communicating to the different elevations of bit lines 116 (FIG. 1).

The base structure 304 may be formed of and include an insulative material, such as any one of the insulative materials discussed above. For example, the base structure 304 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the base structure 304 may be formed of and include an oxide material (e.g., silicon dioxide).

The sacrificial material of the sacrificial line structure 302 may be formed of and include a material formulated to be selectively etched relative to material(s) of the base structure 304. For example, in some embodiments, in which the base structure 304 is formed of silicon dioxide, the sacrificial line structures 302 is formed of and include at least one sacrificial material selected from the group consisting of metals (e.g., tungsten, cobalt) and non-silicon oxides (e.g., aluminum oxides).

Figure 4A:
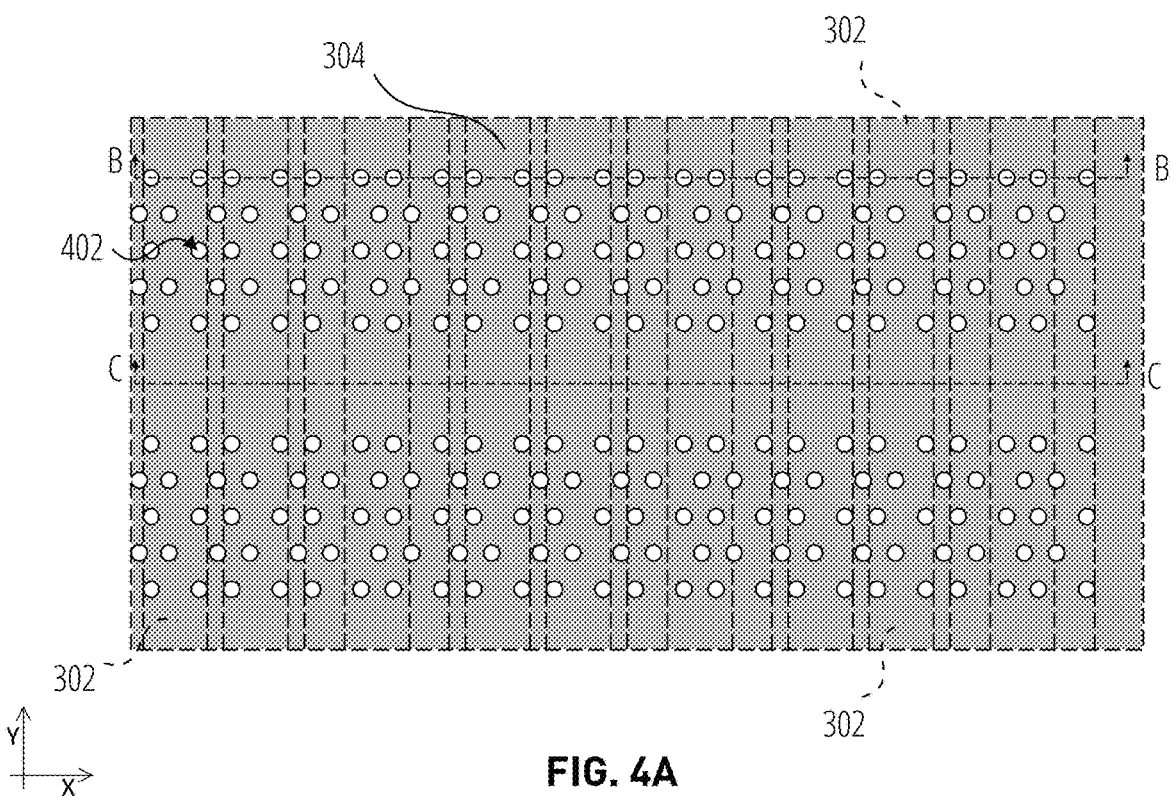
FIG. 4A is a top plan, schematic illustration of the microelectronic device structure during a stage of processing following that of FIG. 3A and FIG. 3B.
Figure 4B:
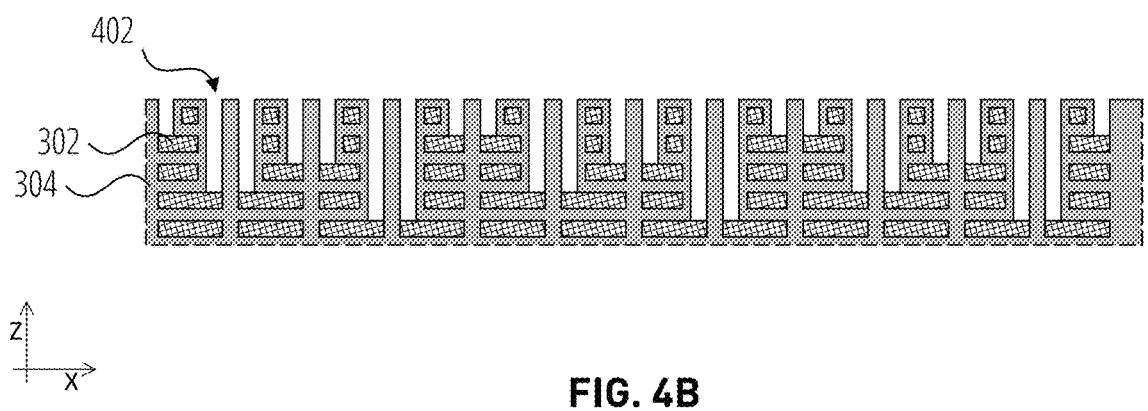
FIG. 4B is a cross-sectional, elevational, schematic illustration taken along section line B-B of FIG. 4A.
Figure 4C:
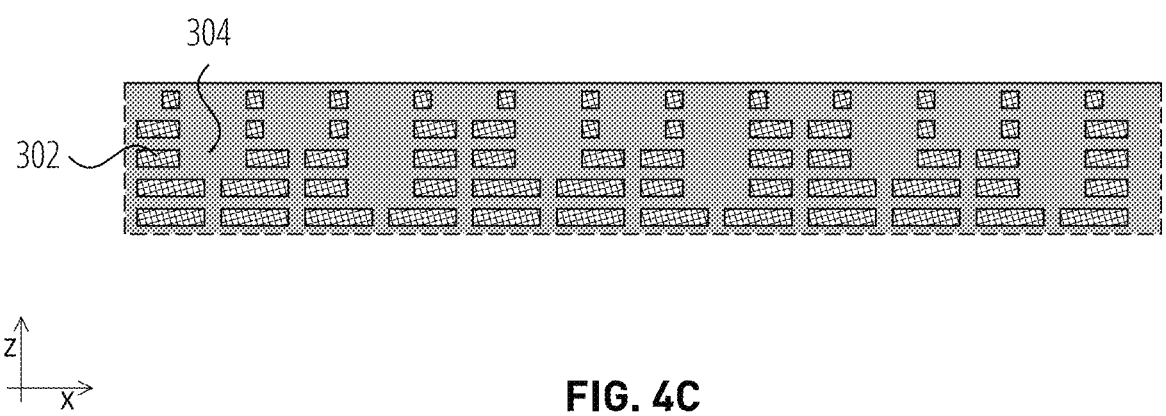
FIG. 4C is a cross-sectional, elevational, schematic illustration taken along section line C-C of FIG. 4A.

With reference to FIG. 4A, FIG. 4B, and FIG. 4C, bit contact openings 402 may be formed (e.g., etched) through the base structure 304 to the various elevations of the sacrificial line structures 302, as illustrated most clearly in FIG. 4B. The arrangement and configuration of the bit contact openings 402 may correspond to the configuration of the bit line contacts 118 (FIG. 1) to be formed. The bit contact openings 402 may be formed along portions of the structure that are to include pillar array blocks, while other portions of the structure between pillar array blocks may not include any bit contact openings 402, as illustrated in FIG. 4C.

In some embodiments, the minimum lateral width of the bit line voids 502 is selected to be greater than about twice the thickness of the cell materials 128 (FIG. 1) to be subsequently formed, and the lateral width (e.g., diameter) of the bit contact openings 402 is selected to be greater than about twice the thickness of the cell materials 128 (FIG. 1) to be subsequently formed. For example, in some embodiments, the bit line voids 502 at the upper elevations of the stacked bit line voids 502 are individually greater than about 80 nm in lateral (e.g., "X"-axis) width, and the bit contact openings 402 each have a diameter of greater than about 80 nm.

Figure 5A:
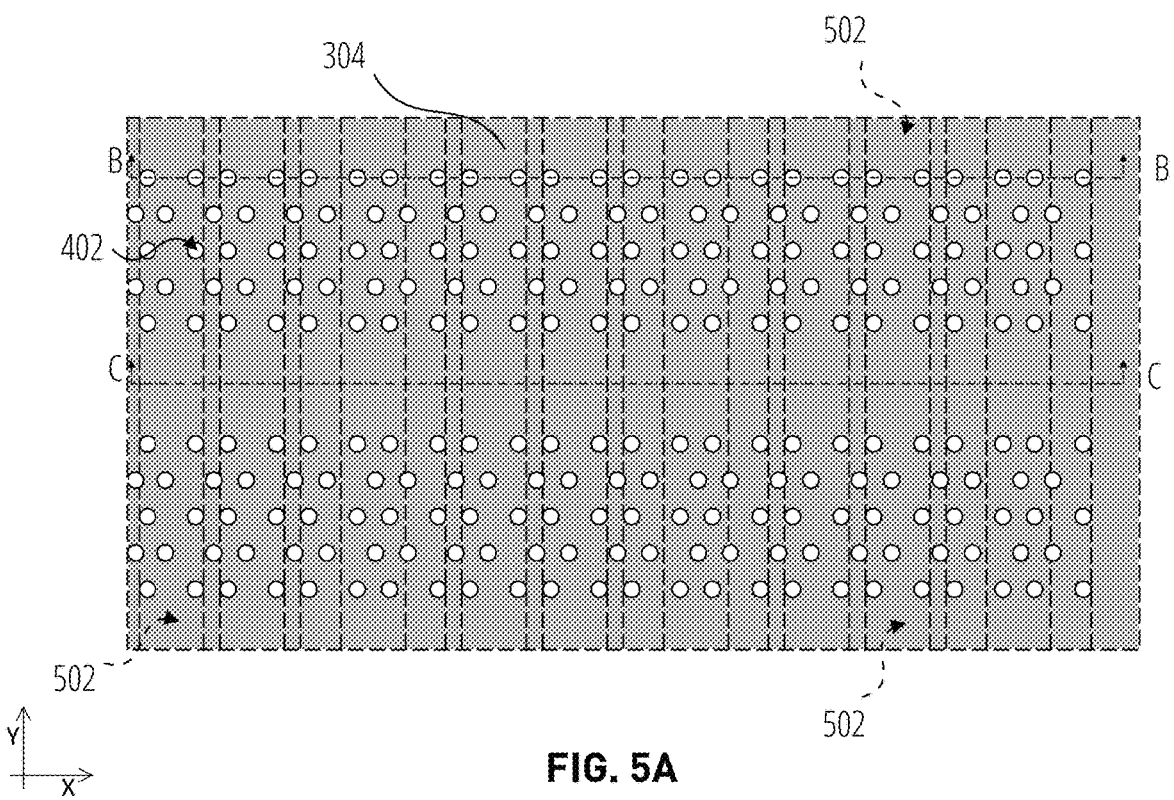
FIG. 5A is a top plan, schematic illustration of the microelectronic device structure during a stage of processing following that of FIG. 4A through FIG. 4C.
Figure 5B:
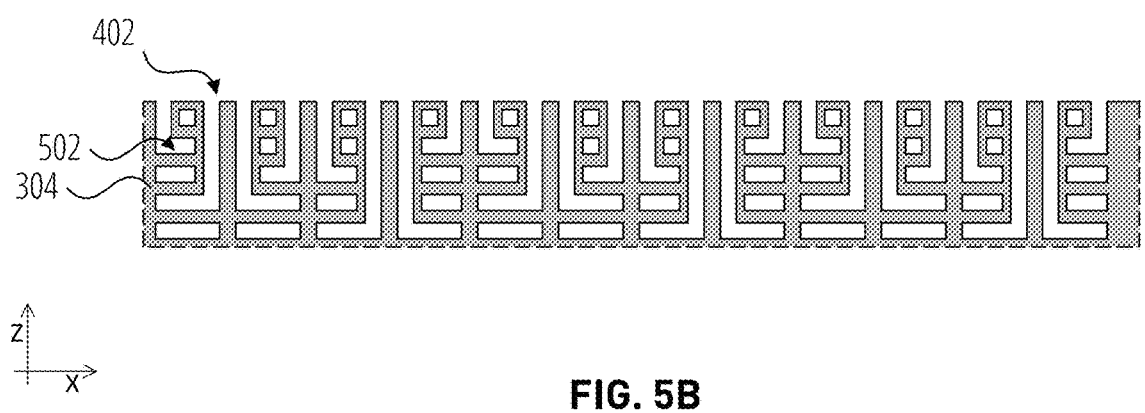
FIG. 5B is a cross-sectional, elevational, schematic illustration taken along section line B-B of FIG. 5A.
Figure 5C:
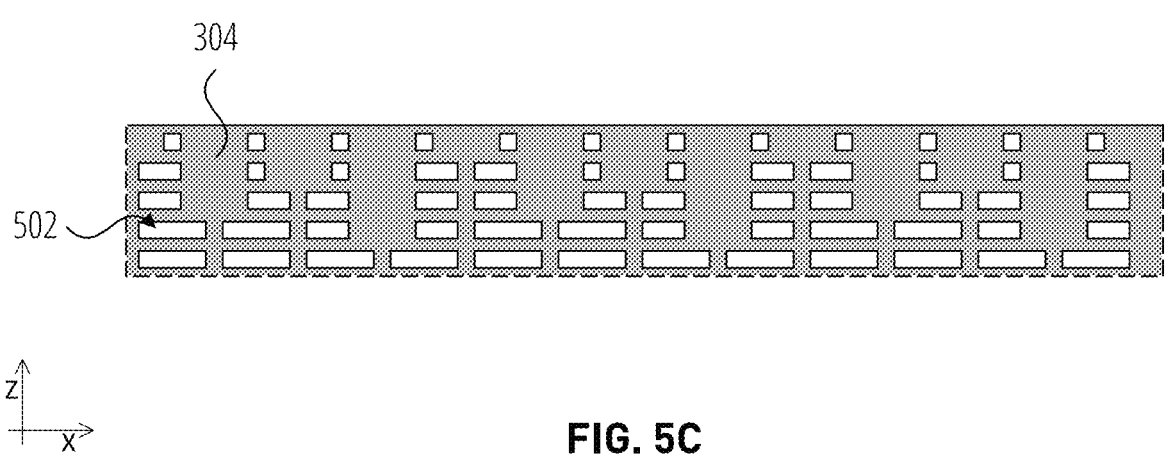
FIG. 5C is a cross-sectional, elevational, schematic illustration taken along section line C-C of FIG. 5A.

With reference to FIG. 5A, FIG. 5B, and FIG. 5C, the sacrificial material of the sacrificial line structures 302 (FIG. 4B, FIG. 4C) may be removed (e.g., exhumed) by way of the bit contact openings 402, without substantially removing material from the sacrificial line structure 302, to leave bit line voids 502 where the bit lines 116 (FIG. 1) are to be formed and to leave the bit contact openings 402 where the bit line contacts 118 (FIG. 1) are to be formed.

Figure 6A:
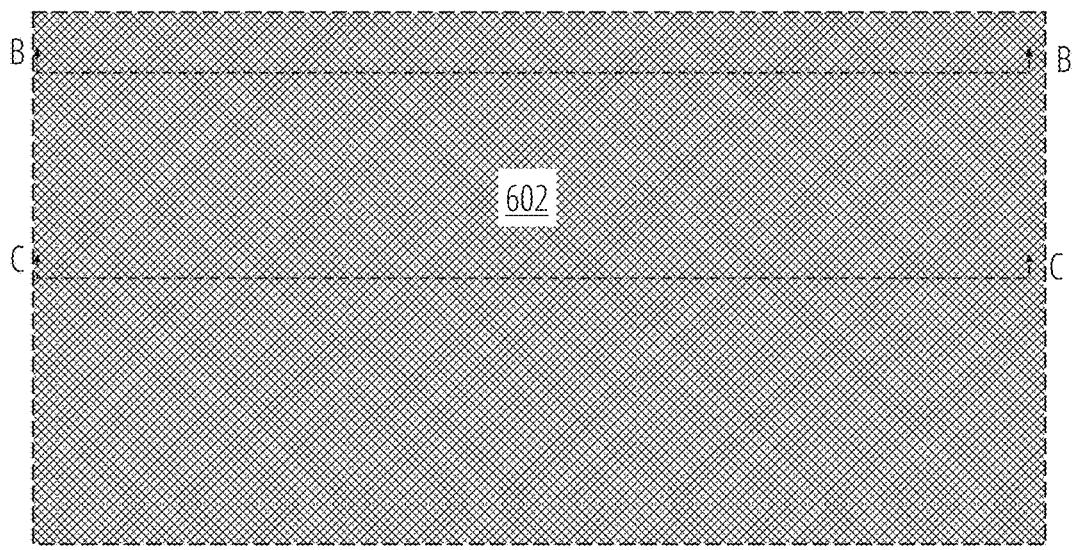
FIG. 6A is a top plan, schematic illustration of the microelectronic device structure during a stage of processing following that of FIG. 5A through FIG. 5C.
Figure 6B:
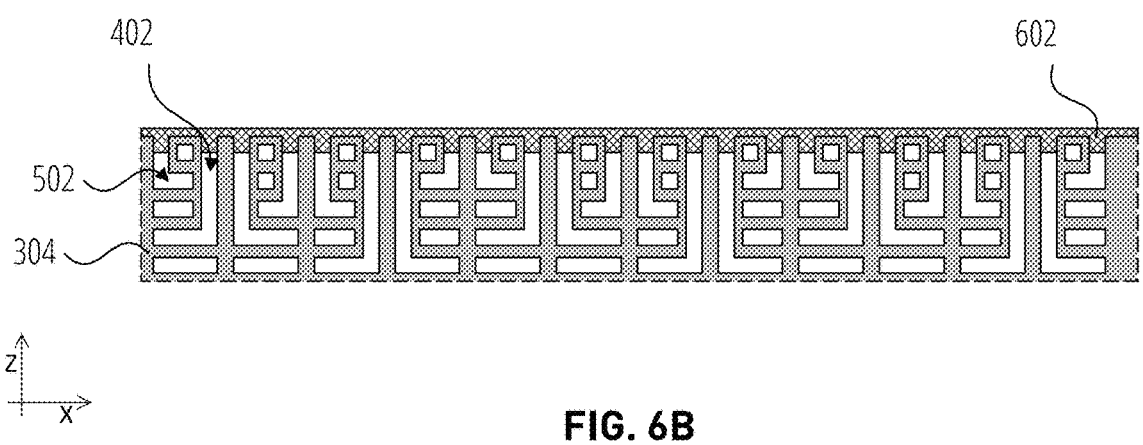
FIG. 6B is a cross-sectional, elevational, schematic illustration taken along section line B-B of FIG. 6A.
Figure 6C:
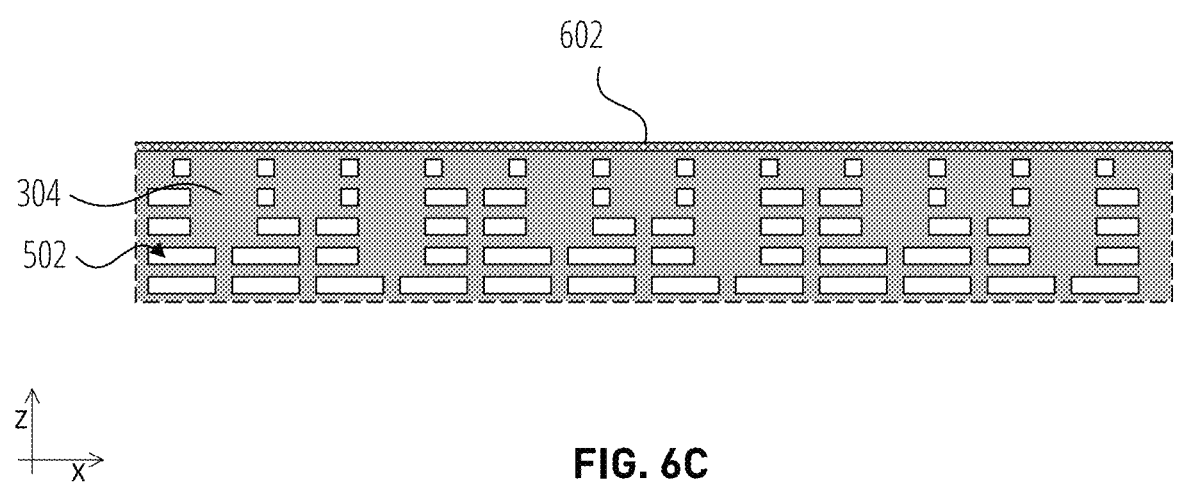
FIG. 6C is a cross-sectional, elevational, schematic illustration taken along section line C-C of FIG. 6A.

With reference to FIG. 6A, FIG. 6B, and FIG. 6C, at least one sacrificial material 602 may be non-conformally formed (e.g., non-conformally deposited, such as by spin on deposition) over an upper surface of the base structure 304, filling only an uppermost portion of the bit contact openings 402, without forming the sacrificial material 602 down into the bit line voids 502.

The sacrificial material 602 may be formed of and include one or more sacrificial materials selected or otherwise formulated to be selectively etchable relative to oxide material and nitride material of the remainder of the structure to be fabricated. For example, the sacrificial material 602 may be formed of and include a metal (e.g., tungsten, cobalt). The sacrificial material 602 may be free of (e.g., may not include) oxide material(s) and/or nitride material(s).

Figure 7A:
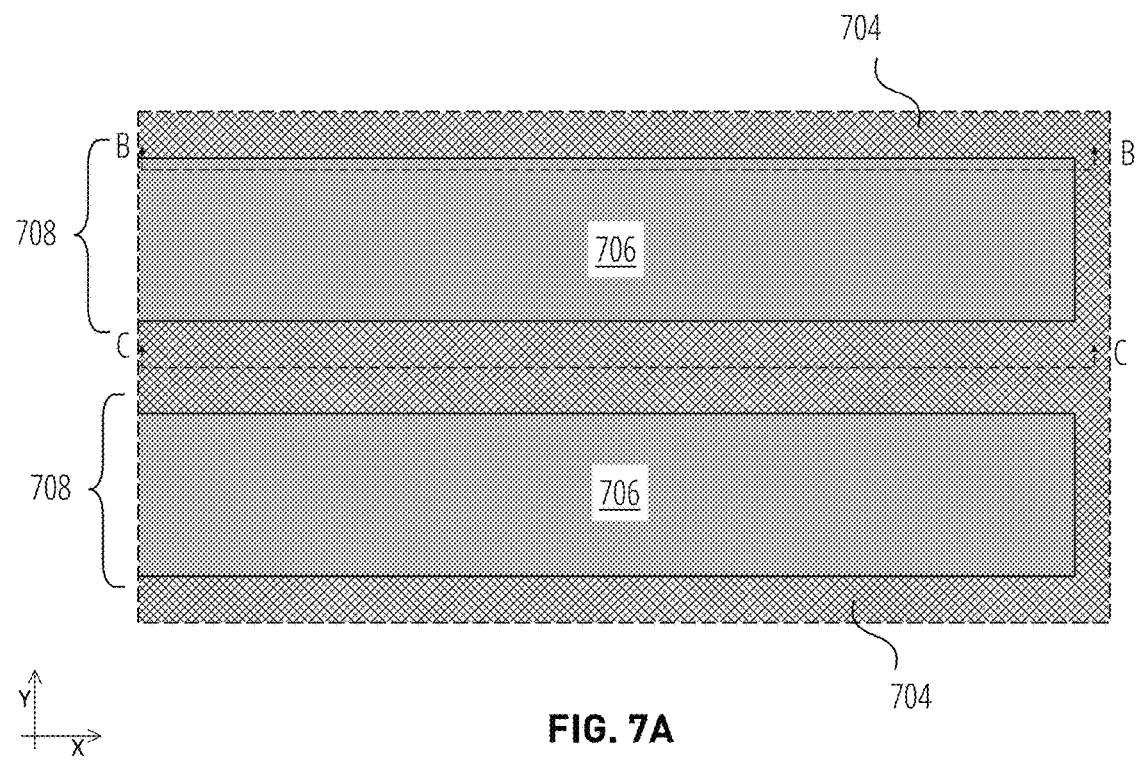
FIG. 7A is a top plan, schematic illustration of the microelectronic device structure during a stage of processing following that of FIG. 6A through FIG. 6C.
Figure 7B:
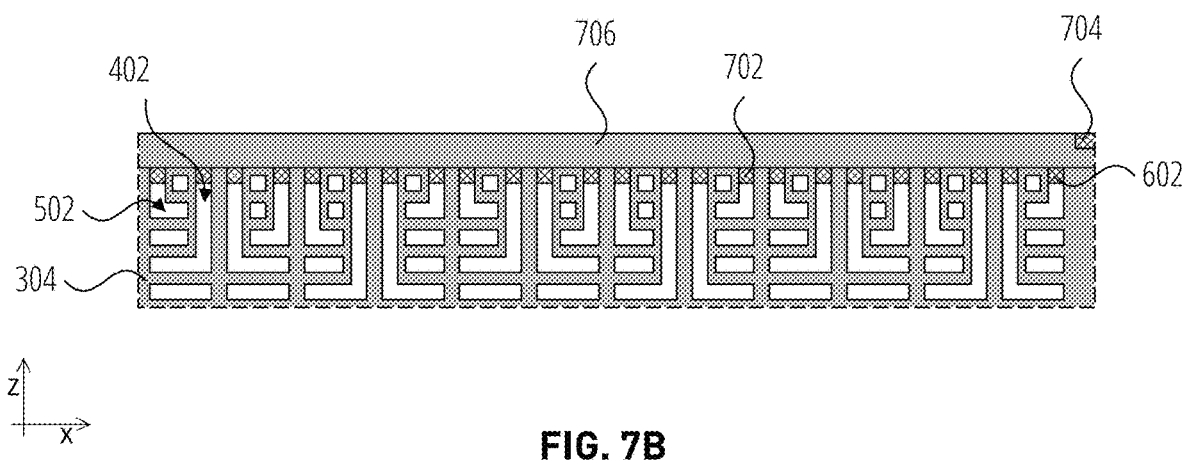
FIG. 7B is a cross-sectional, elevational, schematic illustration taken along section line B-B of FIG. 7A.
Figure 7C:
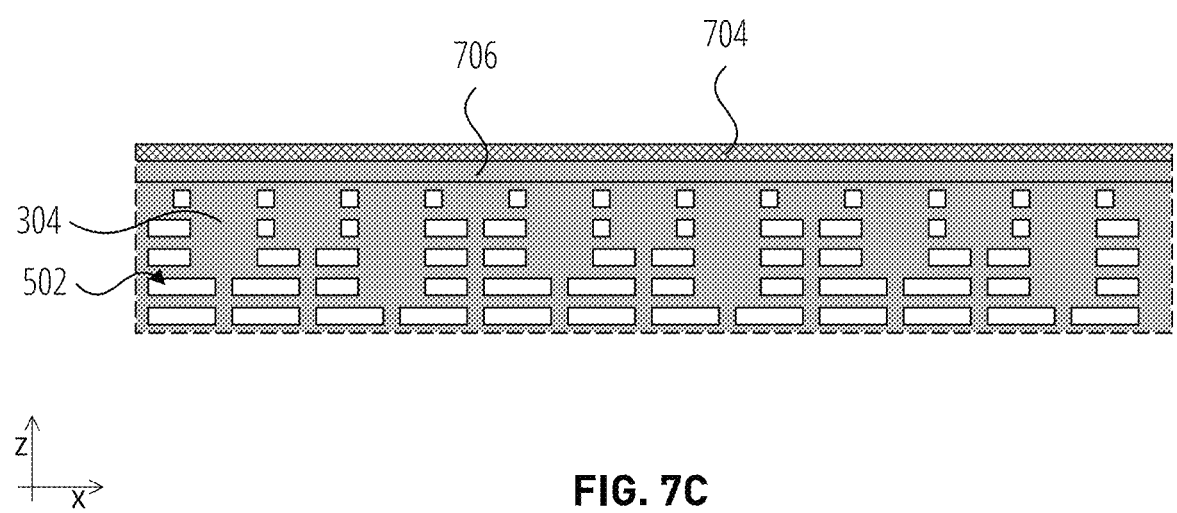
FIG. 7C is a cross-sectional, elevational, schematic illustration taken along section line C-C of FIG. 7A.

With reference to FIG. 7A, FIG. 7B, and FIG. 7C, the sacrificial material 602 may be planarized (e.g., via CMP) to form sacrificial plugs 702 closing off the bit contact openings 402. Then, one or more sacrificial etch stop materials 704 and one or more dielectric materials 706 may be formed so that the sacrificial etch stop materials 704 defines an etch stop region along lateral peripheries of block portions 708, e.g., portions of the lateral footprint that will eventually become occupied by pillar array blocks of the microelectronic device structure 100 (FIG. 1).

In some embodiments, the dielectric material 706 and the sacrificial etch stop material 704 are formed by first forming (e.g., depositing) one or more dielectric materials 706 (e.g., formed of and including any one or more of the insulative materials described above) along the upper surface of the base structure 304, covering the sacrificial plugs 702, as most clearly illustrated in FIG. 7B. Then, the dielectric material 706 may then be patterned (e.g., etched) to form openings or trenches in the dielectric material 706 into which a sacrificial etch stop material 704 may be formed (e.g., deposited)—and, in some embodiments, planarized—to form the etch stop structure along the lateral periphery of the block portions 708.

In other embodiments, the dielectric material 706 and the sacrificial etch stop material 704 are formed by forming a first portion of the dielectric material 706 across a surface of the base structure 304 and the sacrificial plugs 702, forming the sacrificial etch stop material 704 across the surface of the first portion of the dielectric material 706, patterning (e.g., etching) the sacrificial etch stop material 704 to form the etch stop structure illustrated in FIG. 7A, and then forming additional amounts of the dielectric material 706—and, in some embodiments, planarizing the materials—to form the dielectric material 706 and sacrificial etch stop material 704 illustrated in FIG. 7A, FIG. 7B, and FIG. 7C.

The sacrificial etch stop material 704 may be formed of and include any one or more of the sacrificial materials described above formulated to be selectively etchable relative to oxide materials and nitride materials. For example, in some embodiments, the sacrificial etch stop material 704 is formed of and includes one or more metals (e.g., tungsten, cobalt), which may or may not have substantially the same composition as the sacrificial material 602 of the sacrificial plugs 702 in the bit contact openings 402.

The dielectric material 706 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 706 may be formed of and include an oxide material (e.g., silicon dioxide). The dielectric material 706 may be formed of and include the same or a different composition than the base structure 304.

Figure 8A:
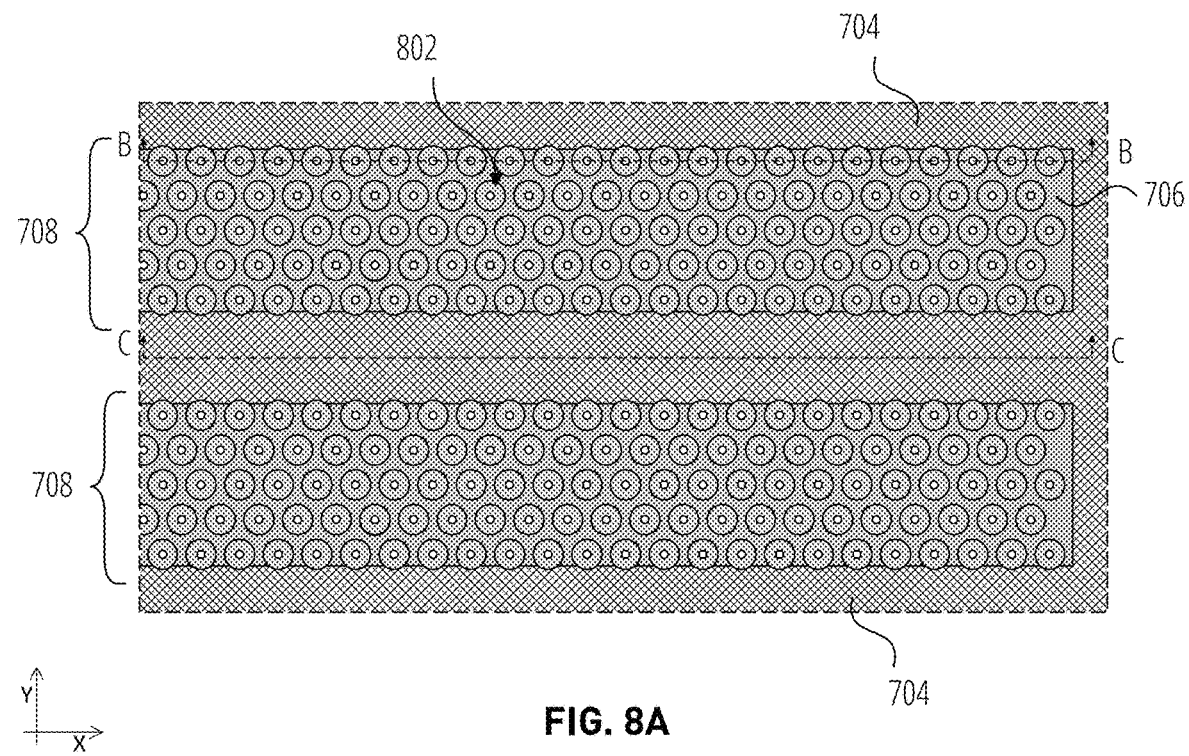
FIG. 8A is a top plan, schematic illustration of the microelectronic device structure during a stage of processing following that of FIG. 7A through FIG. 7C.
Figure 8B:
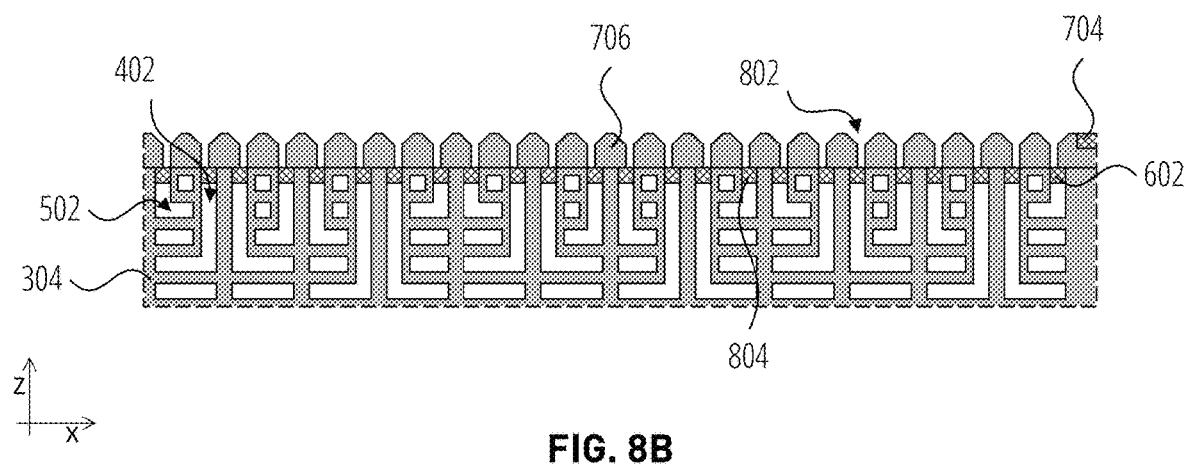
FIG. 8B is a cross-sectional, elevational, schematic illustration taken along section line B-B of FIG. 8A.
Figure 8C:
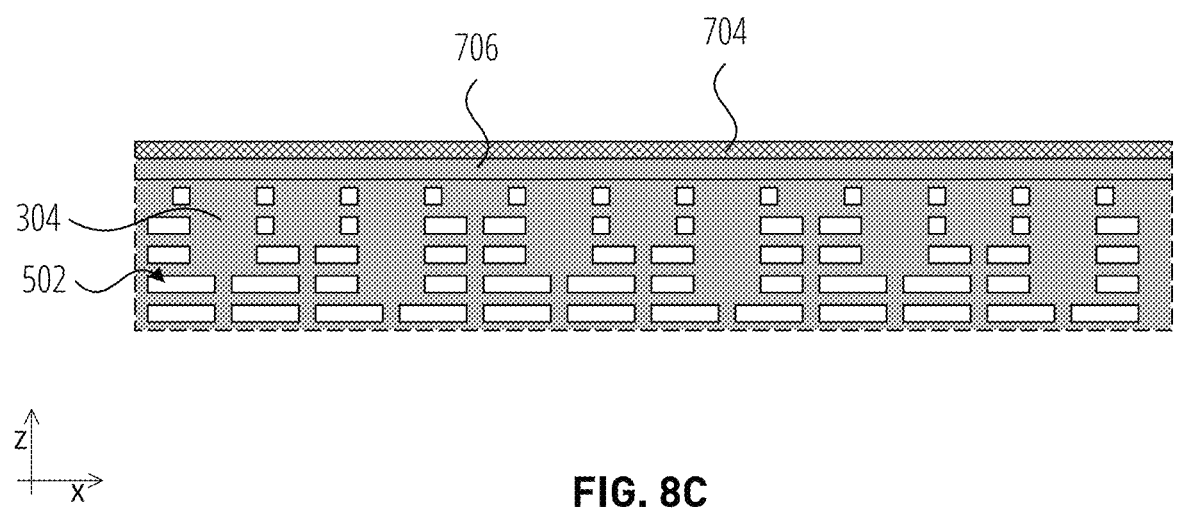
FIG. 8C is a cross-sectional, elevational, schematic illustration taken along section line C-C of FIG. 8A.

With reference to FIG. 8A, FIG. 8B, and FIG. 8C, Y-shaped openings 802 may be formed (e.g., etched) into the dielectric material 706 in the block portions 708 in an arrangement corresponding to the arrangement of the bit contact openings 402. Accordingly, at a base of the Y-shaped openings 802, at least a portion of the sacrificial materials 602 may be exposed. That is, at least some (e.g., each) of the Y-shaped openings 802 may expose at least a portion of a respective one of the sacrificial plugs 804.

Though, as discussed above, the top plan illustrations of this disclosure generally illustrate only those elements that appear in the single plane illustrated, in FIG. 8A and other top plan illustrations that include Y-shaped openings or portions thereof (e.g., FIG. 13A, FIG. 24A, FIG. 25A, FIG. 26A, FIG. 27, and FIG. 28A) the upper tapering portions of the "Y" shape is illustrated (e.g., shaded) and the transition between the upper tapering portions and the stem portions of the "Y" shape are illustrated (e.g., circled) in the top plan views.

The "Y" shape may be effectuated by a multistep etching process. During a first etching process, of the multistep etching process, a prograde profile etching act is performed during which a polymer builds up on etched surfaces at a sufficiently fast rate that it causes the sloped profile of the upper, tapered portion of the "Y" shape. Once the upper, tapered portion of the "Y" shape is formed, the multistep etching process is transitioned to an anisotropic etching act that forms the stem portion of the "Y" shape with substantially vertical sidewall(s).

In some embodiments, the stem portion of the Y-shaped openings 802 may be formed to a width (e.g., diameter) of about twice the thickness of the cell materials 128 (FIG. 1). Accordingly, as discussed further below, the cell materials 128 (FIG. 1) may subsequently be formed in the Y-shaped openings 802 in a manner that "pinches off" the cell materials 128 (e.g., pinches off the channel material 208) in the stem portion of the "Y" shape.

Figure 9A:
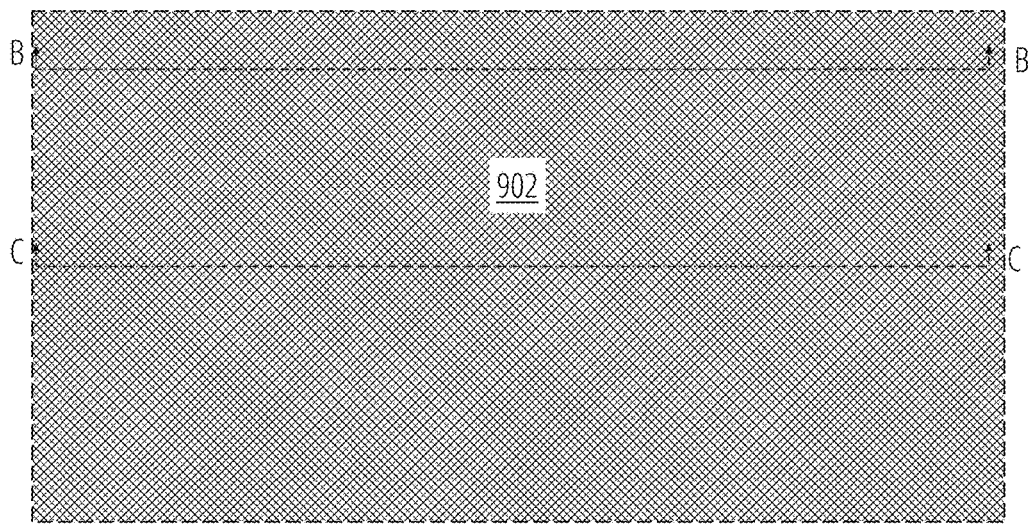
FIG. 9A is a top plan, schematic illustration of the microelectronic device structure during a stage of processing following that of FIG. 8A through FIG. 8C.
Figure 9B:
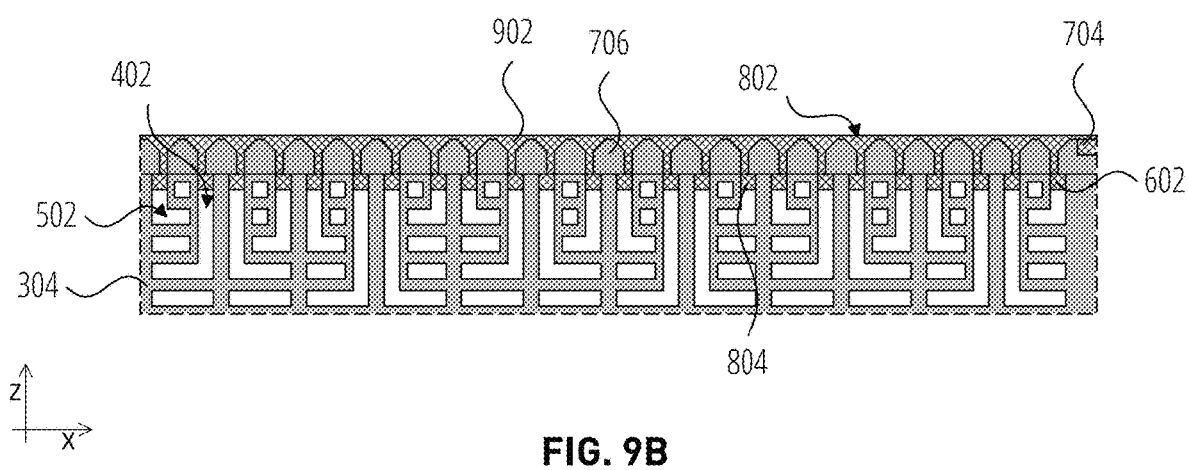
FIG. 9B is a cross-sectional, elevational, schematic illustration taken along section line B-B of FIG. 9A.
Figure 9C:
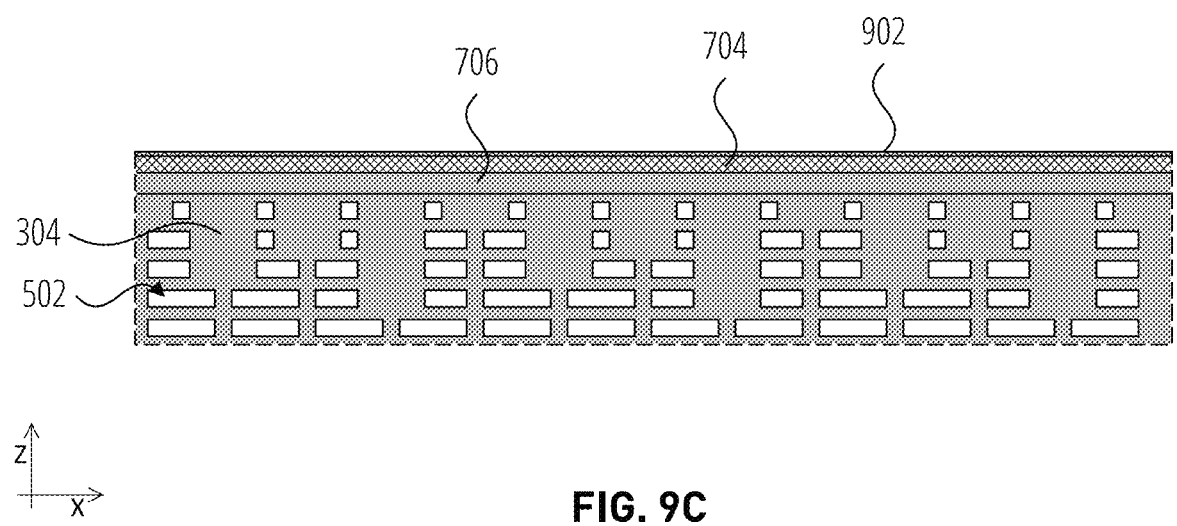
FIG. 9C is a cross-sectional, elevational, schematic illustration taken along section line C-C of FIG. 9A.

With reference to FIG. 9A, FIG. 9B, and FIG. 9C, one or more sacrificial materials 902 may be formed to substantially fill the Y-shaped openings 802 and, in some embodiments, cover the sacrificial etch stop material 704. The sacrificial material 902 may be formed of and include any of the aforementioned sacrificial materials formulated to be selectively etchable relative to oxide materials and nitride materials. The sacrificial material 902 may have substantially the same composition as, or a different composition than, the sacrificial etch stop material 704. In some embodiments, the sacrificial material 902 is formed of and includes one or more metals (e.g., tungsten).

The structure may be planarized so that the sacrificial material 902 filling each Y-shaped opening 802 is isolated from neighboring filled Y-shaped openings 802. Planarizing may also expose an upper surface of the sacrificial etch stop material 704, which may be spaced from neighboring filled Y-shaped openings 802 by portions of the dielectric material 706.

Figure 10A:
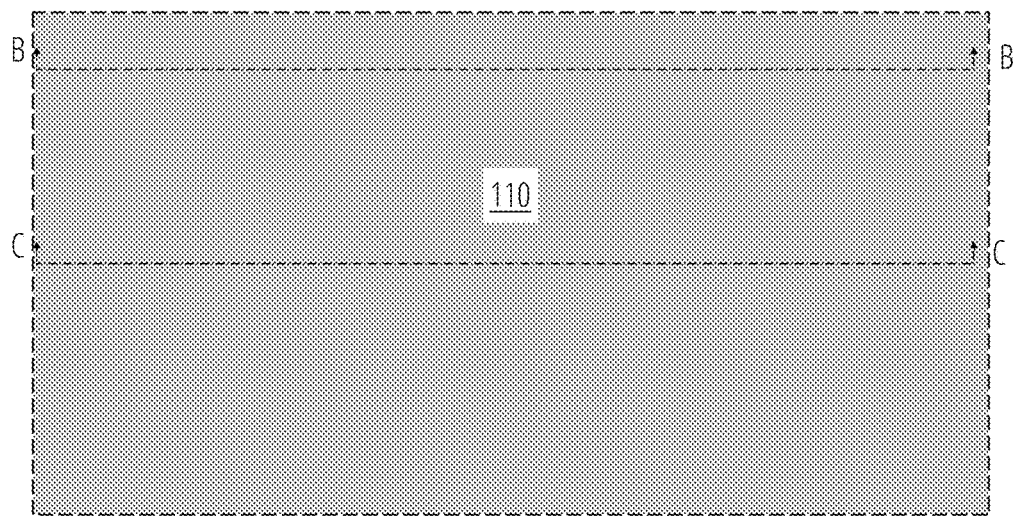
FIG. 10A is a top plan, schematic illustration of the microelectronic device structure during a stage of processing following that of FIG. 9A through FIG. 9C.
Figure 10B:
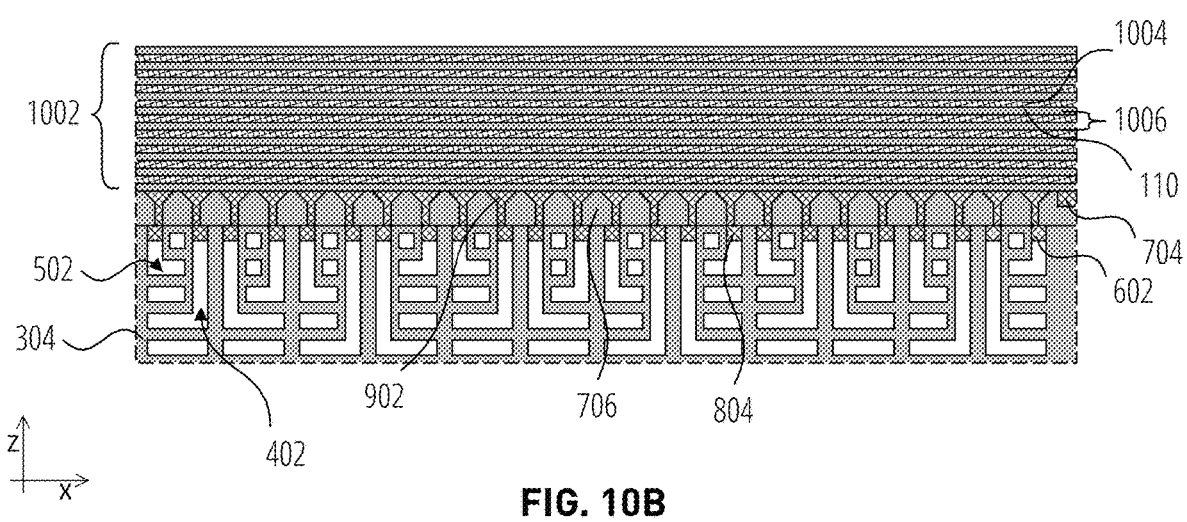
FIG. 10B is a cross-sectional, elevational, schematic illustration taken along section line B-B of FIG. 10A.
Figure 10C:
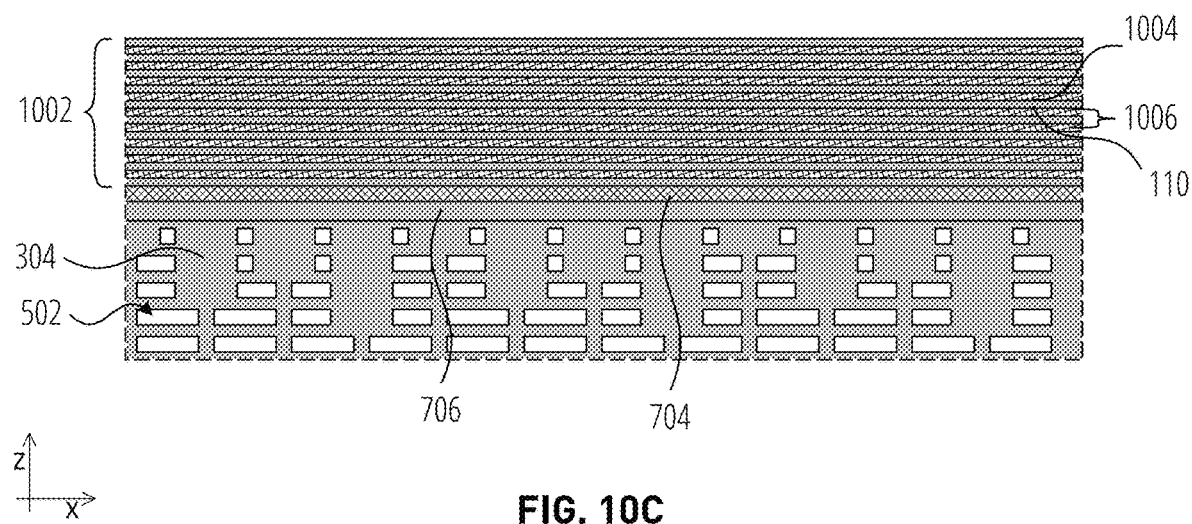
FIG. 10C is a cross-sectional, elevational, schematic illustration taken along section line C-C of FIG. 10A.

With reference to FIG. 10A, FIG. 10B, and FIG. 10C, a stack structure 1002—comprising vertically alternating insulative structures 110 and sacrificial structures 1004 arranged in tiers 1006—is formed over the dielectric material 706, the Y-shaped structures formed from the sacrificial material 902, and the sacrificial etch stop material 704, as most clearly illustrated in FIG. 10B. The stack structure 1002 may be formed by sequentially forming (e.g., depositing) material(s) of the insulative structures 110 and sacrificial material(s) of sacrificial structures 1004 that will eventually be replaced by the conductive structures 112 (FIG. 1) of the lower deck 106 (FIG. 1). Each of the tiers 1006 may individually include a level of one of the insulative structures 110 directly vertically adjacent at least one level (e.g., one level, two levels) of the sacrificial structures 1004.

The sacrificial structures 1004 of the stack structure 1002 may be formed of and include, as one or more sacrificial material(s), insulative material(s) different than, and exhibiting etch selectivity with respect to, the insulative material(s) of the insulative structure 110. The sacrificial structures 1004 may be selectively etchable relative to the insulative structures 110 during common (e.g., collective, mutual) exposure to a first etchant; and the insulative structures 110 and/or other features formed of insulative material (e.g., oxide material) may be selectively etchable relative to the sacrificial structures 1004 during common exposure to a second, different etchant. As used herein, a first material is "selectively etchable," relative to a second material, if the first material exhibits an etch rate that is at least about five times (5×) greater than the etch rate of the second material, such as about ten times (10×) greater, about twenty times (20×) greater, or about forty times (40×) greater. In some embodiments, the sacrificial structures 1004 are formed of and include one or more of a dielectric nitride material (e.g., silicon nitride ($Si_3N_4$)) and/or a dielectric oxynitride material (e.g., silicon oxynitride). In some embodiments, the sacrificial structures 1004 comprise silicon nitride and the insulative structures 110 comprise silicon dioxide.

Figure 11A:
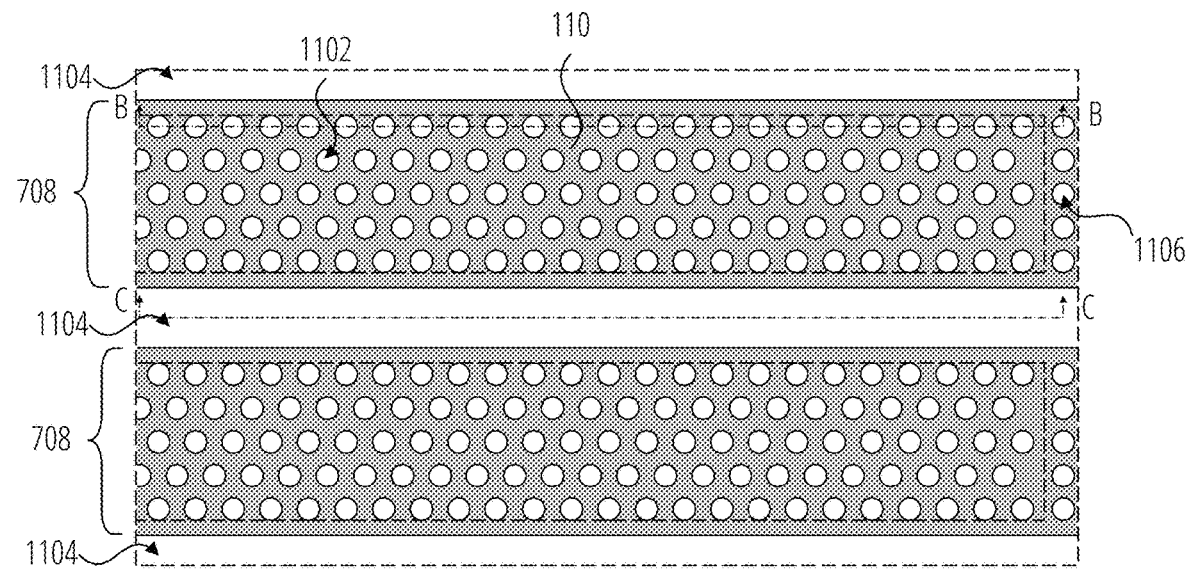
FIG. 11A is a top plan, schematic illustration of the microelectronic device structure during a stage of processing following that of FIG. 10A through FIG. 10C.
Figure 11B:
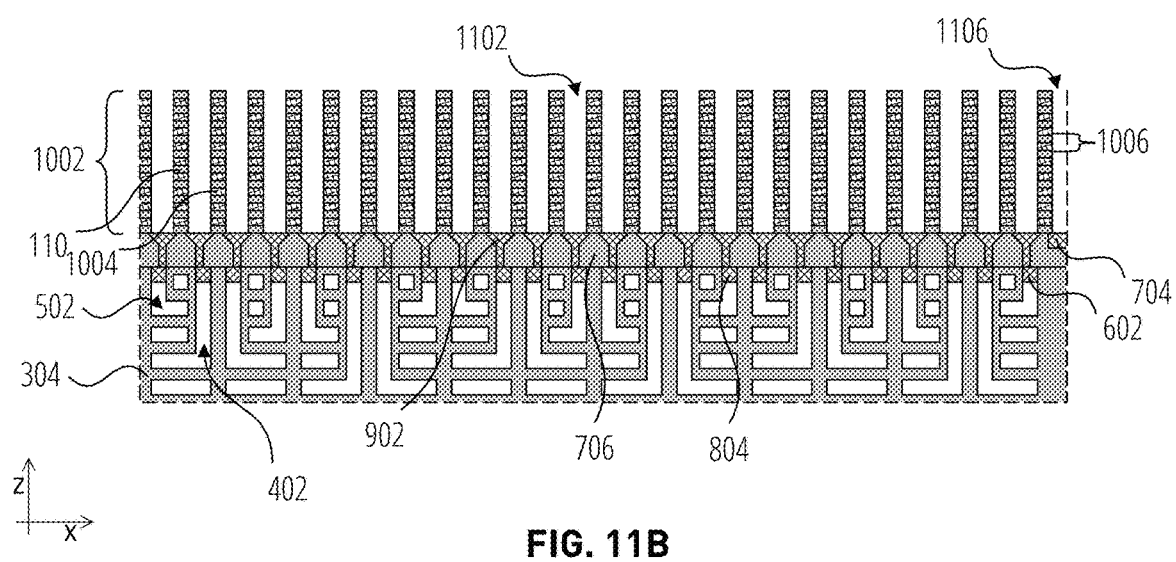
FIG. 11B is a cross-sectional, elevational, schematic illustration taken along section line B-B of FIG. 11A.
Figure 11C:
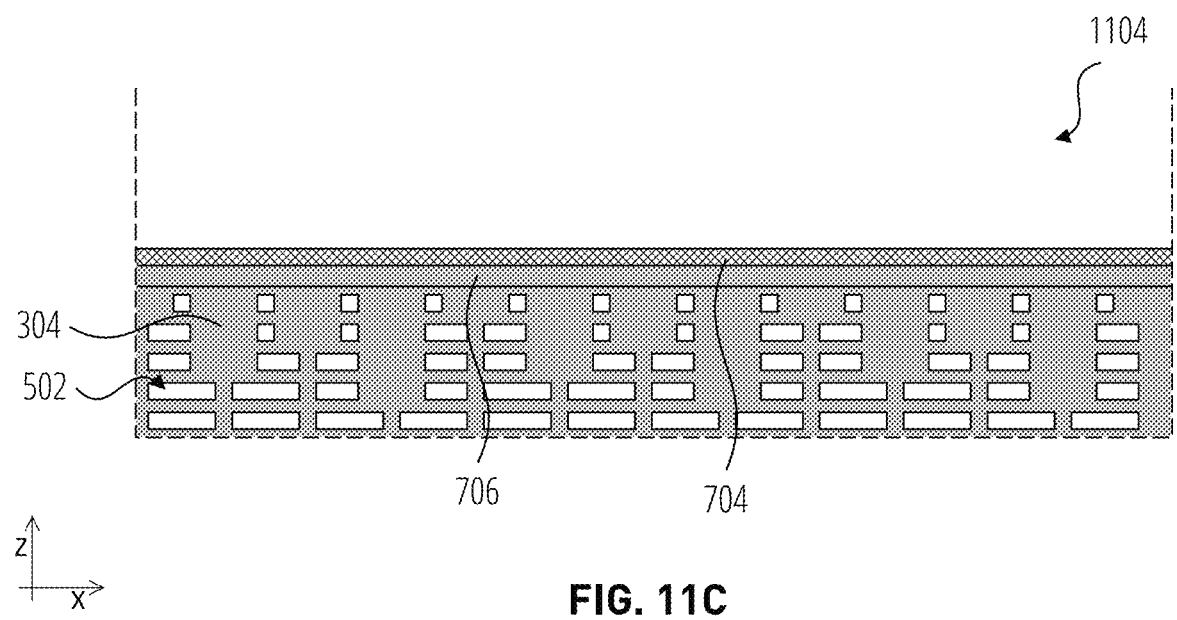
FIG. 11C is a cross-sectional, elevational, schematic illustration taken along section line C-C of FIG. 11A.

With reference to FIG. 11A, FIG. 11B, and FIG. 11C, the stack structure 1002 may then be patterned to form (e.g., etch) pillar openings 1102 in the block portions 708, to form slits 1104 between the block portions 708, and to form contact openings 1106 at a lateral end of the block portions 708. As best illustrated in FIG. 11B, the pillar openings 1102 extend through the stack structure 1002 to each expose at least a portion of one of the Y-shaped structures of sacrificial material 902, and the contact openings 1106 extend through the stack structure 1002 to each expose a different portion of the sacrificial etch stop material 704. As best illustrated in FIG. 11C, the slits 1104 extend through the stack structure 1002 to the sacrificial etch stop material 704. Accordingly, the sacrificial material 902 of the Y-shaped structures and the sacrificial etch stop material 704 may function to stop etchants from removing material below the stack structure 1002.

Figure 12A:
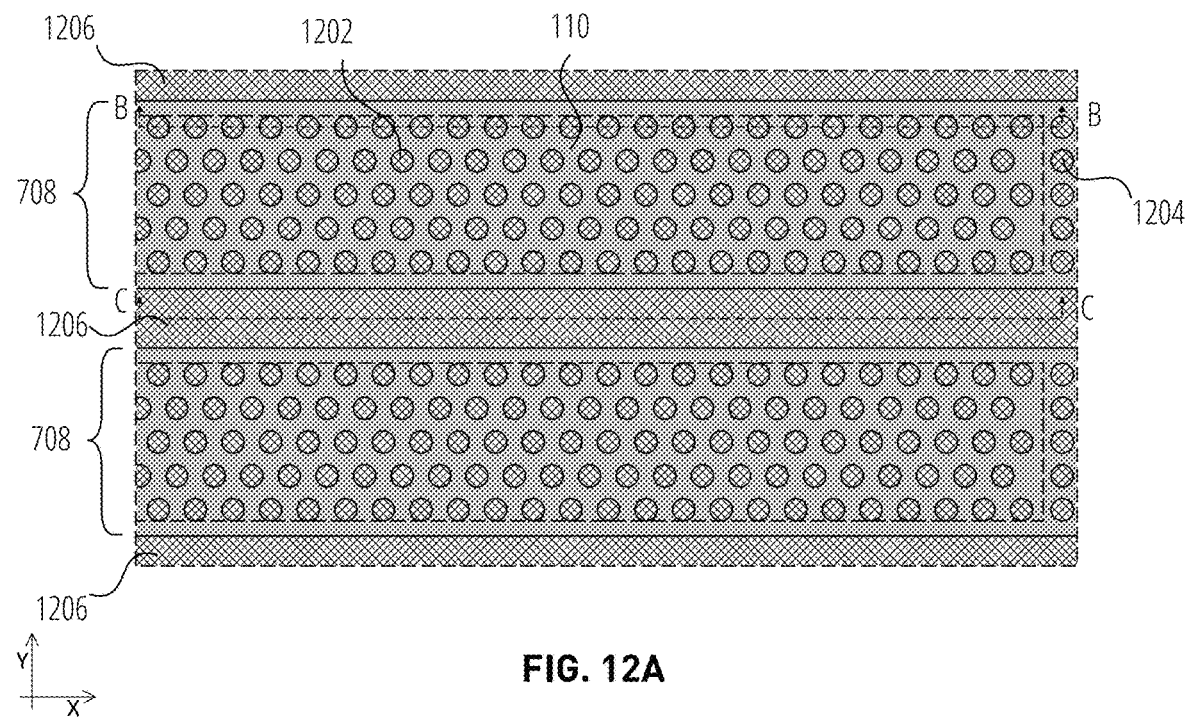
FIG. 12A is a top plan, schematic illustration of the microelectronic device structure during a stage of processing following that of FIG. 11A through FIG. 11C.
Figure 12B:
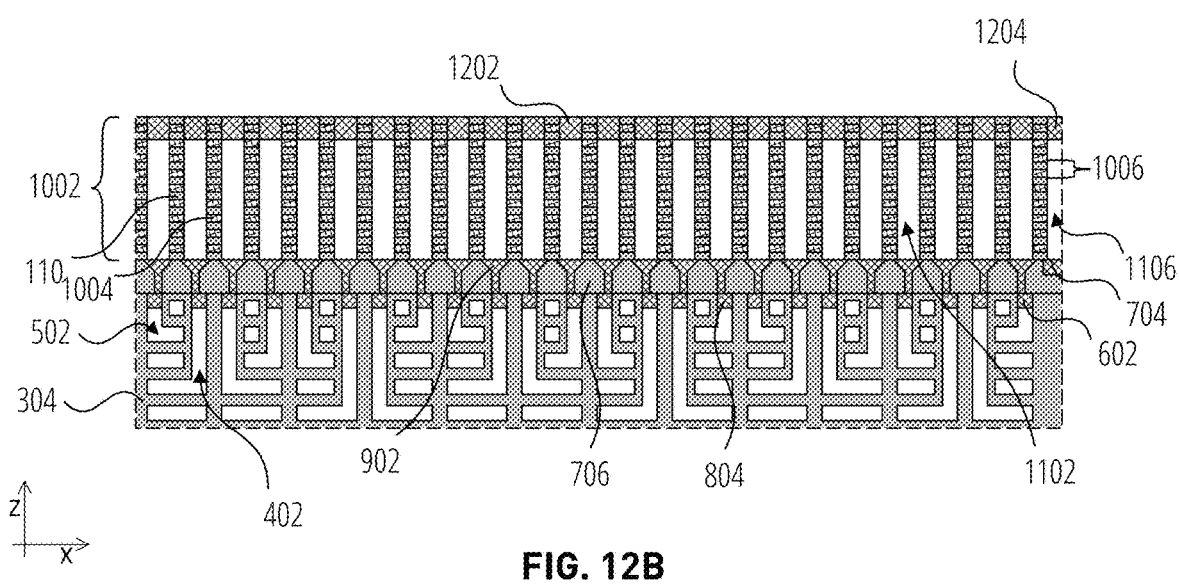
FIG. 12B is a cross-sectional, elevational, schematic illustration taken along section line B-B of FIG. 12A.
Figure 12C:
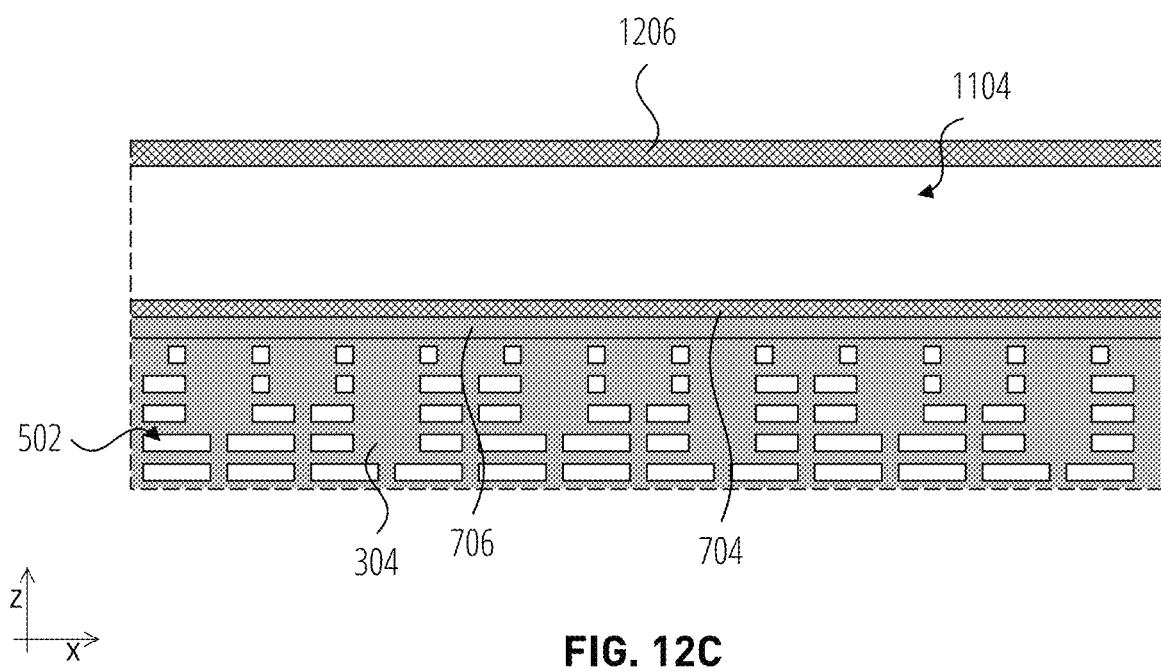
FIG. 12C is a cross-sectional, elevational, schematic illustration taken along section line C-C of FIG. 12A.

With reference to FIG. 12A, FIG. 12B, and FIG. 12C, at least one sacrificial material—formulated or otherwise selected to be selectively etchable relative to the insulative structures 110 and the sacrificial structures 1004 (e.g., relative to oxide and nitride material(s))—is formed (e.g., non-conformally deposited) over the structure so that only an upper portion of each of the pillar openings 1102 (FIG. 11A), contact openings 1106 (FIG. 11A), and slits 1104 (FIG. 11A) is filled, forming pillar plugs 1202 closing off the pillar openings 1102, contact plugs 1204 closing off the contact openings 1106, and slit plugs 1206 closing off the slits 1104.

In some embodiments, the same sacrificial material and fabrication process(es) used to form the sacrificial material 602 of the sacrificial plugs 702 in the bit contact openings 402 are used to form the sacrificial material(s) of the pillar plugs 1202, contact plugs 1204, and slit plugs 1206. For example, after forming (e.g., non-conformally depositing) the sacrificial material of the pillar plugs 1202, the contact plugs 1204, and the slit plugs 1206, the structure may be planarized so that the plugs (e.g., pillar plugs 1202, the contact plugs 1204, the slit plugs 1206) are isolated by portions of the materials of upper tiers 114 of the stack structure 1002 (e.g., by portions of the insulative structures 110 and the sacrificial structures 1004), as most clearly illustrated in FIG. 12A.

Figure 13A:
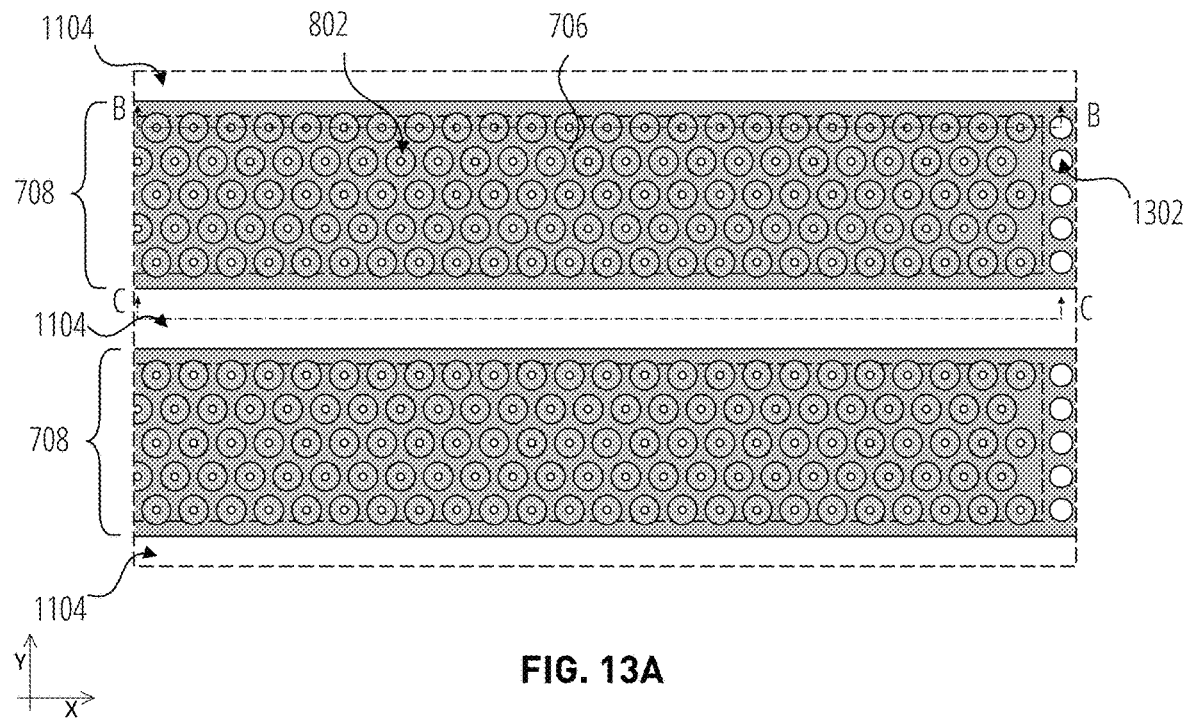
FIG. 13A is a top plan, schematic illustration of the microelectronic device structure during a stage of processing following that of FIG. 12A through FIG. 12C.
Figure 13B:
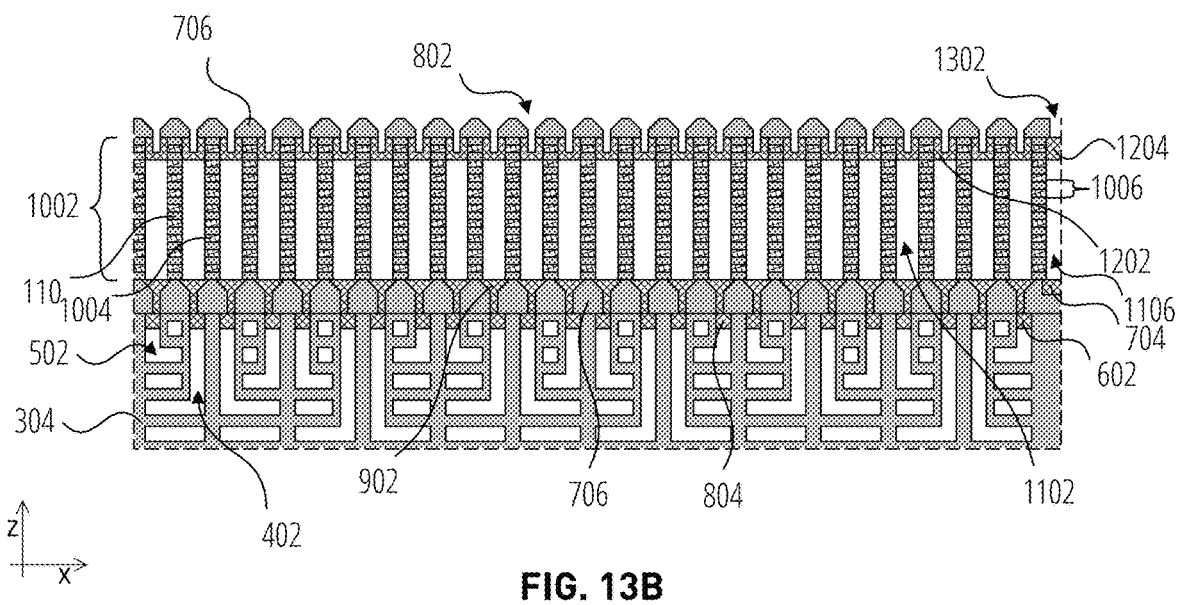
FIG. 13B is a cross-sectional, elevational, schematic illustration taken along section line B-B of FIG. 13A.
Figure 13C:
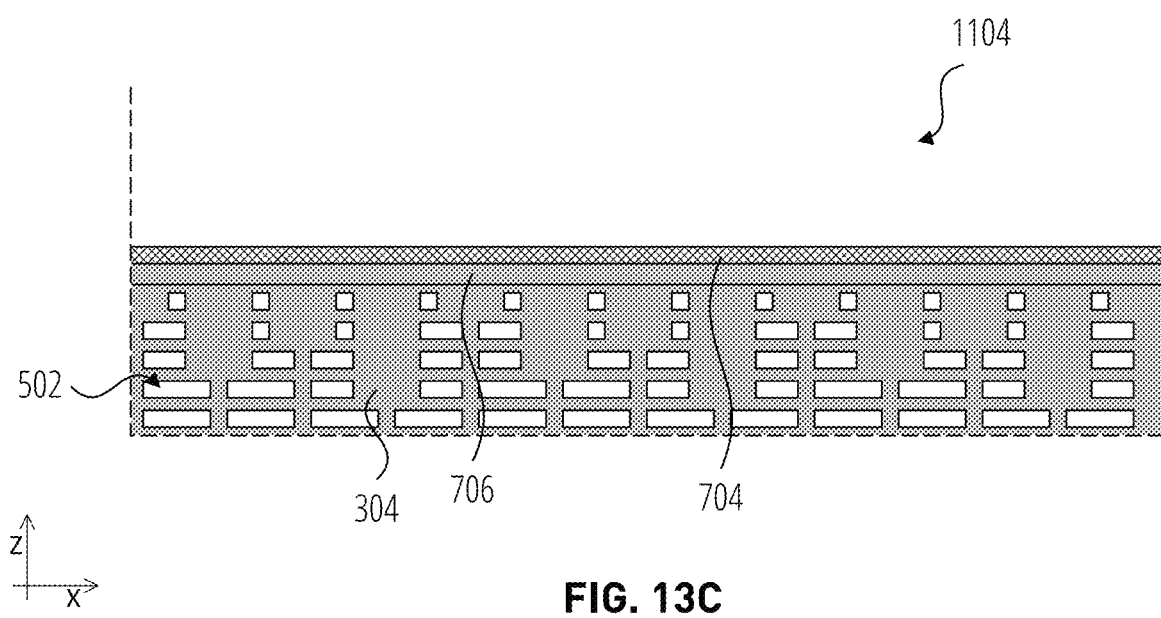
FIG. 13C is a cross-sectional, elevational, schematic illustration taken along section line C-C of FIG. 13A.

With reference to FIG. 13A, FIG. 13B, and FIG. 13C, an additional amount of the dielectric material 706 (e.g., having substantially the same composition as, or a different composition than, the dielectric material 706 under the stack structure 1002) may be formed over the stack structure 1002 and the sacrificial plugs (e.g., the pillar plugs 1202, the contact plugs 1204, the slit plugs 1206). Then, the dielectric material 706 above the stack structure 1002 may be patterned to form additional Y-shaped openings 802, such as by the same multistep etching process described above with regard to the Y-shaped openings 802 (FIG. 8A and FIG. 8B) in the dielectric material 706 below the stack structure 1002. However, the Y-shaped openings 802 formed above the stack structure 1002 may extend partially, but not fully, through the pillar plugs 1202. Accordingly, the pillar openings 1102 remain closed off by the pillar plugs 1202.

Before, after, or while forming the Y-shaped openings 802, the dielectric material 706 may also be patterned (e.g., etched) to form openings (e.g., middle contact openings 1302) over the contact openings 1106, exposing at least a portion of one of the contact plugs 1204. Accordingly, the contact openings 1106 remain closed by the contact plug 1204, but the middle contact openings 1302 may be formed to axially align with the contact openings 1106.

Before, after, or while forming the Y-shaped openings 802 and/or the Y-shaped openings 802, the slit plugs 1206 may also be removed (e.g., etched) to one again open the slits 1104 between the block portions 708. Therefore, the sacrificial etch stop material 704 on which the stack structure 1002 was formed may be exposed in the slits 1104, as most clearly illustrated in FIG. 13C.

Figure 14A:
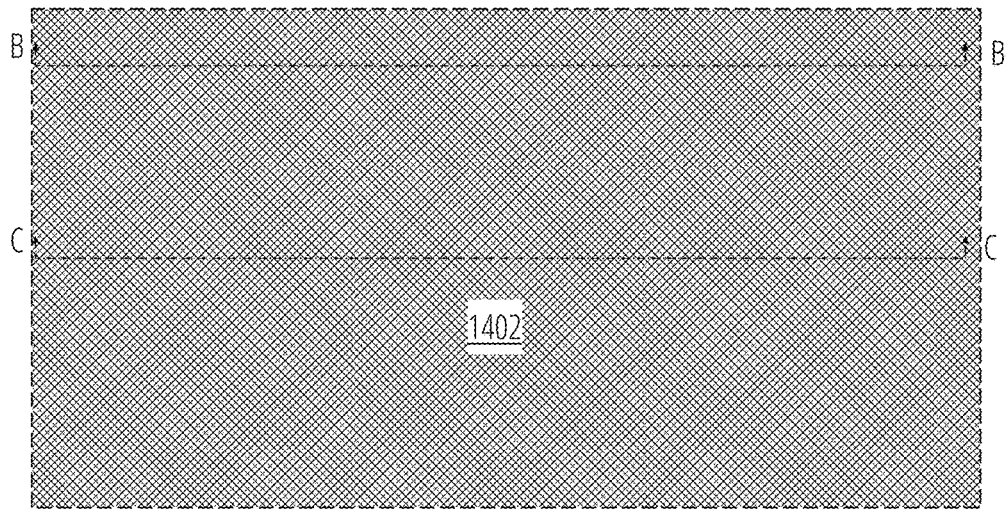
FIG. 14A is a top plan, schematic illustration of the microelectronic device structure during a stage of processing following that of FIG. 13A through FIG. 13C.
Figure 14B:
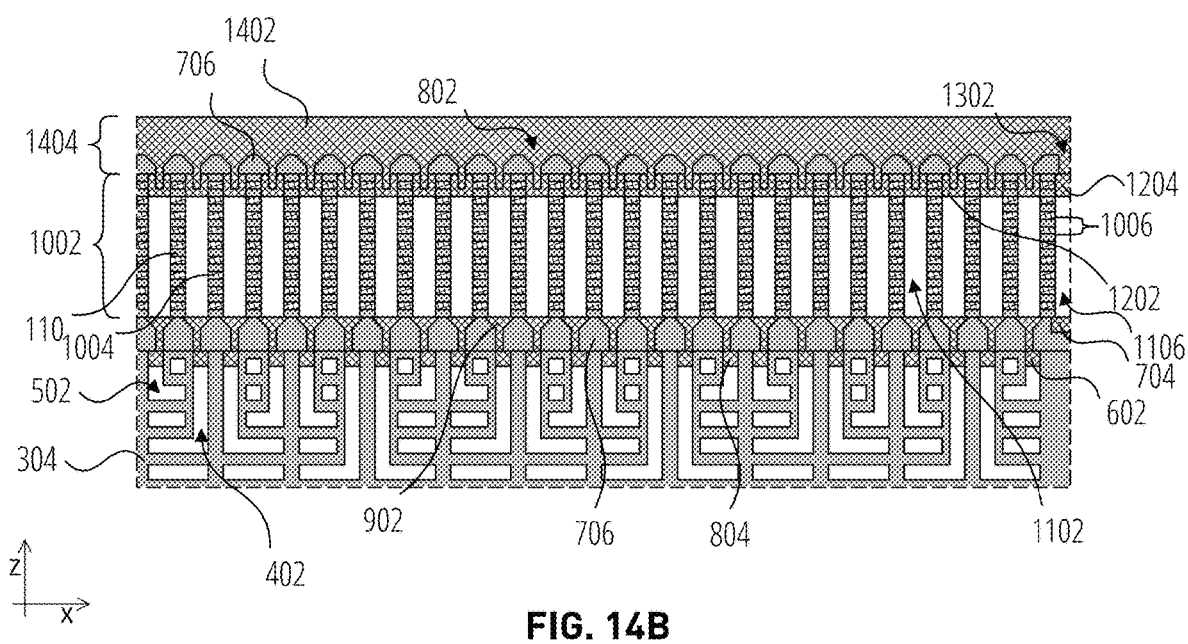
FIG. 14B is a cross-sectional, elevational, schematic illustration taken along section line B-B of FIG. 14A.
Figure 14C:
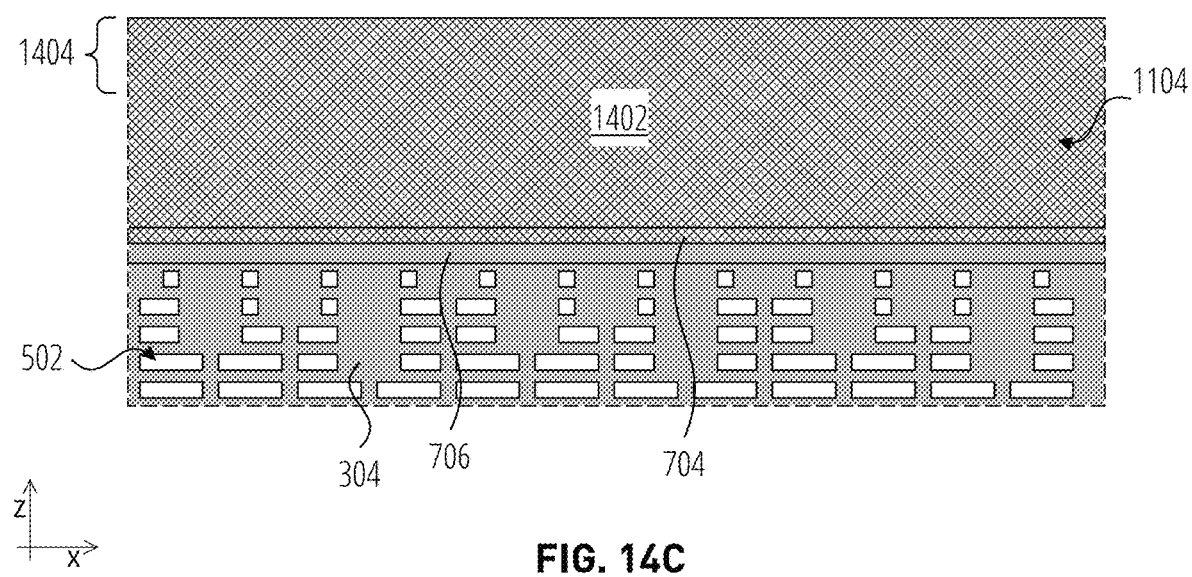
FIG. 14C is a cross-sectional, elevational, schematic illustration taken along section line C-C of FIG. 14A.

With reference to FIG. 14A, FIG. 14B, and FIG. 14C, one or more additional sacrificial materials (e.g., source region sacrificial material 1402) may be formed (e.g., deposited) to fill the Y-shaped openings 802 and the middle contact openings 1302, as illustrated in FIG. 14B, and to fill the slits 1104, as illustrated in FIG. 14C. The source region sacrificial material 1402 may be formulated or otherwise selected to be selectively etchable relative to oxide materials and nitride materials of the structure. Therefore, the source region sacrificial material 1402 may have a composition substantially the same as, or different than, that of the pillar plugs 1202, the contact plugs 1204, the sacrificial material 902 in the Y-shaped structures below the stack structure 1002, the sacrificial etch stop material 704, and/or the sacrificial plugs 804 in the bit contact openings 402.

The source region sacrificial material 1402 may be formed to at least a height 1404 that will define the interdeck source region 104 (FIG. 1). That is, the source region sacrificial material 1402 may be formed to overfill the Y-shaped openings 802, the middle contact openings 1302, and the slits 1104. In some embodiments, the source region sacrificial material 1402 may be planarized so that an upper surface of the source region sacrificial material 1402 defines the height 1404 (e.g., from an upper surface of the stack structure 1002).

Figure 15A:
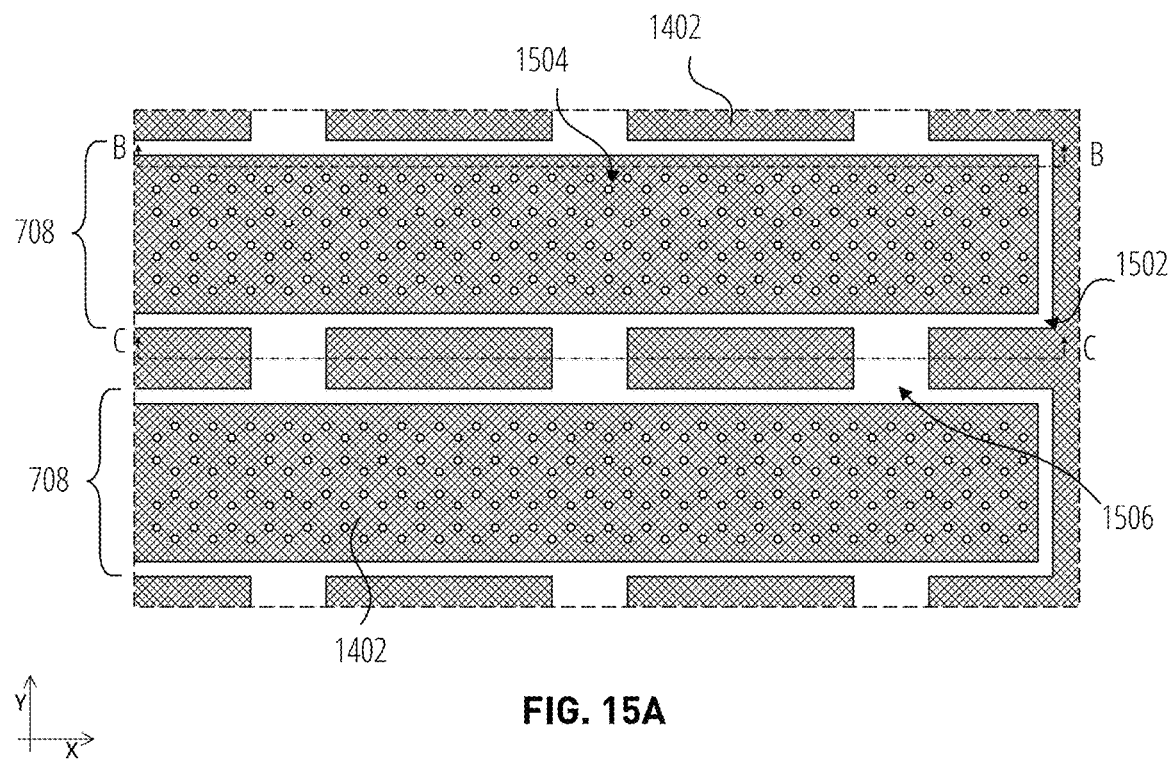
FIG. 15A is a top plan, schematic illustration of the microelectronic device structure during a stage of processing following that of FIG. 14A through FIG. 14C.
Figure 15B:
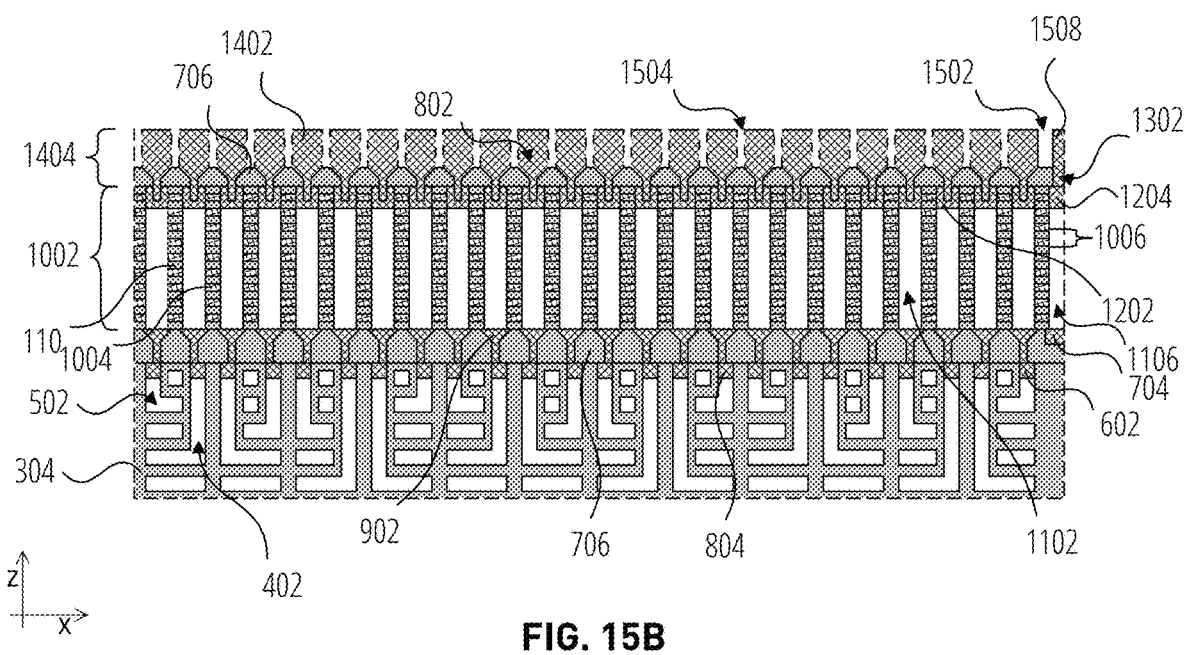
FIG. 15B is a cross-sectional, elevational, schematic illustration taken along section line B-B of FIG. 15A.
Figure 15C:
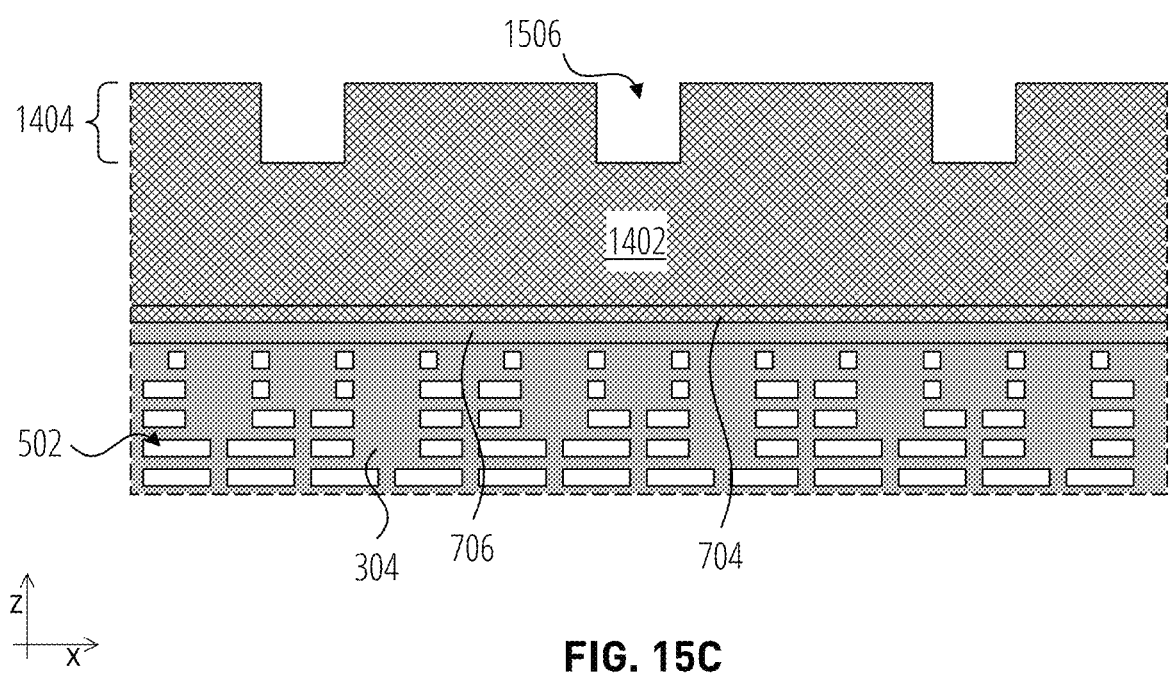
FIG. 15C is a cross-sectional, elevational, schematic illustration taken along section line C-C of FIG. 15A.

With reference to FIG. 15A, FIG. 15B, and FIG. 15C, the source region sacrificial material 1402 is then patterned (e.g., etched) to define trenches (e.g., source isolation openings 1502) along the lateral periphery of the block portions 708, as most clearly illustrated in FIG. 15A. The patterning may use an etchant selective to the source region sacrificial material 1402 so that the dielectric material 706 functions as an etch stop to the patterning process.

The source isolation openings 1502 may be formed so that the source isolation openings 1502 extend through the source region sacrificial material 1402 down to the dielectric material 706 above the stack structure 1002, as illustrated in FIG. 15B.

In some embodiments, before, after, or while forming the source isolation openings 1502, support structure openings

1504 may also be formed (e.g., etched) through the source region sacrificial material 1402 to the dielectric material 706 at select locations within the block portions 708 where subsequent structural support is wanted during removal of the source region sacrificial material 1402, as discussed further below. The number and relative positioning of the support structure openings 1504 may be other than as illustrated in FIG. 15A (or as illustrated in broken line in FIG. 15B). For example, while in some embodiments, a support structure opening 1504 is formed between each adjacent Y-shaped opening 802 above the stack structure 1002, in other embodiments the support structure openings 1504 is less densely formed, such as to include one of the support structure openings 1504 for ever N number (e.g., quantity) of the Y-shaped openings 802.

Before, after, or while forming the source isolation openings 1502 and/or the support structure openings 1504, the source region sacrificial material 1402 may also be patterned (e.g., etched) to form bridge openings 1506 extending between one of the block portions 708 and its neighboring block portion 708, as most clearly illustrated in FIG. 15A. As most clearly illustrated in FIG. 15C, each of the bridge openings 1506 may extend to a depth of about the height 1404 of the interdeck source region 104 (FIG. 1) to be formed. In some embodiments, none of the bridge openings 1506 extend into elevations occupied by the stack structure 1002. The sacrificial structures 1004 of the stack structure 1002 may remain covered above by at least some portion of insulative material (e.g., either or both the insulative structure 110 of at least one tier 1006 and/or at least a portion of the dielectric material 706).

Figure 16A:
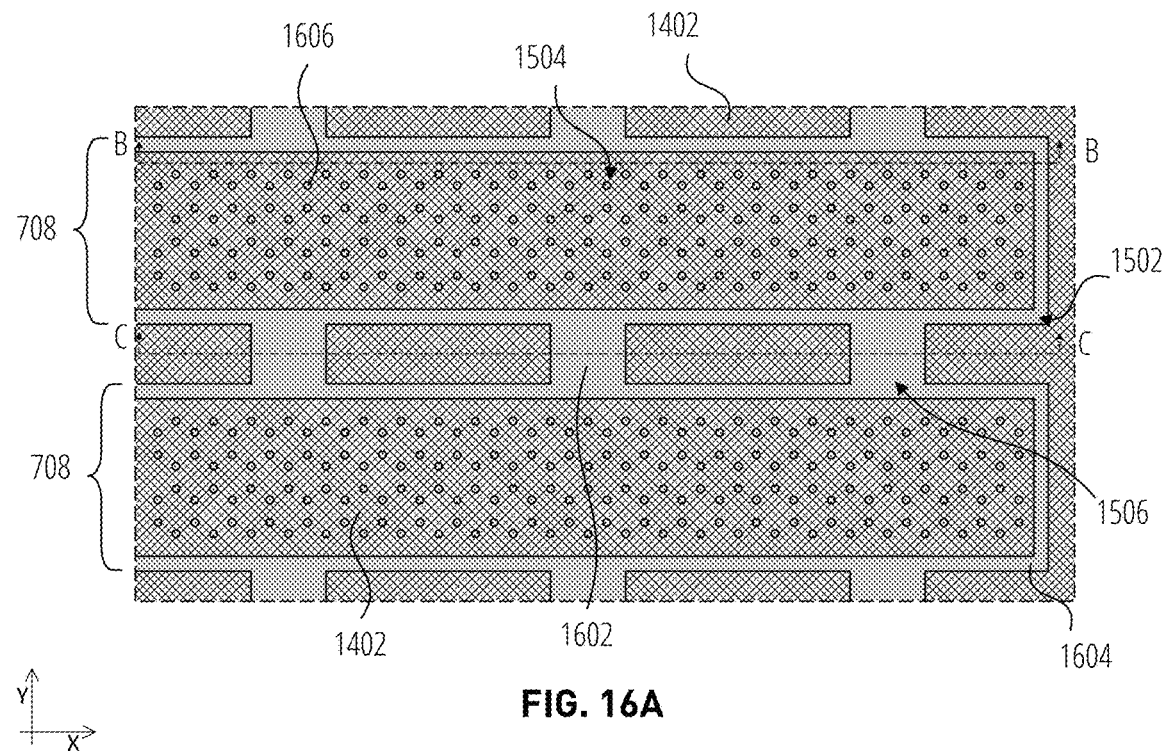
FIG. 16A is a top plan, schematic illustration of the microelectronic device structure during a stage of processing following that of FIG. 15A through FIG. 15C.
Figure 16B:
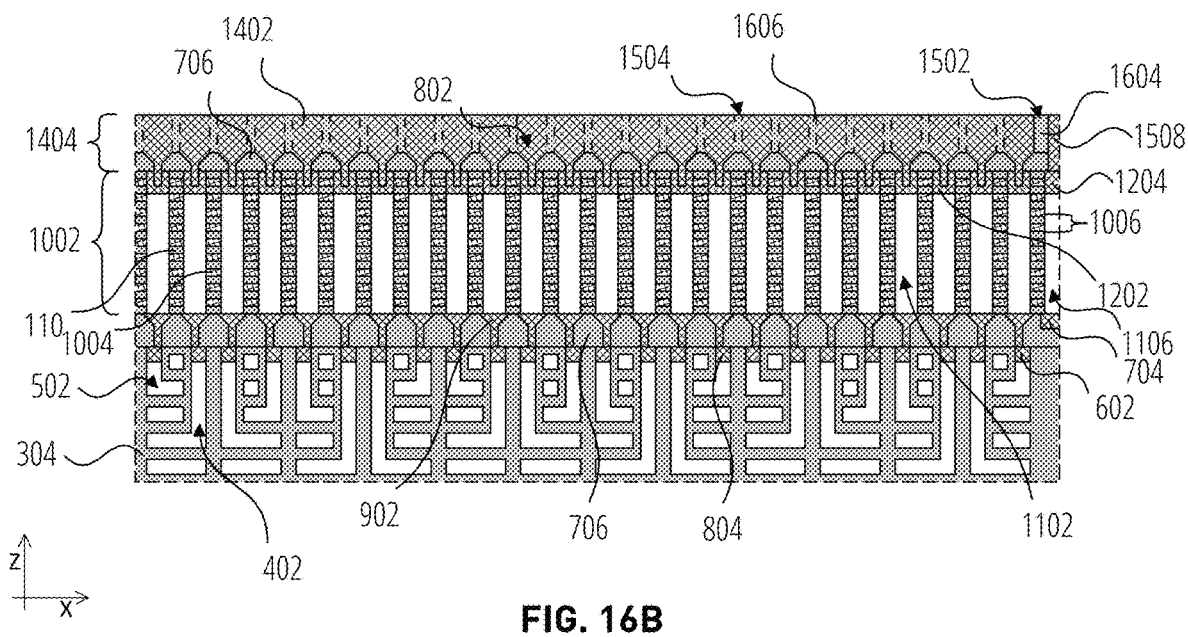
FIG. 16B is a cross-sectional, elevational, schematic illustration taken along section line B-B of FIG. 16A.
Figure 16C:
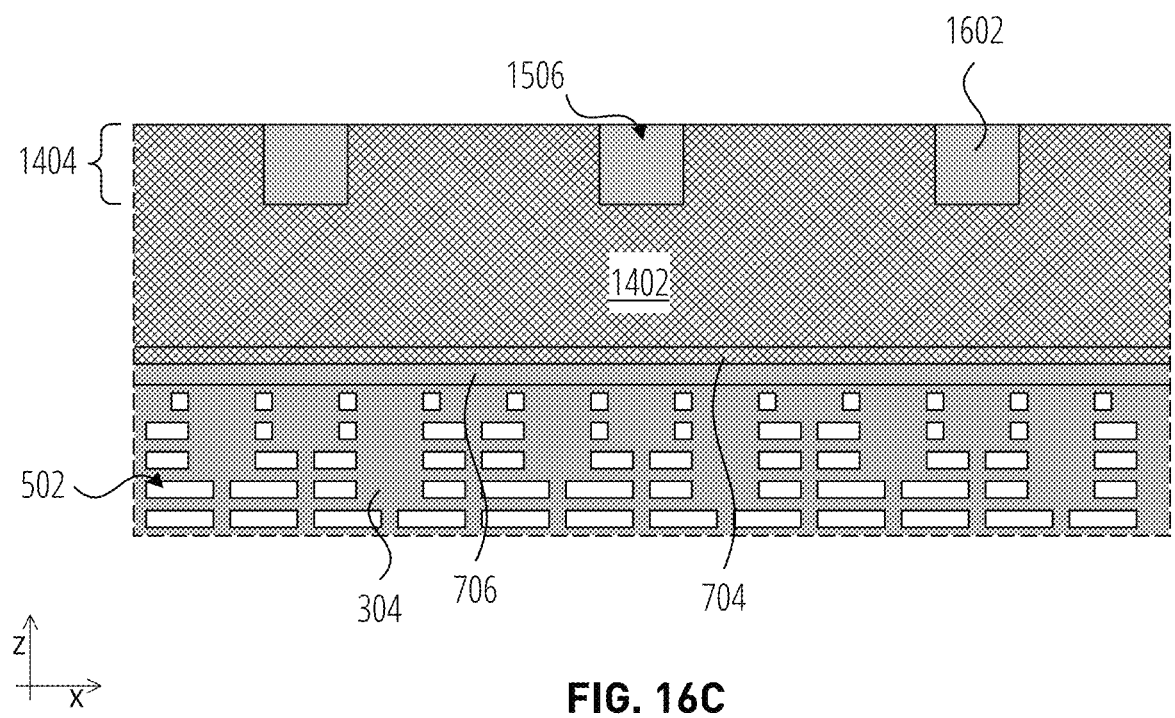
FIG. 16C is a cross-sectional, elevational, schematic illustration taken along section line C-C of FIG. 16A.

With reference to FIG. 16A, FIG. 16B, and FIG. 16C, one or more insulative materials 1602 are formed (e.g., deposited) to fill each of the bridge openings 1506, the support structure openings 1504, and the source isolation openings 1502. The insulative material 1602 may be formed of and include one or more of the insulative materials described above. In some embodiments, the insulative material 1602 may be formed of and include a dielectric oxide material (e.g., silicon dioxide).

Filling the source isolation openings 1502 with the insulative material 1602 forms source isolation regions 1604 that effectively isolate the source region sacrificial material 1402 of one of the block portions 708 from the source region sacrificial material 1402 of neighboring block portions 708. The insulative material 1602 also effectively isolates the source region sacrificial material 1402 along the area above the contact openings 1106 formed in the stack structure 1002.

Filling the support structure openings 1504 with the insulative material 1602 effectively forms support structures 1606 at select locations across the block portions 708.

Filling the bridge openings 1506 with the insulative material 1602 forms discrete insulative structures (e.g., blocks), most clearly illustrated in FIG. 16C, that extend between the source region sacrificial material 1402 of adjacent block portions 708, as most clearly illustrated in FIG. 16A.

Figure 17A:
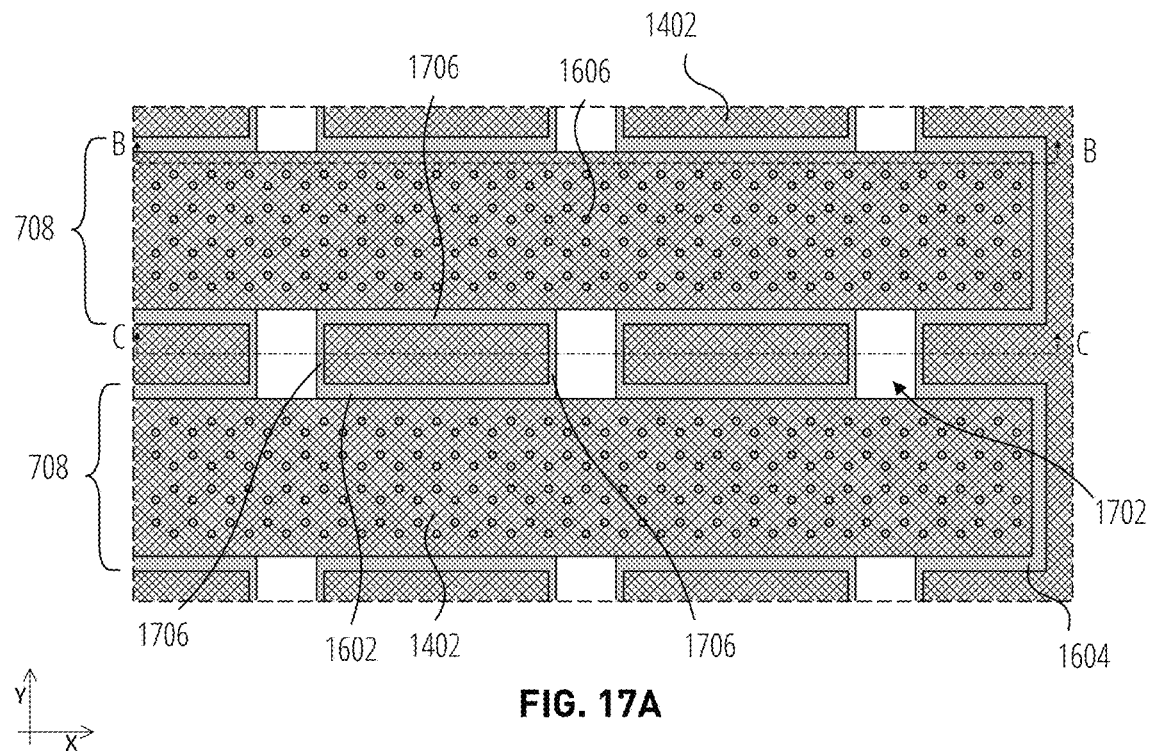
FIG. 17A is a top plan, schematic illustration of the microelectronic device structure during a stage of processing following that of FIG. 16A through FIG. 16C.
Figure 17B:
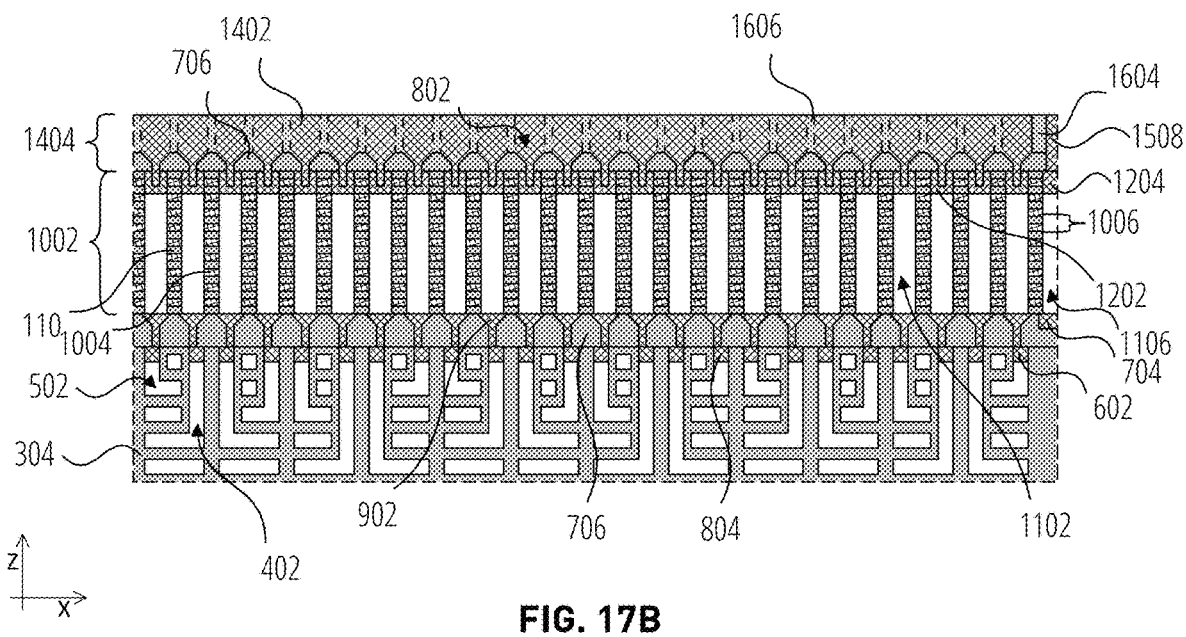
FIG. 17B is a cross-sectional, elevational, schematic illustration taken along section line B-B of FIG. 17A.
Figure 17C:
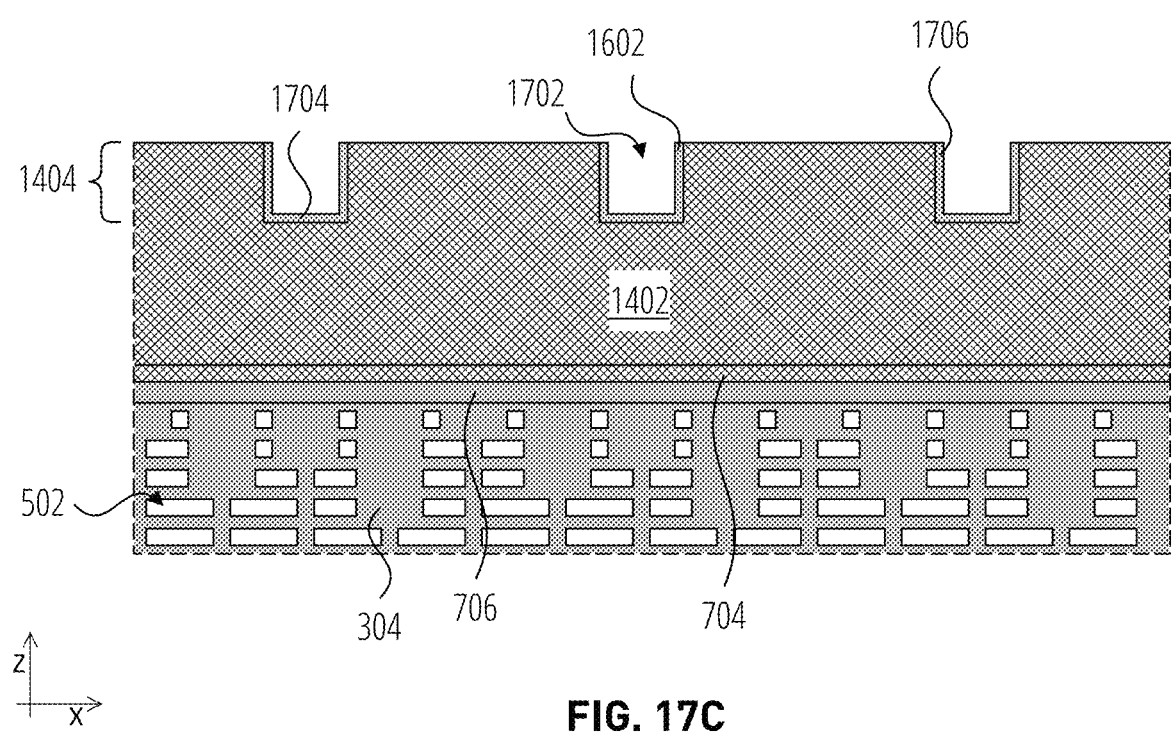
FIG. 17C is a cross-sectional, elevational, schematic illustration taken along section line C-C of FIG. 17A.

With reference to FIG. 17A, FIG. 17B, and FIG. 17C, the insulative material 1602 is patterned (e.g., etched) to define openings 1702 extending between the source region sacrificial material 1402 of one of the block portions 708 to the source region sacrificial material 1402 of a neighboring one of the block portions 708, as most clearly illustrated in FIG. 17A. The openings 1702 may be formed so as to leave portions of the insulative material 1602 to define a bridge isolation base 1704 and bridge isolation sidewalls 1706, as most clearly illustrated in FIG. 17C. Accordingly, at left and right vertical sidewalls, the openings 1702 is bordered by the bridge isolation sidewalls 1706 formed from the insulative material 1602, while at front and rear vertical sidewalls, the openings 1702 is bordered by the source region sacrificial material 1402 of adjacent block portions 708.

Figure 18A:
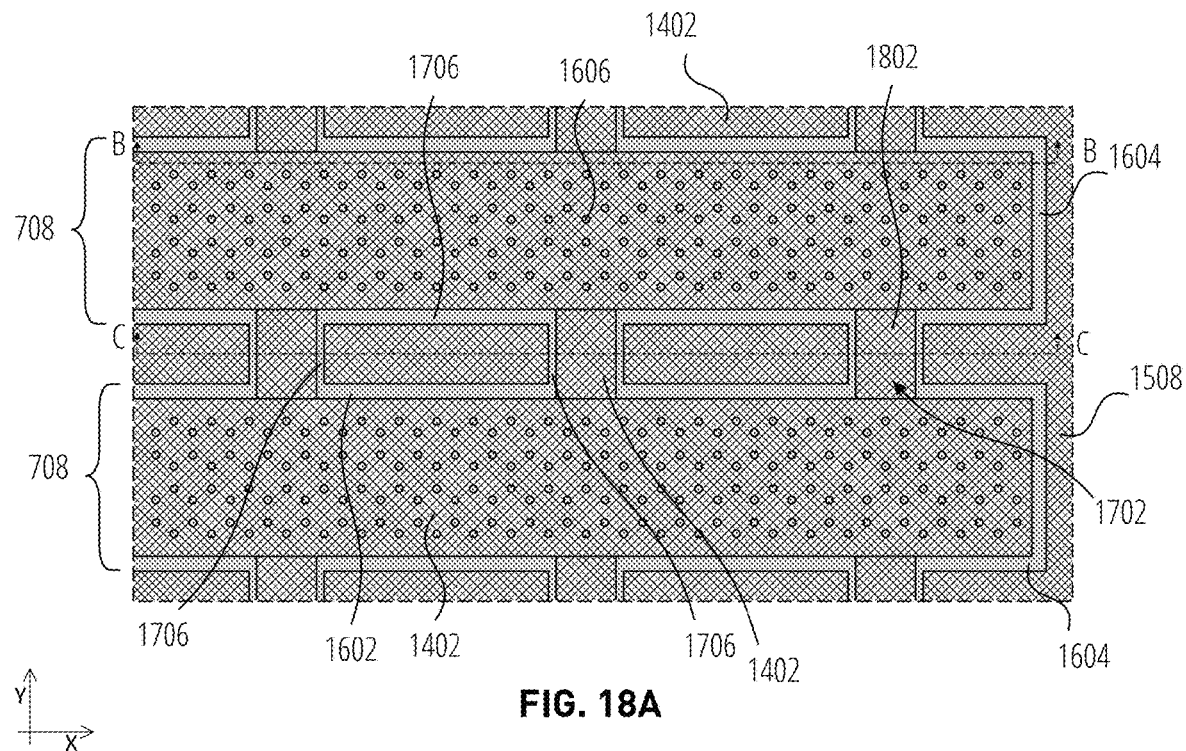
FIG. 18A is a top plan, schematic illustration of the microelectronic device structure during a stage of processing following that of FIG. 17A through FIG. 17C.
Figure 18B:
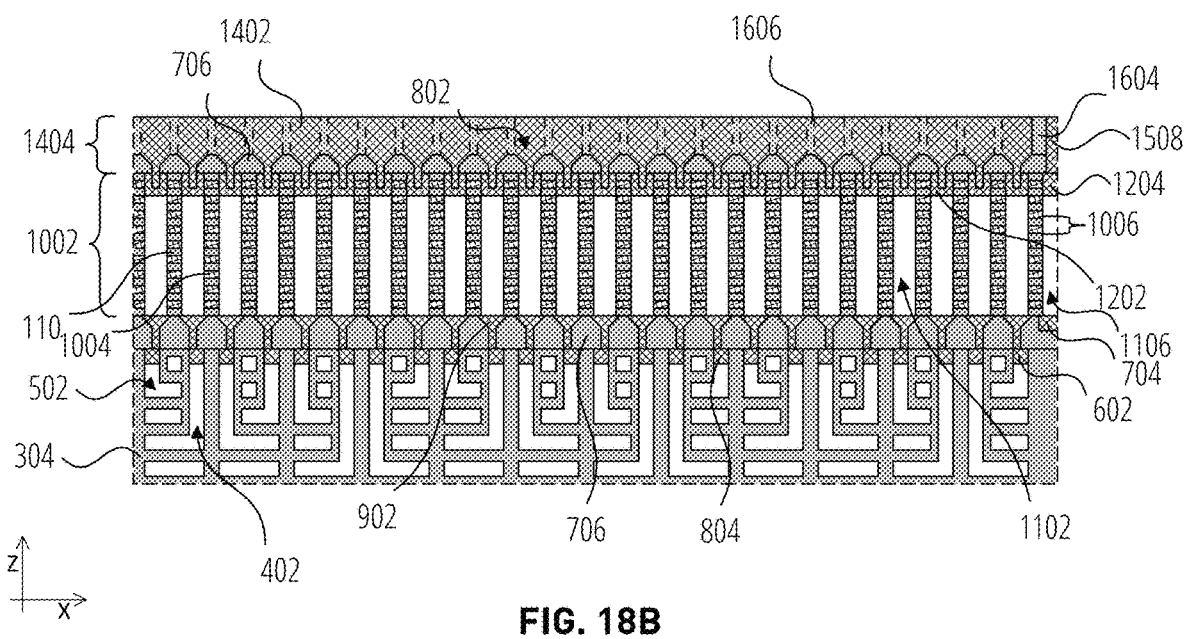
FIG. 18B is a cross-sectional, elevational, schematic illustration taken along section line B-B of FIG. 18A.
Figure 18C:
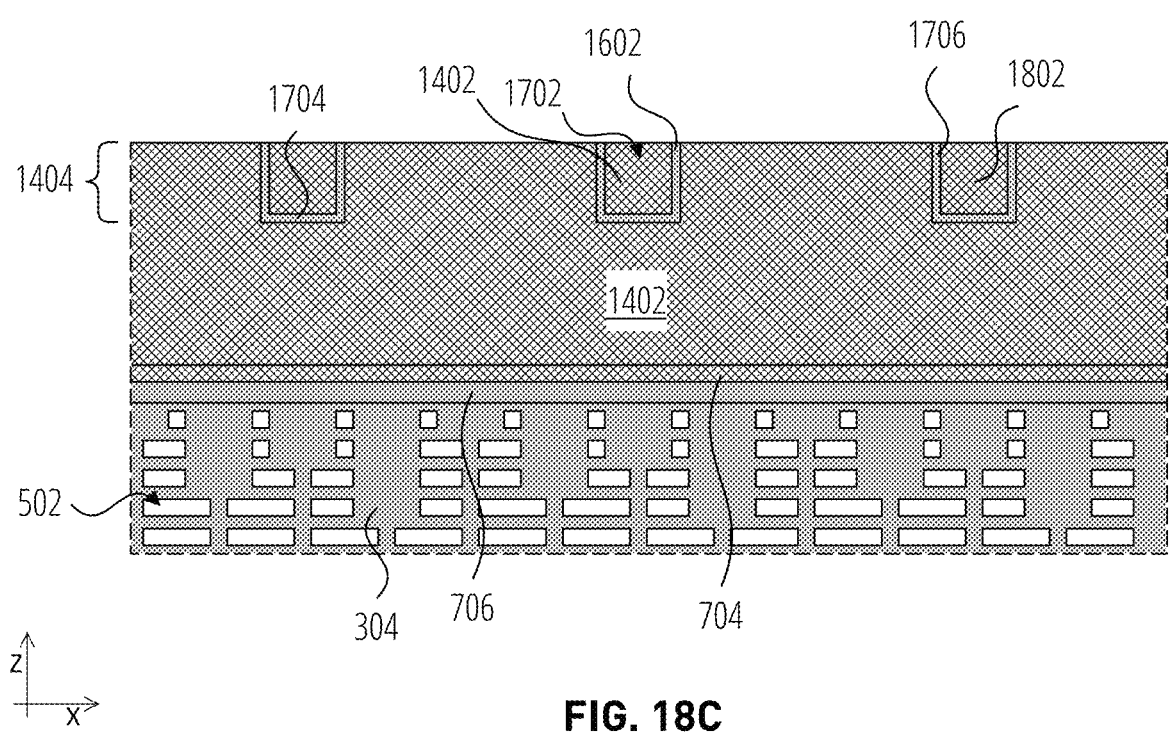
FIG. 18C is a cross-sectional, elevational, schematic illustration taken along section line C-C of FIG. 18A.

With reference to FIG. 18A, FIG. 18B, and FIG. 18C, additional amounts of the source region sacrificial material 1402 (or another sacrificial material with similar etch selectivity) are formed to fill the openings 1702, as most clearly illustrated in FIG. 18A and FIG. 18B, forming source-to-source bridges 1802 in which the source region sacrificial material 1402 of the block portions 708 continue from one of the block portions 708 to the neighboring block portions 708 via the source-to-source bridges 1802. Additional portions of the source region sacrificial material 1402, between the block portions 708, are isolated—from the source region sacrificial material 1402 of the block portions 708 and the source-to-source bridges 1802—by the bridge isolation sidewalls 1706, as most clearly illustrated in FIG. 18A, and by the bridge isolation bases 1704, as most clearly illustrated in FIG. 18C.

The structure may be planarized so that an upper surface of the source-to-source bridges 1802 is substantially coplanar with an upper surface of the 1402 in the block portions 708.

Figure 19A:
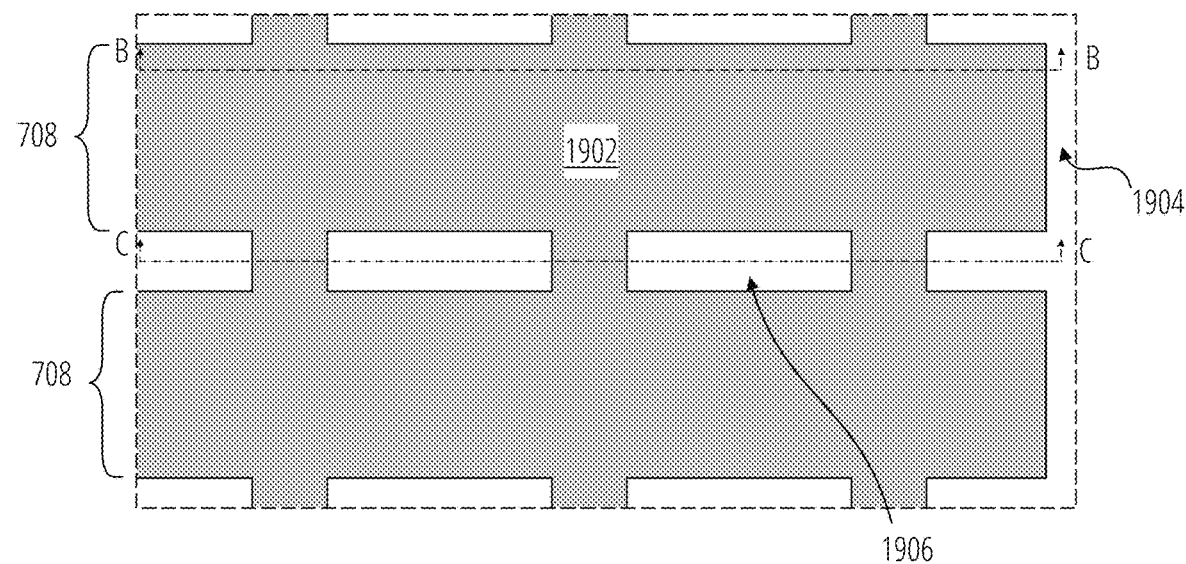
FIG. 19A is a top plan, schematic illustration of the microelectronic device structure during a stage of processing following that of FIG. 18A through FIG. 18C.
Figure 19B:
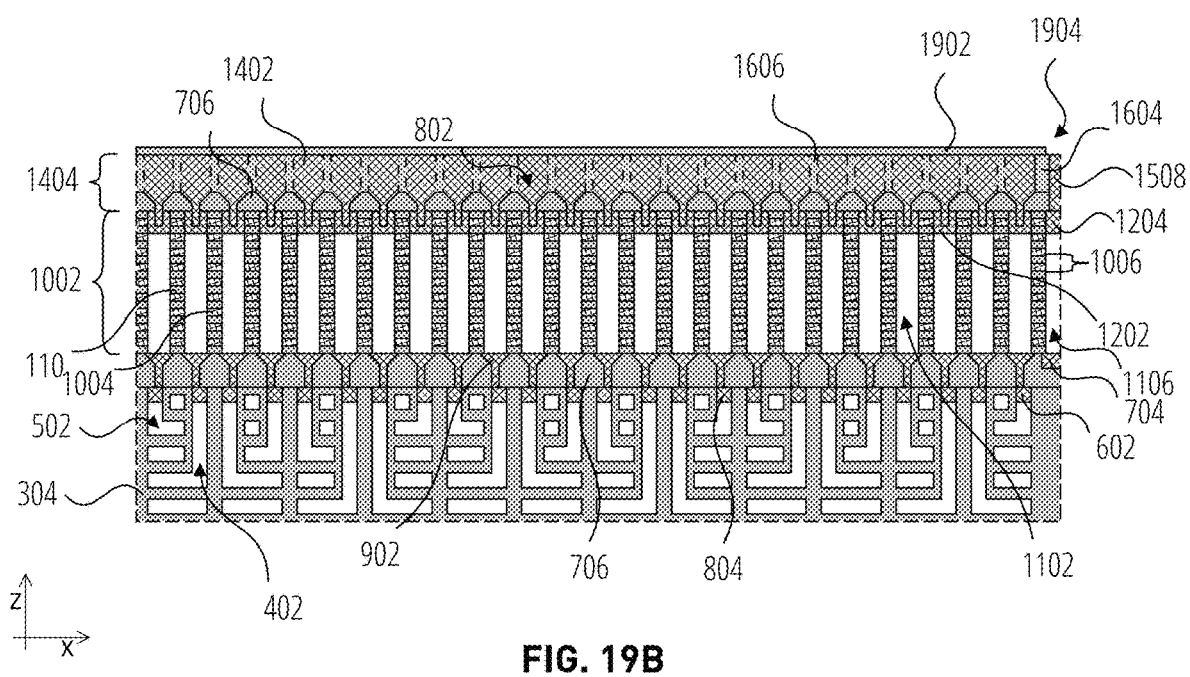
FIG. 19B is a cross-sectional, elevational, schematic illustration taken along section line B-B of FIG. 19A.
Figure 19C:
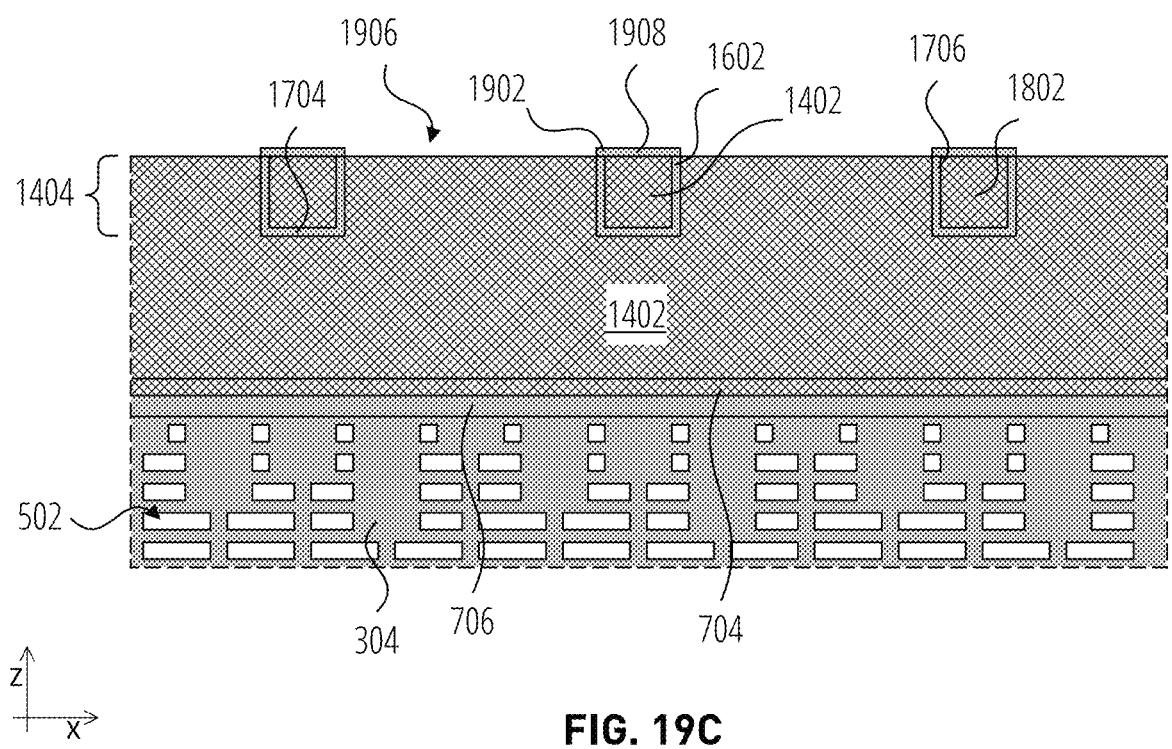
FIG. 19C is a cross-sectional, elevational, schematic illustration taken along section line C-C of FIG. 19A.

With reference to FIG. 19A, FIG. 19B, and FIG. 19C, a dielectric material 1902 (e.g., one or more of the insulative materials described above, such as substantially the same material as the insulative material 1602 of the bridge isolation sidewalls 1706 and the bridge isolation bases 1704) is formed (e.g., deposited) over the source region sacrificial material 1402 of at least the block portions 708 and of the source-to-source bridges 1802 (FIG. 18C). In some embodiments, the dielectric material 1902 is formed over the entire surface and then patterned to form contact area openings 1904 (e.g., slits) over where the contact openings 1106 were formed through the stack structure 1002 and to form slit area openings 1906 between the block portions 708 and the source-to-source bridges 1802, as most clearly illustrated in FIG. 19C. After forming the dielectric material 1902, the source-to-source bridges 1802 are isolated—from the remaining source region sacrificial material 1402 between the block portions 708—by the bridge isolation base 1704, the bridge isolation sidewalls 1706, and the bridge isolation tops 1908. The source region sacrificial material 1402 within the source-to-source bridges 1802 remains in direct physical contact with the source region sacrificial material 1402 in the block portions 708 that will eventually provide the interdeck source regions 104 (FIG. 1).

Figure 20A:
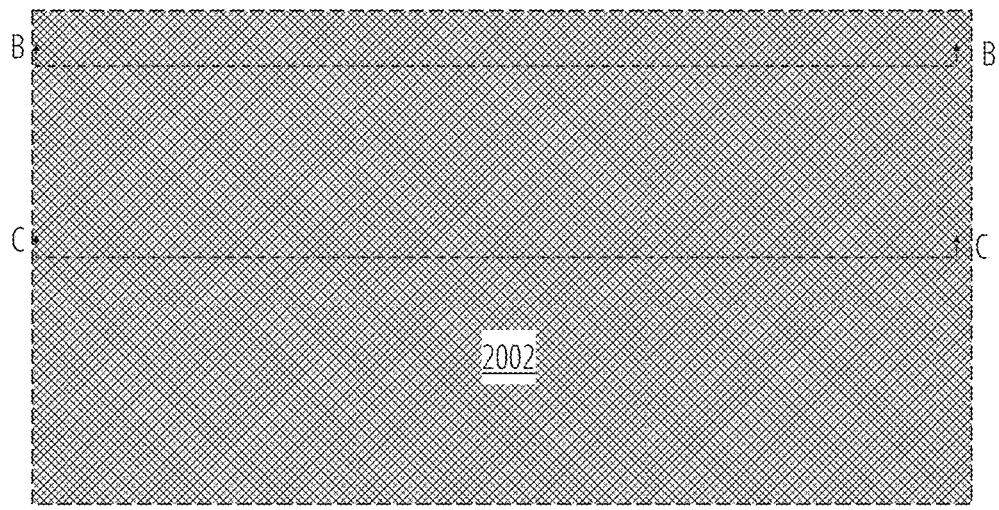
FIG. 20A is a top plan, schematic illustration of the microelectronic device structure during a stage of processing following that of FIG. 19A through FIG. 19C.
Figure 20A:
Figure 20B:
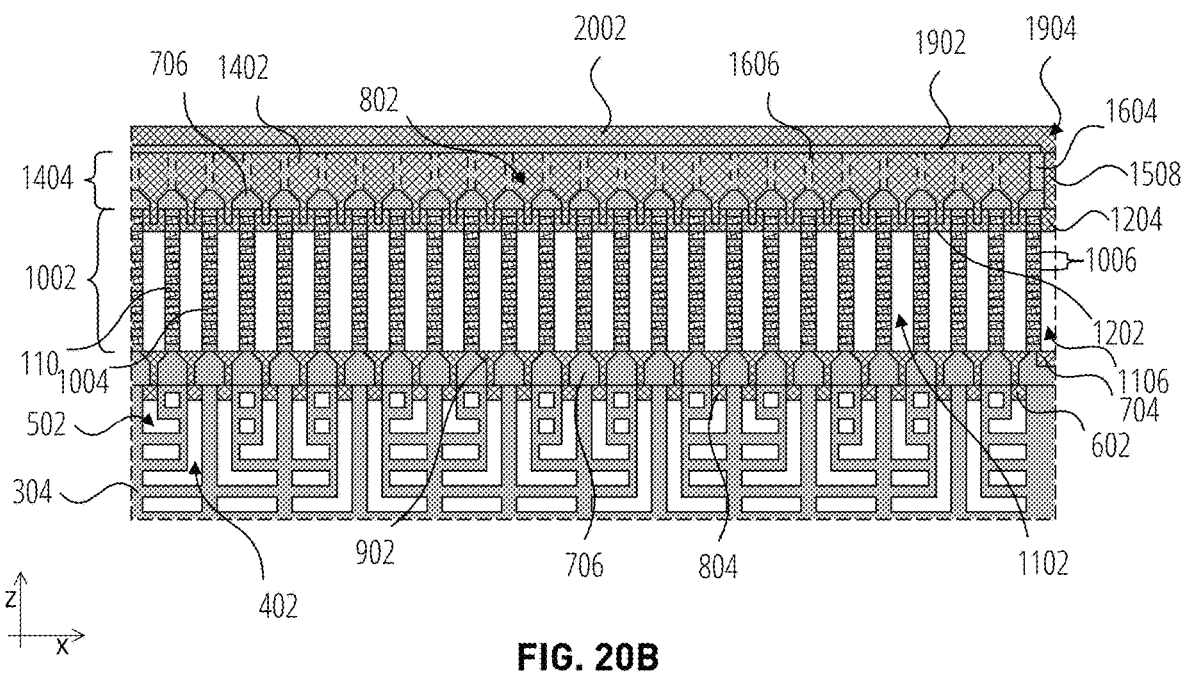
FIG. 20B is a cross-sectional, elevational, schematic illustration taken along section line B-B of FIG. 20A.
Figure 20C:
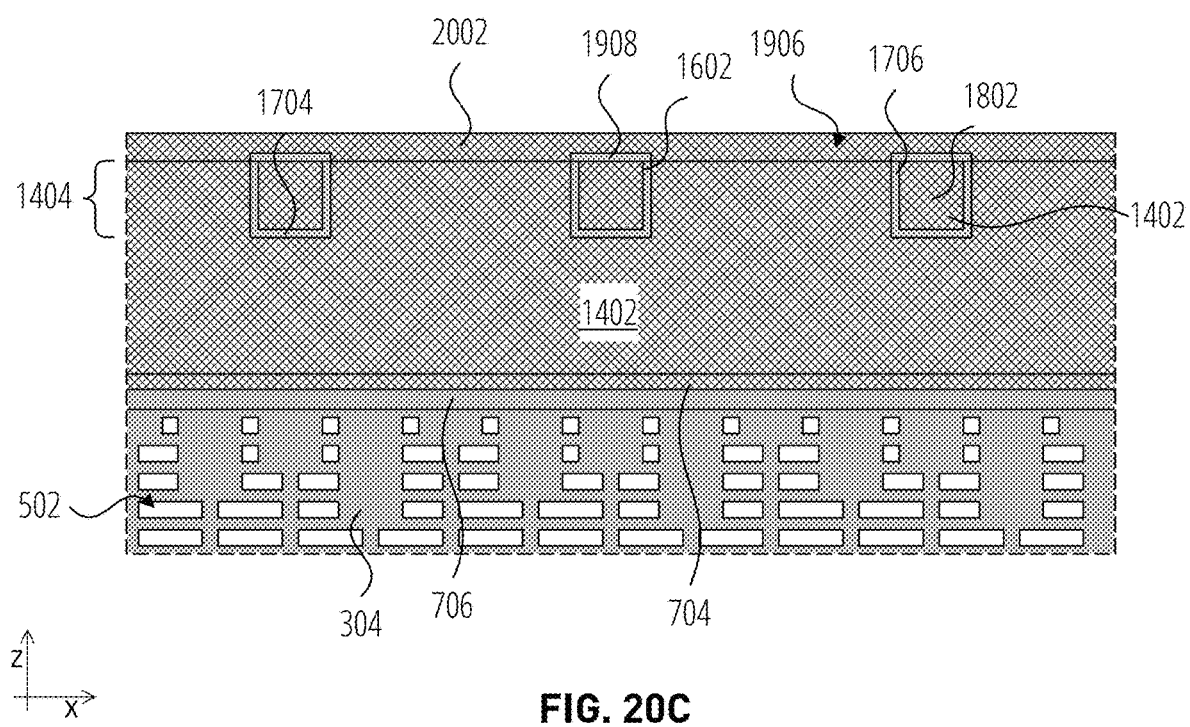
FIG. 20C is a cross-sectional, elevational, schematic illustration taken along section line C-C of FIG. 20A.

With reference to FIG. 20A, FIG. 20B, and FIG. 20C, a sacrificial etch stop material 2002 is formed (e.g., deposited) over the structure, filling the contact area openings 1904 (as illustrated in FIG. 20B) and filling the slit area openings 1906 (as illustrated in FIG. 20C). The sacrificial etch stop material 2002 may be formulated or otherwise selected to be selectively etchable relative to oxide materials and nitride materials of the structure. In some embodiments, the sacrificial etch stop material 2002 has substantially the same composition as that of the source region sacrificial material 1402. The sacrificial etch stop material 2002 may be planarized after formation.

Figure 21A:
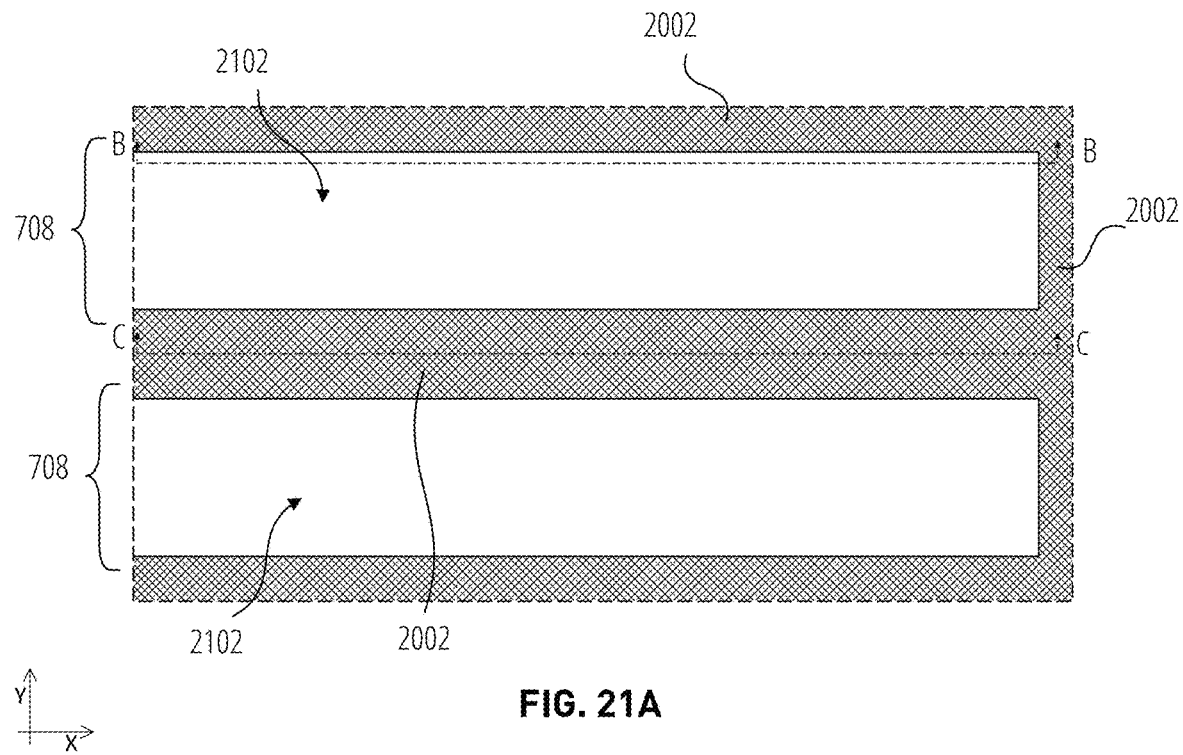
FIG. 21A is a top plan, schematic illustration of the microelectronic device structure during a stage of processing following that of FIG. 20A through FIG. 20C.
Figure 21B:
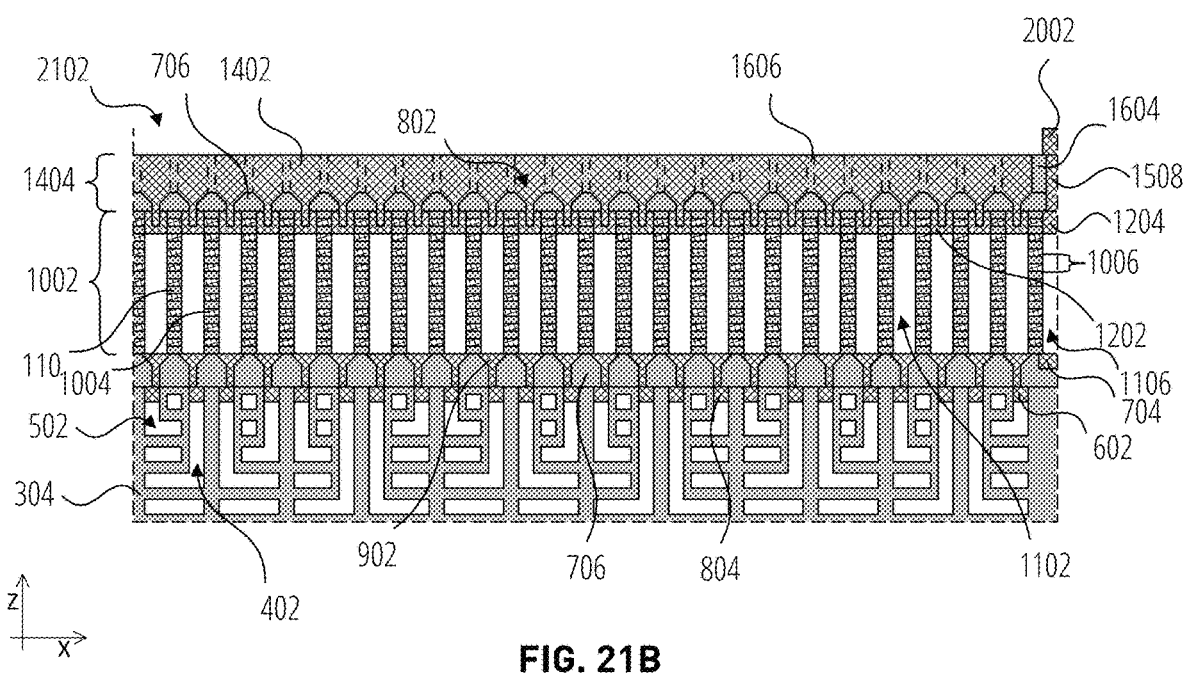
FIG. 21B is a cross-sectional, elevational, schematic illustration taken along section line B-B of FIG. 21A.
Figure 21C:
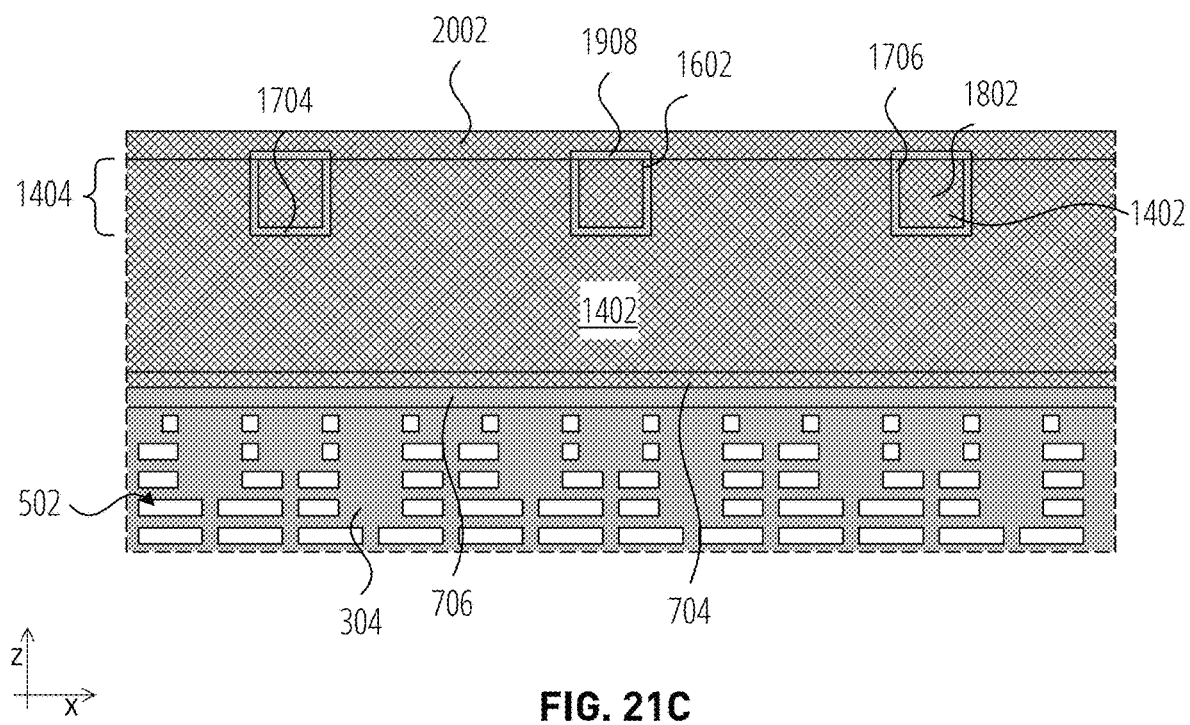
FIG. 21C is a cross-sectional, elevational, schematic illustration taken along section line C-C of FIG. 21A.

With reference to FIG. 21A, FIG. 21B, and FIG. 21C, the sacrificial etch stop material 2002 is patterned (e.g., etched) to define openings 2102 in the block portions 708 that expose the source region sacrificial material 1402 of what will become the interdeck source region 104 (FIG. 1). In embodiments in which the support structures 1606 were formed, the support structures 1606 may also be exposed by forming the openings 2102. The sacrificial etch stop material 2002 may be patterned so as to remain above the source-to-source bridges 1802 (see FIG. 21C) and above the contact openings 1106 (FIG. 21B).

Figure 22A:
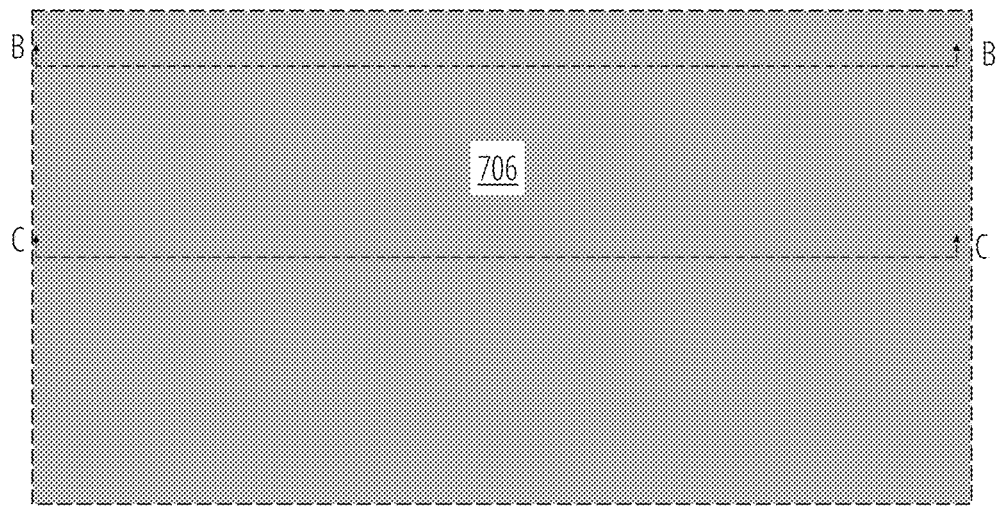
FIG. 22A is a top plan, schematic illustration of the microelectronic device structure during a stage of processing following that of FIG. 21A through FIG. 21C.
Figure 22A:
Figure 22B:
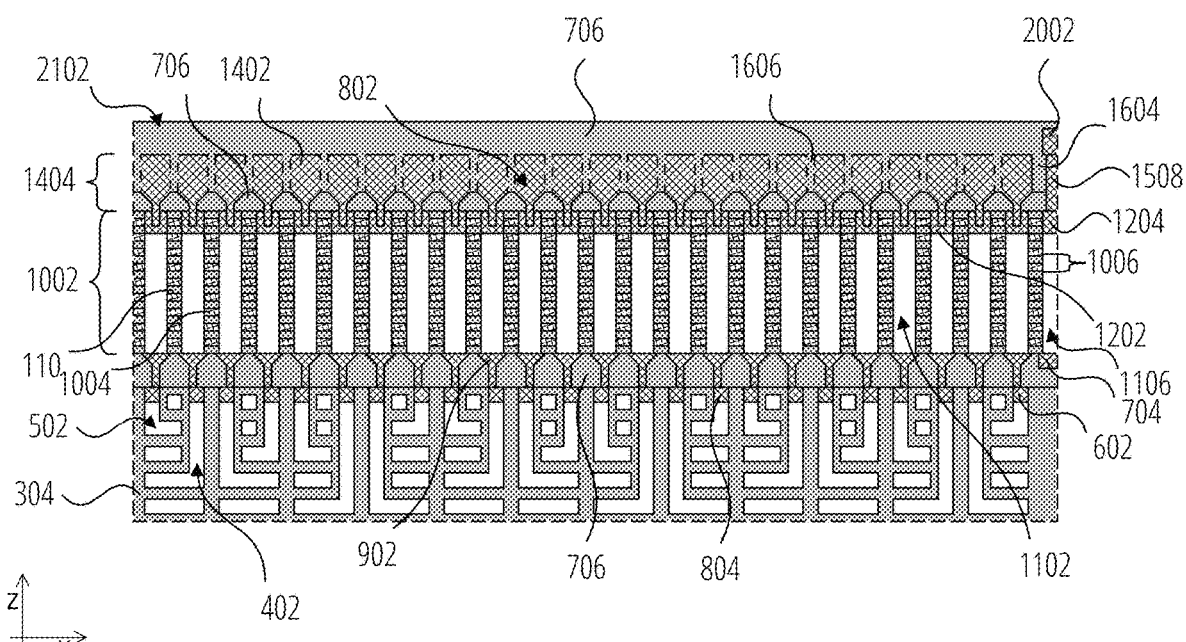
FIG. 22B is a cross-sectional, elevational, schematic illustration taken along section line B-B of FIG. 22A.
Figure 22C:
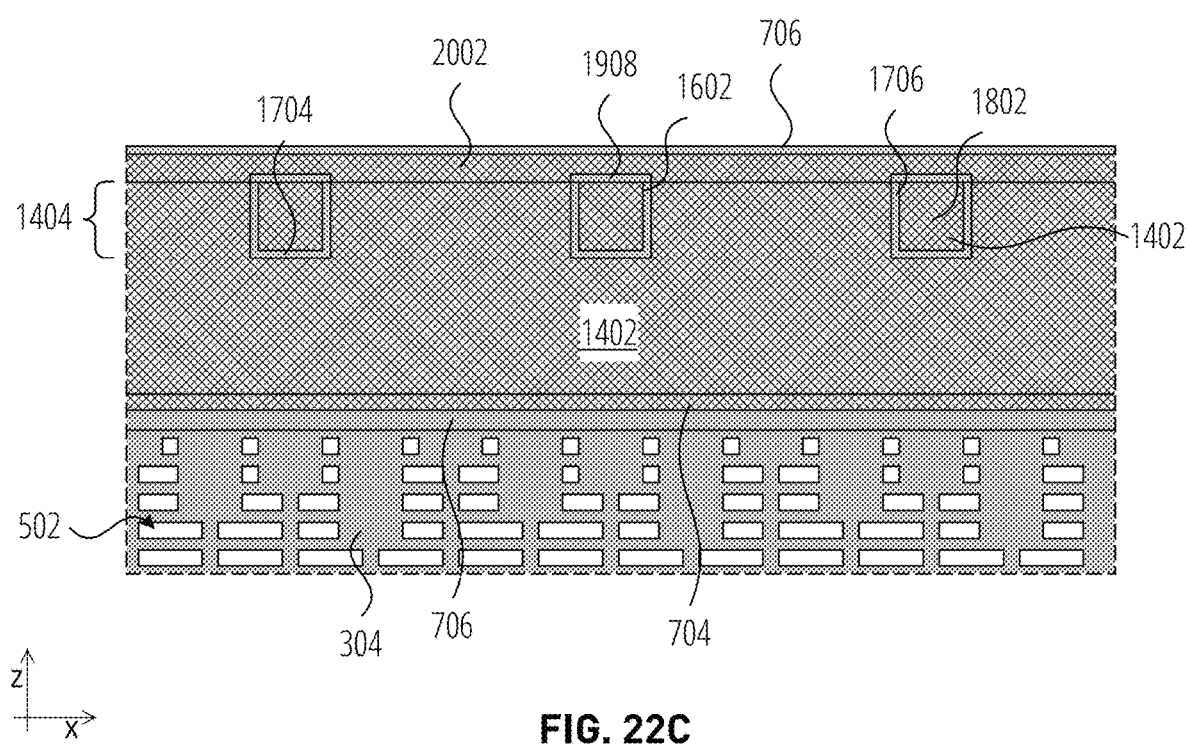
FIG. 22C is a cross-sectional, elevational, schematic illustration taken along section line C-C of FIG. 22A.

With reference to FIG. 22A, FIG. 22B, and FIG. 22C, additional dielectric material 706 may be formed (e.g., deposited) to fill the openings 2102 and to overlay the sacrificial etch stop material 2002.

Figure 23A:
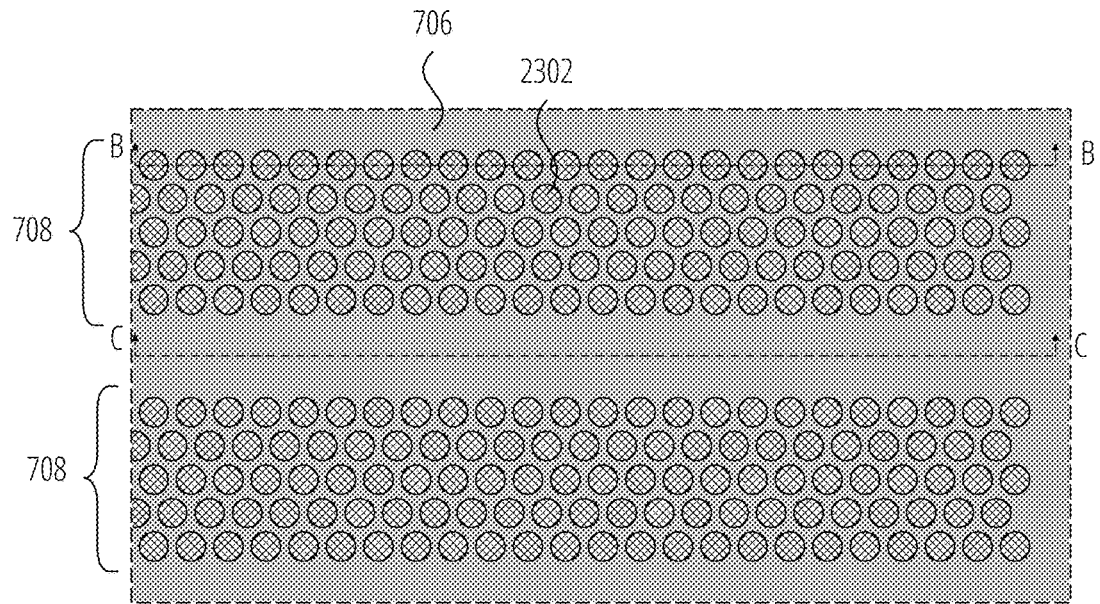
FIG. 23A is a top plan, schematic illustration of the microelectronic device structure during a stage of processing following that of FIG. 22A through FIG. 22C.
Figure 23B:
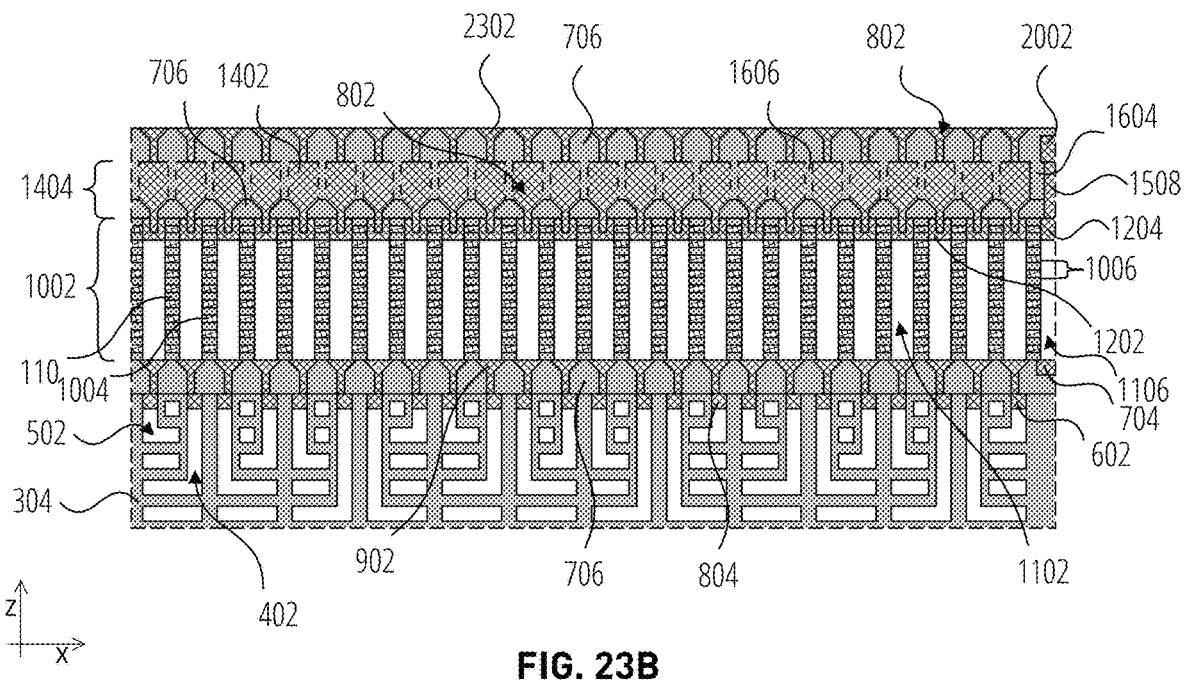
FIG. 23B is a cross-sectional, elevational, schematic illustration taken along section line B-B of FIG. 23A.
Figure 23C:
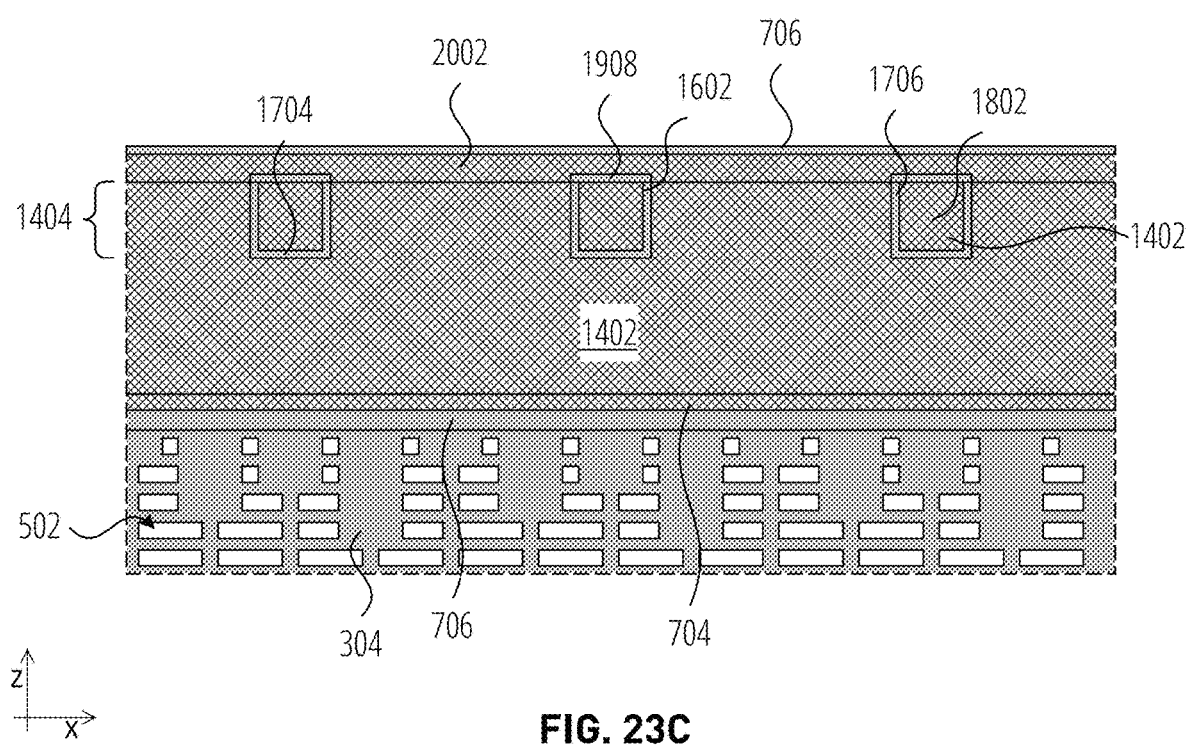
FIG. 23C is a cross-sectional, elevational, schematic illustration taken along section line C-C of FIG. 23A.

With reference to FIG. 23A, FIG. 23B, and FIG. 23C, the dielectric material 706 above the source region sacrificial material 1402 (of what will become the interdeck source region 104 (FIG. 1)) is patterned to form additional Y-shaped openings 802 (e.g., in the multistep etching process described above), which may vertically align with the previously-formed Y-shaped openings 802 (e.g., the Y-shaped openings 802 filled with the source region sacrificial material 1402 above the stack structure 1002 and the Y-shaped structures formed from the sacrificial material 902 below the stack structure 1002). The additional Y-shaped openings 802 may then be filled with additional sacrificial material (e.g., which may be of the same or different composition from the sacrificial material 902 of the Y-shaped structures below the stack structure 1002 and/or of the same or different composition from the source region sacrificial material 1402 throughout height 1404) and planarized to form Y-shaped sacrificial structures 2302 above the region that will become the interdeck source region 104 (FIG. 1).

Figure 24A:
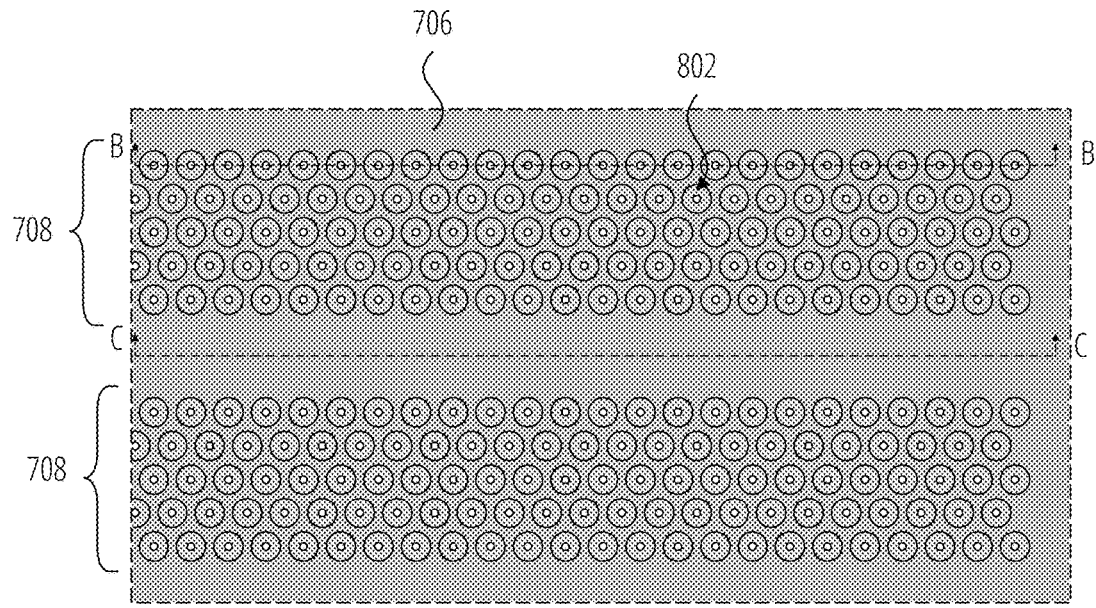
FIG. 24A is a top plan, schematic illustration of the microelectronic device structure during a stage of processing following that of FIG. 23A through FIG. 23C.
Figure 24B:
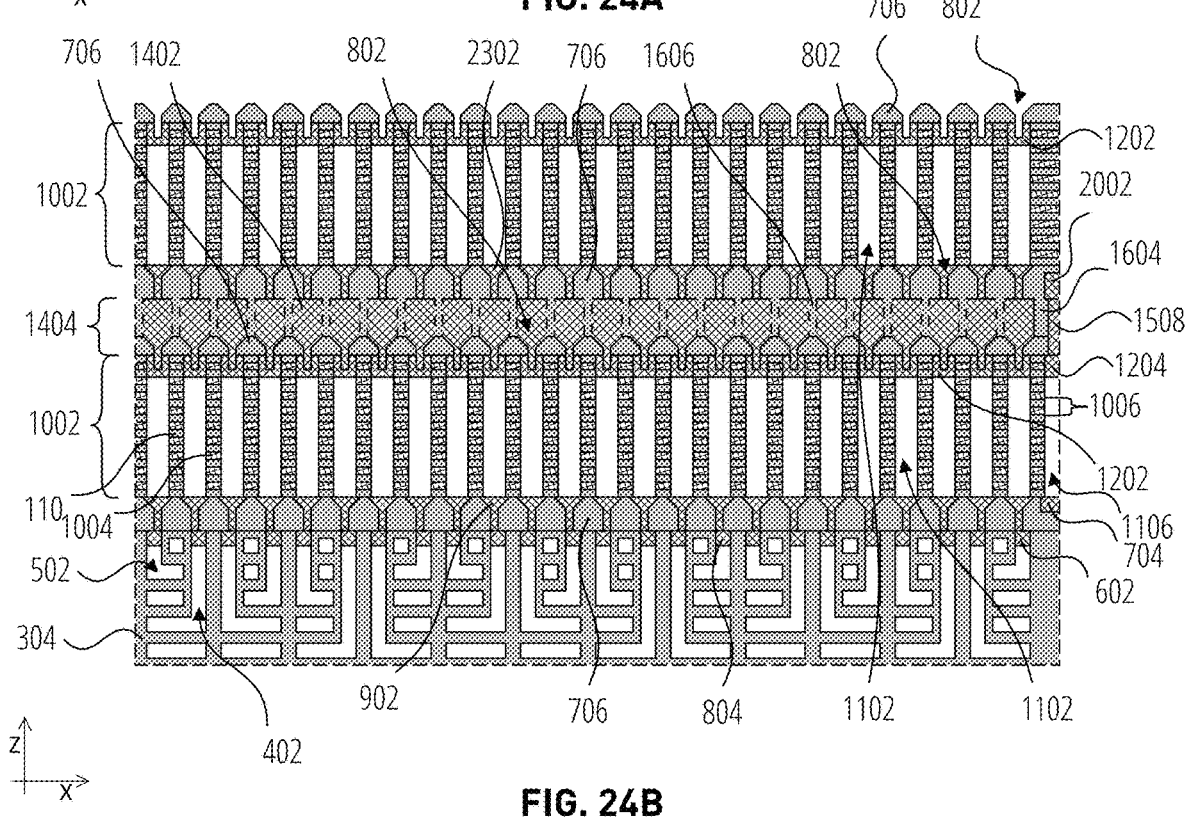
FIG. 24B is a cross-sectional, elevational, schematic illustration taken along section line B-B of FIG. 24A.
Figure 24C:
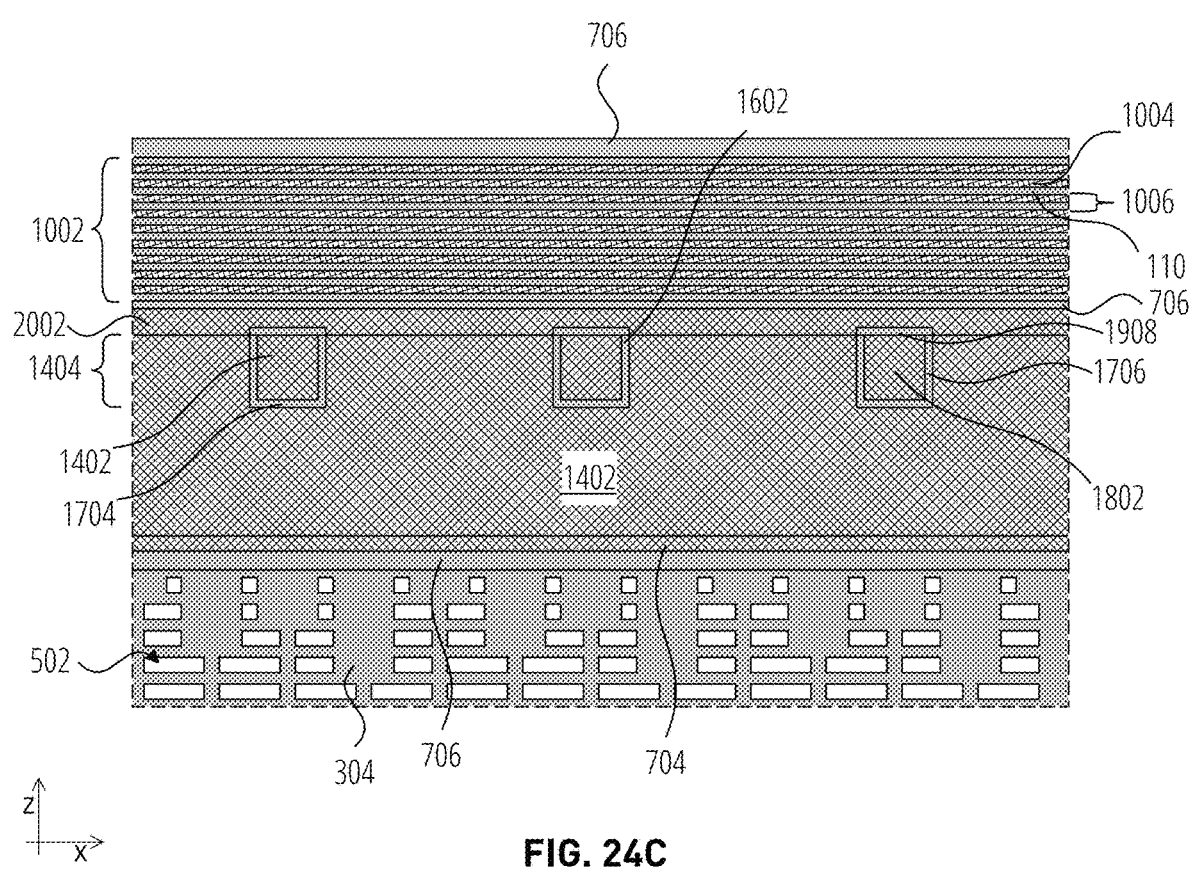
FIG. 24C is a cross-sectional, elevational, schematic illustration taken along section line C-C of FIG. 24A.

With reference to FIG. 24A, FIG. 24B, and FIG. 24C, a second stack structure 1002 is formed (e.g., in a manner similar to that illustrated and described above with regard to FIG. 10A through FIG. 10C) over the Y-shaped sacrificial structures 2302 and is patterned (e.g., in a manner similar to that illustrated and described above with regard to FIG. 11A through FIG. 11C) to define pillar openings 1102 (but without defining contact openings 1106). Pillar plugs 1202 of a sacrificial material may then be formed (e.g., in a manner similar to that illustrated and described above with regard to FIG. 12A through FIG. 12C, but without forming the contact plugs 1204 and the slit plugs 1206). Then, dielectric material 706 may be formed and patterned to define Y-shaped openings 802 extending partially into, but not fully through, the pillar plugs 1202 (e.g., in a manner similar to that illustrated and described above with regard to FIG. 13A through FIG. 13C, but without forming the middle contact openings 1302 and the slits 1104).

Next, a selective etch is performed to remove the pillar plugs 1202 at the top of the pillar openings 1102 of the upper stack structure 1002, to remove the Y-shaped sacrificial structures 2302 at the bottom of the pillar openings 1102 of the stack structure 1002, to remove the source region sacrificial material 1402 throughout the height 1404 of what will become the interdeck source region 104 (FIG. 1) and of the source-to-source bridges 1802, leaving source cavities 2502 communicating with source-to-source bridge openings 2504; to remove the pillar plugs 1202 at the top of the pillar openings 1102 of the lower stack structure 1002, to remove the sacrificial material 902 of the Y-shaped structures at the bottom of the pillar openings 1102 of the stack structure 1002, and to remove the sacrificial plugs 804 at the top of the bit contact openings 402.

To selectively remove the materials and structures, an etchant chemistry may be formulated or otherwise selected to remove the aforementioned sacrificial materials and structures without substantially removing the materials of the stack structures 1002, the dielectric materials 706, the support structures 1606 (if included), or the base structure 304. For example, in some embodiments in which the sacrificial materials to be removed comprise one or more metals (e.g., tungsten) and the materials not to be removed comprise oxides and nitrides, an etchant is used that comprises sulfuric acid ($H_2SO_4$), water, and hydrogen peroxide ($H_2O_2$) (a combination known in the art as a "piranha solution"), that comprises a mixture of ammonia ($NH_3$) and $H_2O_2$ (a combination otherwise known in the art as "APM"), that comprises an acid (e.g., a hot acid), and/or that comprises a base (e.g., a hot base).

Because the selective etchant process removes a substantial portion of the material to form the source cavities 2502 throughout height 1404, the inclusion of the support structures 1606 (in some embodiments) may facilitate sufficient mechanical support to the dielectric material 706 and stack structure 1002 above the height 1404 to avoid structural collapse in what will become the interdeck source region 104 (FIG. 1). Accordingly, the number (e.g., quantity) and arrangement of the support structures 1606 may be tailored according to the needed mechanical support during the sacrificial removal process.

Figure 25A:
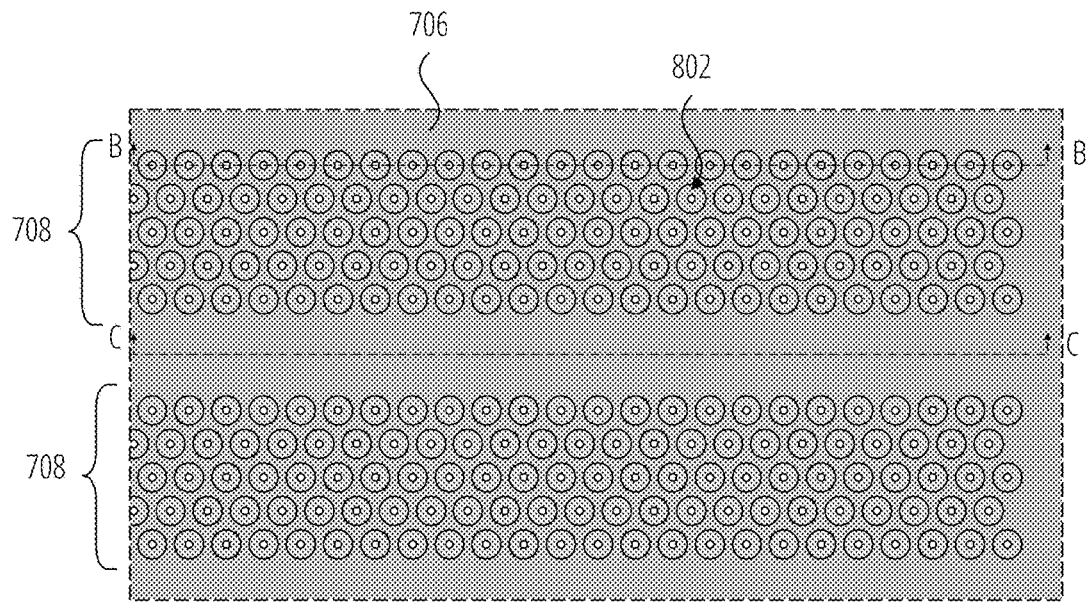
FIG. 25A is a top plan, schematic illustration of the microelectronic device structure during a stage of processing following that of FIG. 24A through FIG. 24C.
Figure 25B:
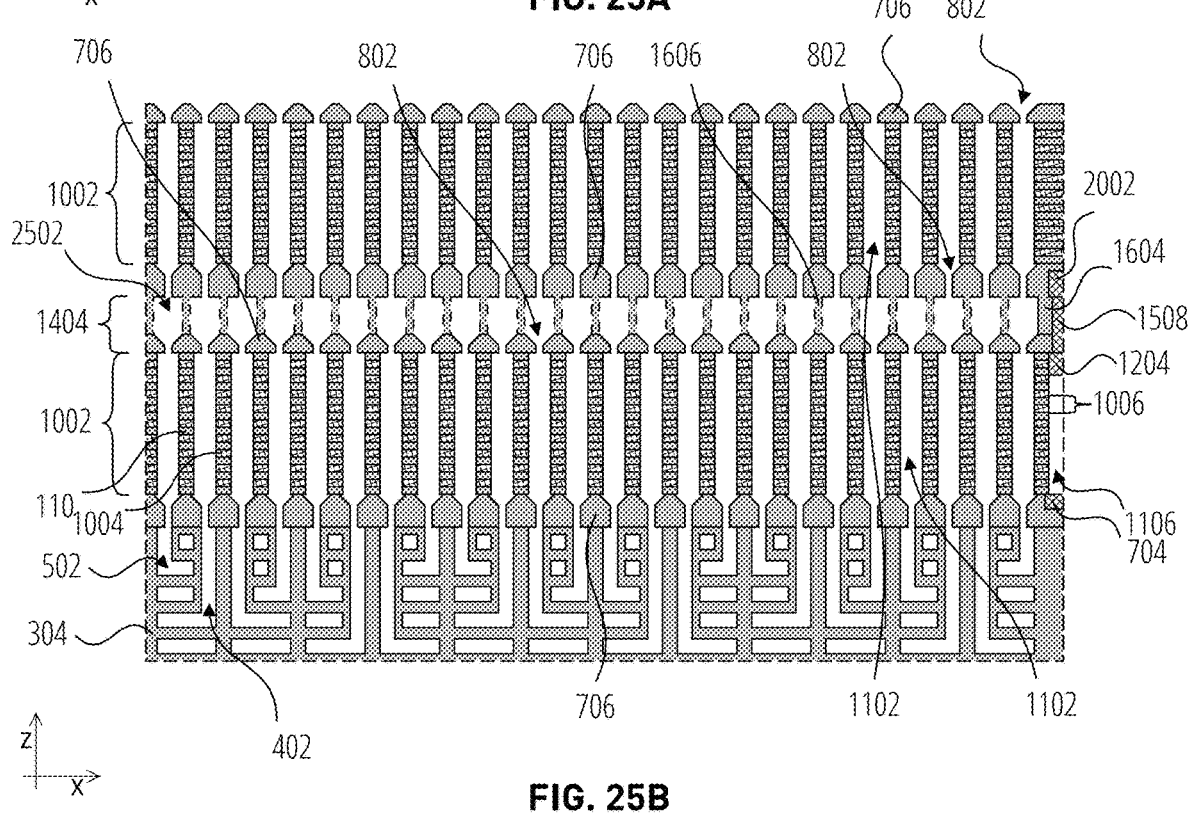
FIG. 25B is a cross-sectional, elevational, schematic illustration taken along section line B-B of FIG. 25A.
Figure 25C:
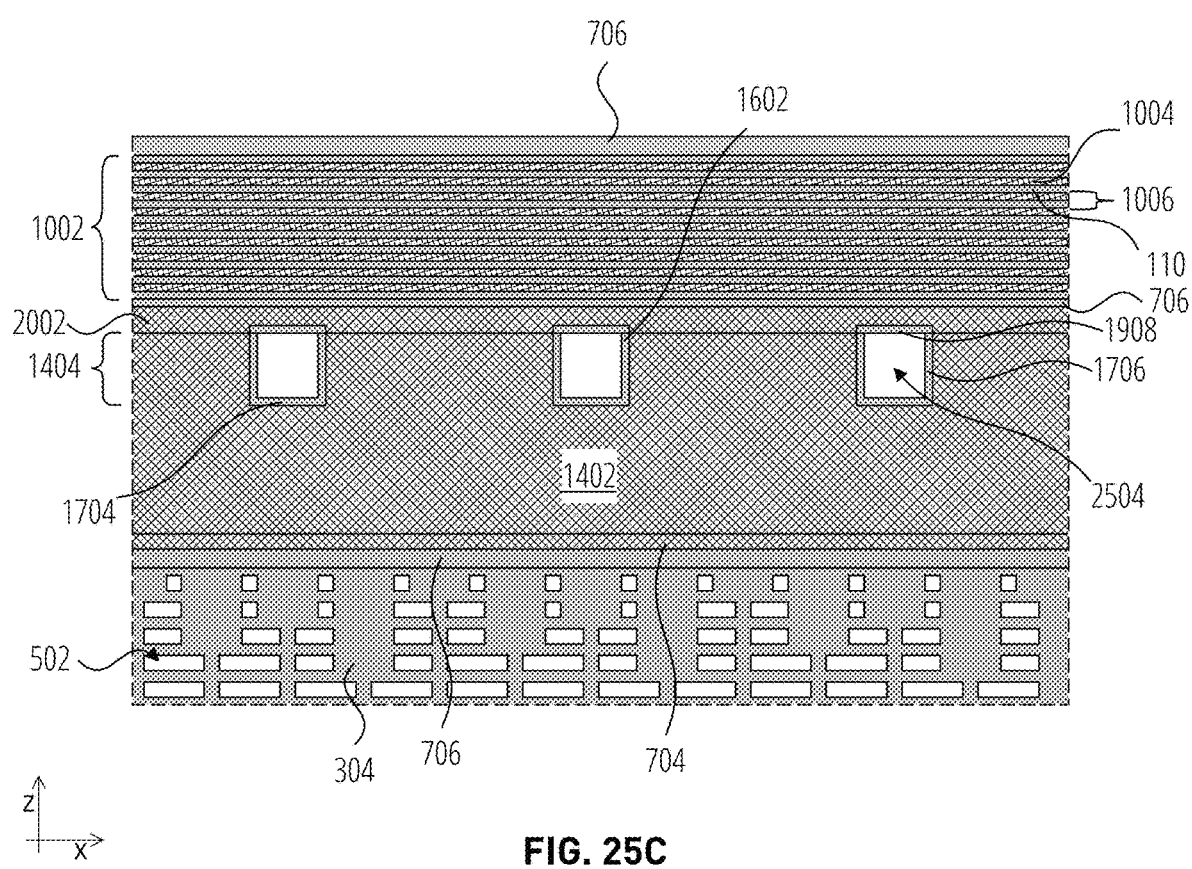
FIG. 25C is a cross-sectional, elevational, schematic illustration taken along section line C-C of FIG. 25A.

The aforementioned selective removal of sacrificial material removes sacrificial material and structures only from the block portions 708 of the structure, as well as those portions of such materials and structures that may extend beyond the block portions 708. Therefore, as illustrated in FIG. 25B, the source region sacrificial material 1402 (FIG. 24B) is removed to form the source cavities 2502, and the source region sacrificial material 1402 that previously extended—as the source-to-source bridges 1802—between the source region sacrificial material 1402 of the block portions 708 is also removed to form source-to-source bridge openings 2504. The selective removal of the aforementioned sacrificial materials and structures results in openings extending through the upper stack structure 1002, through the source cavity 2502, through the lower stack structure 1002, and into the bit contact openings 402 as well as across the gap between the block portions 708 via the source-to-source bridge openings 2504.

The sacrificial etch stop materials 2002, sacrificial contact structure 1508, contact plugs 1204, and sacrificial etch stop materials 704 above and below the contact openings 1106 may remain after the selective removal of the aforementioned sacrificial materials and structures because these other sacrificial materials and structures are not exposed to the selective etchant, due to isolation provided by portions of the stack structures 1002 and portions of the dielectric material 706. Also, with particular reference to FIG. 25C, the source region sacrificial material 1402—in the gap between the block portions 708, that was isolated by the insulative material 1602 of the bridge isolation base 1704, the bridge isolation sidewalls 1706, and the bridge isolation top 1908—also remains.

Figure 26A:
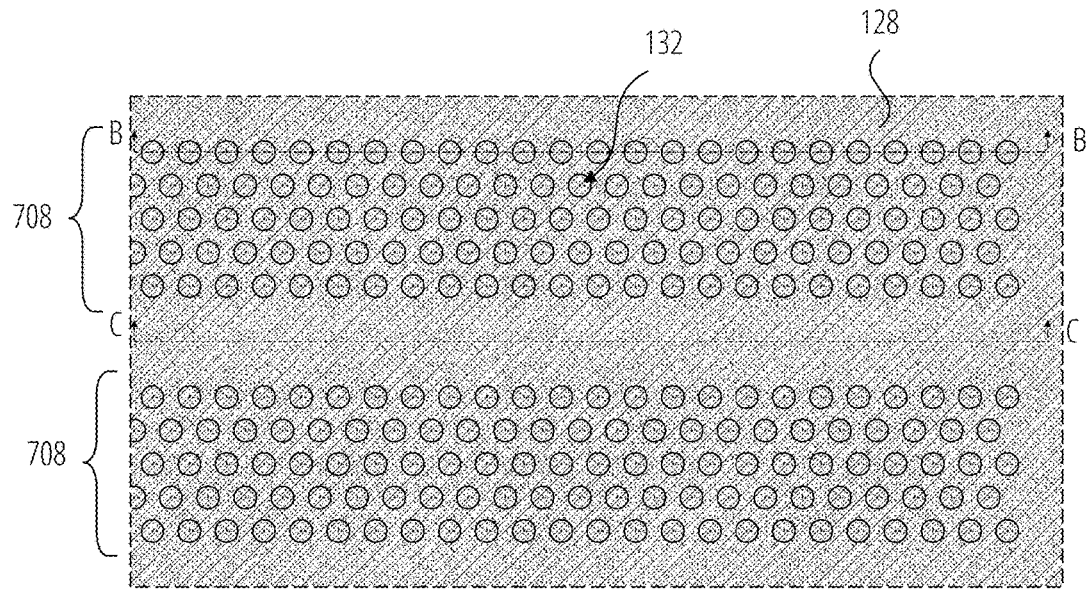
FIG. 26A is a top plan, schematic illustration of the microelectronic device structure during a stage of processing following that of FIG. 25A through FIG. 25C.
Figure 26B:
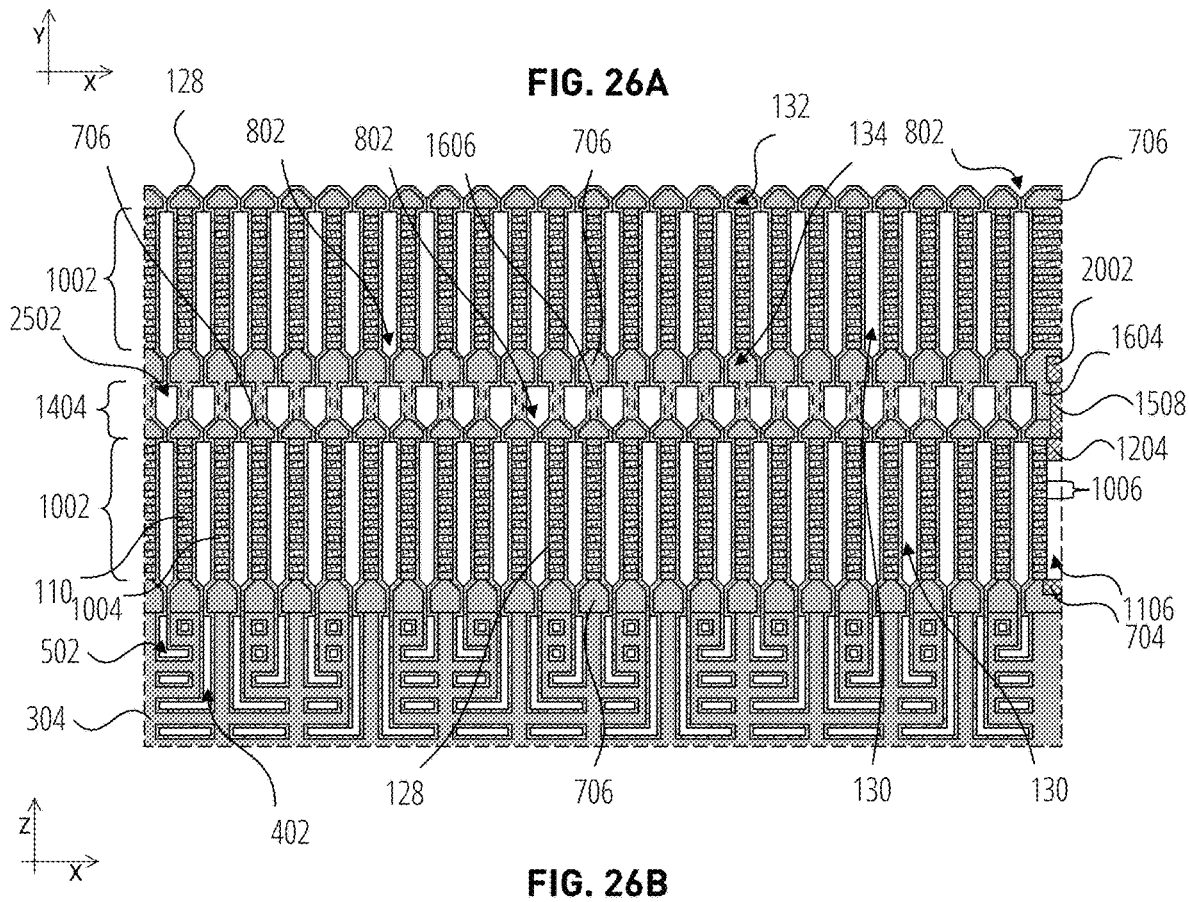
FIG. 26B is a cross-sectional, elevational, schematic illustration taken along section line B-B of FIG. 26A.
Figure 26C:
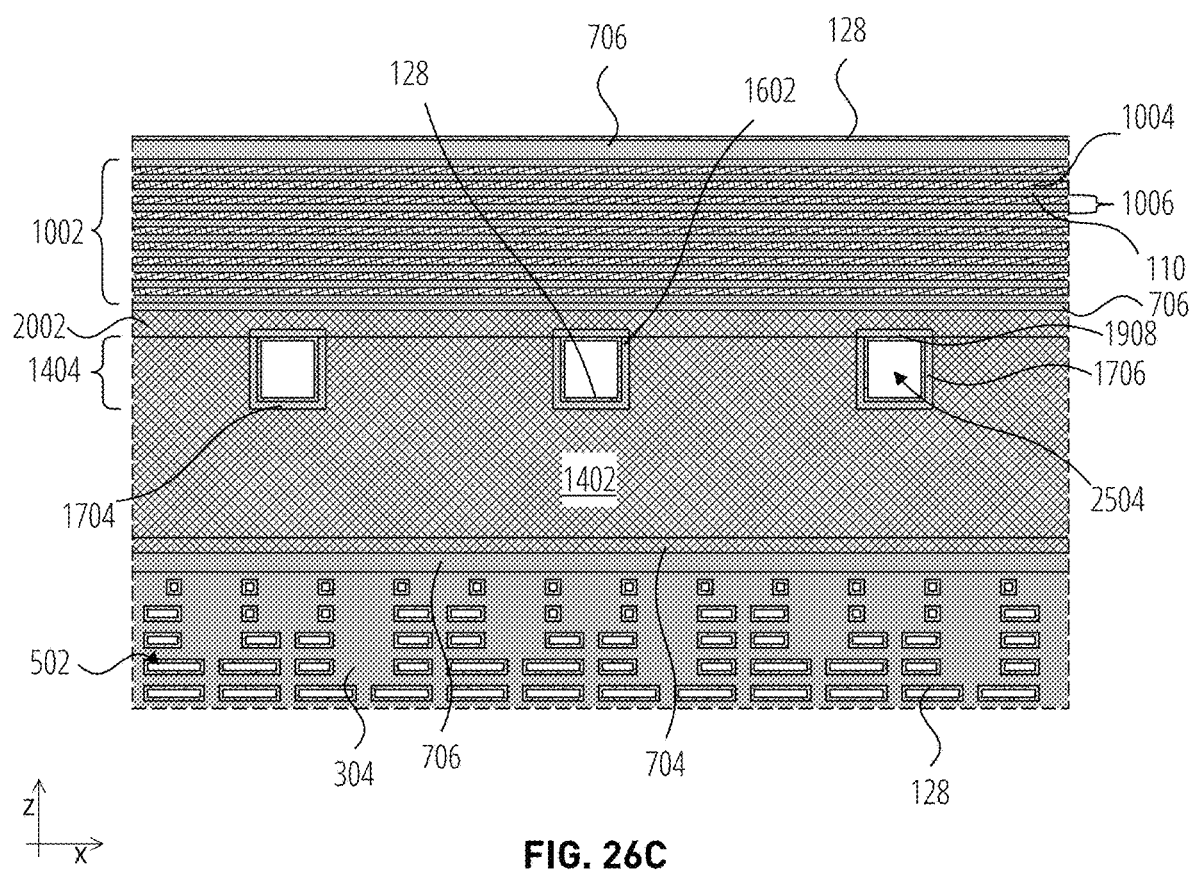
FIG. 26C is a cross-sectional, elevational, schematic illustration taken along section line C-C of FIG. 26A.

With reference to FIG. 26A, FIG. 26B, and FIG. 26C, the cell materials 128 are then formed (e.g., by atomic layer deposition (ALD), from outermost of the cell materials 128 to innermost of the cell materials 128) on all surfaces exposed by the selective removal of the aforementioned sacrificial materials and structures. The cell materials 128 are formed in the pillar openings 1102 (FIG. 25B) in the two stack structures 1002, in the source cavity 2502 between the stack structures 1002, in the source-to-source bridge openings 2504 that extend between neighboring source cavities 2502, as well as in the bit contact openings 402 and bit line voids 502.

At the stem portions of the Y-shaped openings 802, forming the cell materials 128 essentially "pinches off" the spaces above and below. For example, forming the cell materials 128 forms the upper pinch-off portions 132 and the lower pinch-off portions 134 that enclose the insulative voids 130. Also, the lower pinch-off portions 134 of the upper stack structure 1002 and the upper pinch-off portions 132 of the lower stack structure 1002 enclose the source cavity 2502 between the two stack structures 1002.

The dimensions of the Y-shaped openings 802 may be tailored to permit the cell materials 128 to form in the stem portions and pinch off the spaces above and below. Therefore, the stem portions of the Y-shaped openings 802 may be tailored to be less than about twice the thickness (e.g., lateral thickness) of the cell materials 128.

Figure 27:
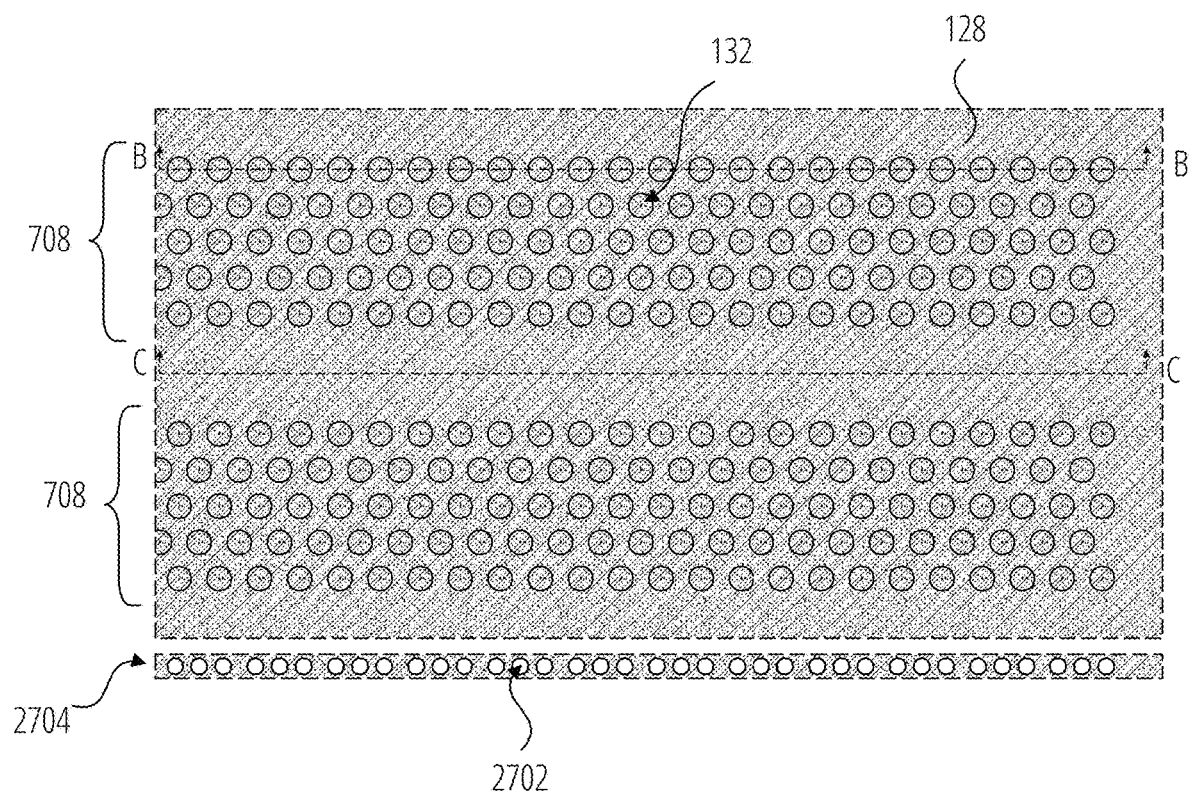

With reference to FIG. 27, contact openings 2702 may then be formed (e.g., etched) in a distal portion of the structure, referred to herein as an additional contact area 2704. This portion may be laterally distant from any of the block portions 708, but in footprint areas that are above some of the source-to-source bridge openings 2504 and some of the bit line voids 502. The contact openings 2702 may be etched downward to communicate with at least the source-to-source bridge openings 2504 in that footprint area and with the bit line voids 502 of that footprint area.

Figure 28A:
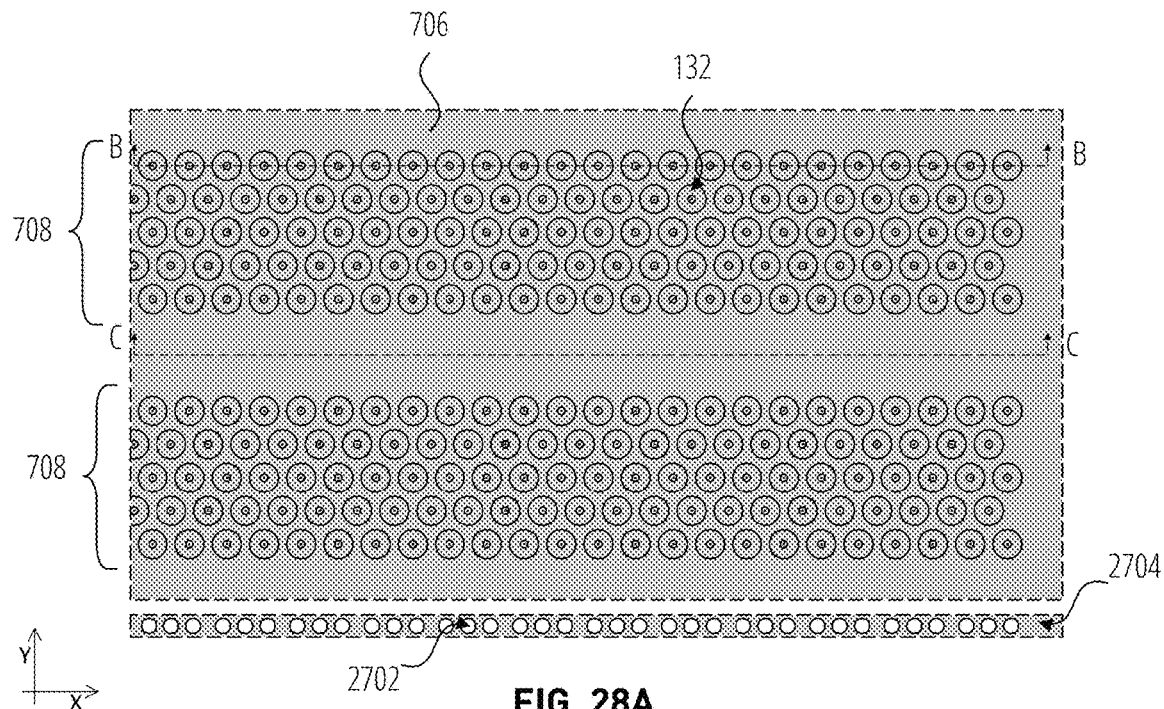
FIG. 28A is a top plan, schematic illustration of the microelectronic device structure during a stage of processing following that of FIG. 27.
Figure 28B:
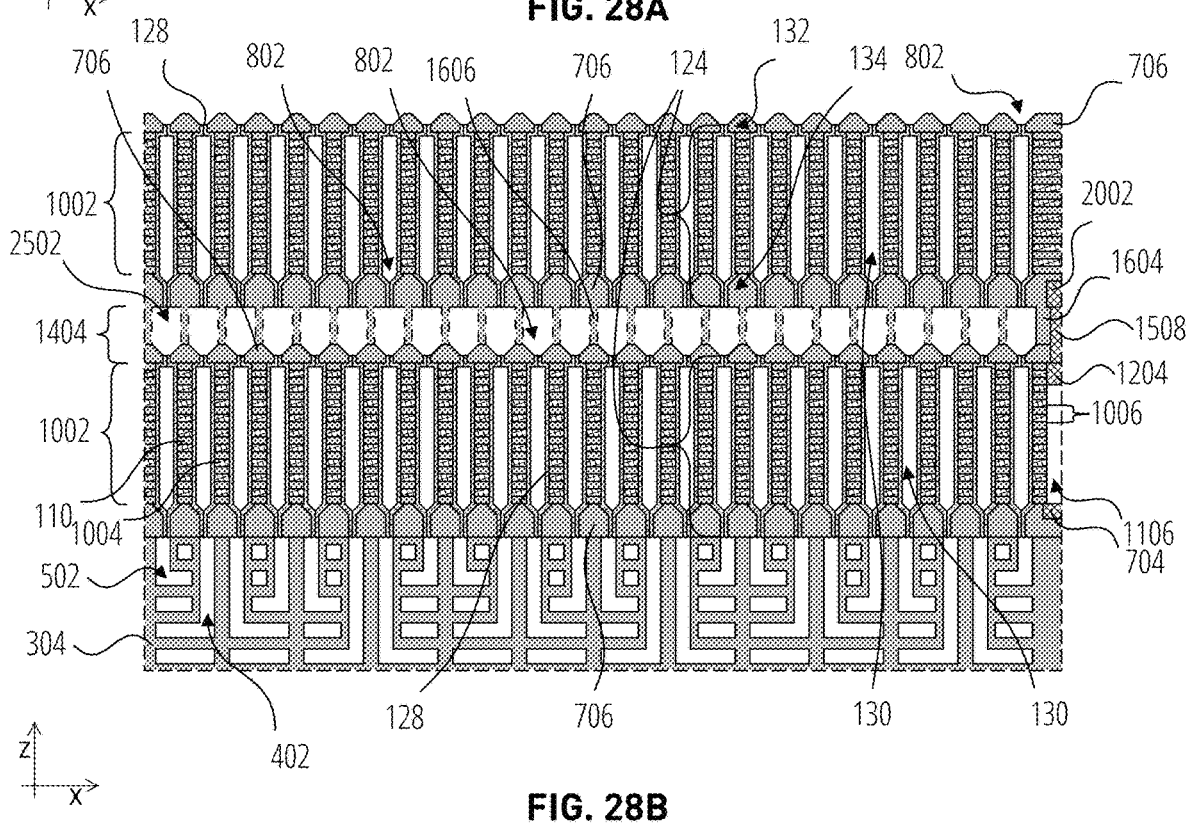
FIG. 28B is a cross-sectional, elevational, schematic illustration taken along section line B-B of FIG. 28A.
Figure 28C:
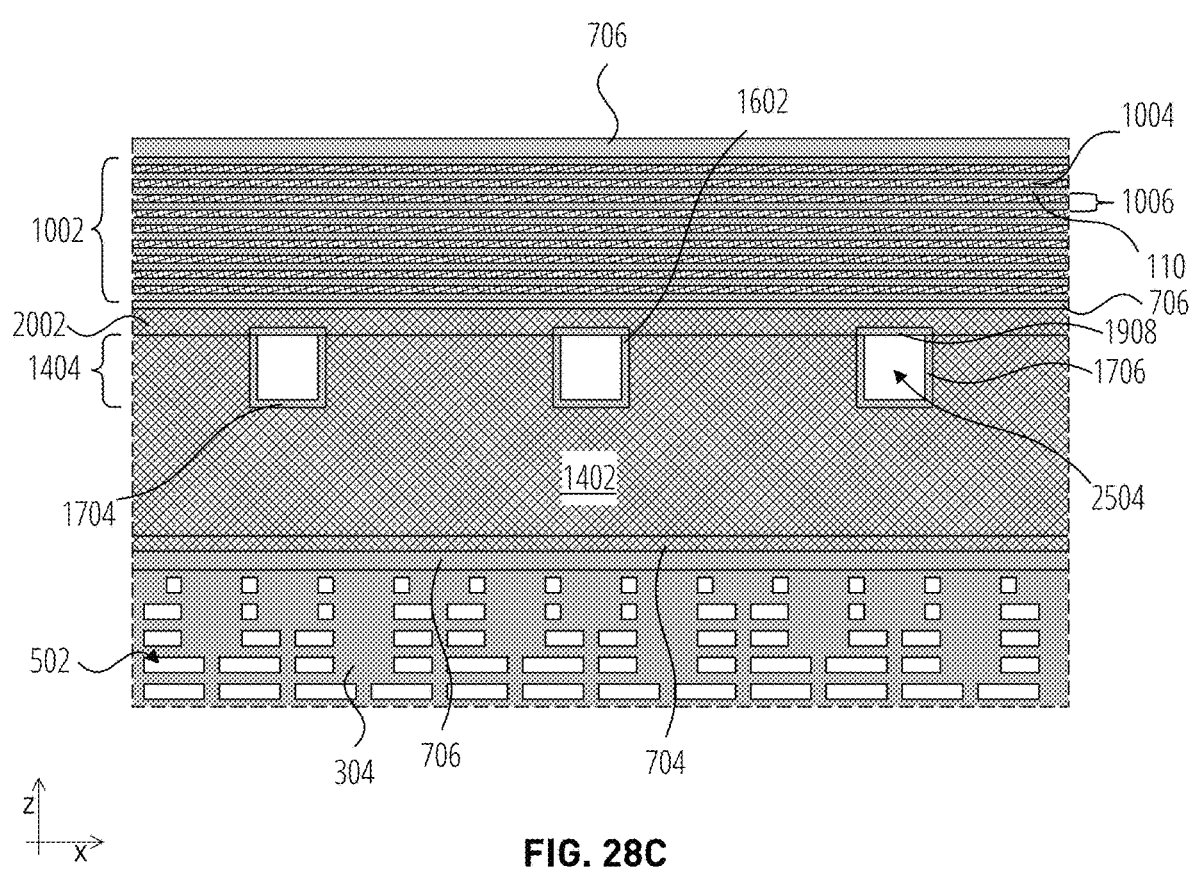
FIG. 28C is a cross-sectional, elevational, schematic illustration taken along section line C-C of FIG. 28A.

With reference to FIG. 28A, FIG. 28B, and FIG. 28C an atomic layer etching process or a vapor etching process may be performed to remove the cell materials 128 from those areas of the structure not "pinched off" by the upper pinch-off portions 132 or the lower pinch-off portions 134. That is, by way of the contact openings 2702 of the contact opening additional contact area 2704, an atomic layer etchant or vapor etchant may be exposed to the cell materials 128 that were formed in the bit line voids 502 and the source-to-source bridge openings 2504 to remove the cell materials 128 from those structures. For example, and without limitation, oxide material(s) of the cell materials 128 may be etched using an etchant comprising hydrofluoric acid (HF or HF vapor); nitride material(s) of the cell materials 128 may be etched using an etchant comprising hot phosphoric acid and/or HF vapor; oxynitride material(s) of the cell materials 128 may be etched using an etchant comprising HF, hot phosphoric acid, or HF vapor; and the channel material 208 may be etched using an etchant comprising tetramethylammonium hydroxide (TMAH), ammonium hydroxide ($NH_4OH$), nitrogen trifluoride ($NF_3$), and/or a combination of ammonia ($NH_3$) and HF vapor. Because the bit line voids 502 communicate with the bit contact openings 402, the cell materials 128 are also removed from the bit contact openings 402 by the atomic layer etchant or vapor etchant. Moreover, because the source-to-source bridge openings 2504 communicate with the source cavities 2502, the cell materials 128 are also removed from the source cavities 2502.

At the pinch-off portions (e.g., the upper pinch-off portions 132 and the lower pinch-off portions 134), the lack of void space between opposing sidewalls with cell materials 128 formed thereon may inhibit the etchant from readily removing the cell materials 128. Therefore, only portions of the cell materials 128 in or around the stem portions of the Y-shaped openings 802 may be removed, leaving at least some portions of the cell materials 128 to continue to pinch-off and isolate the insulative voids 130 of the pillars 124 from the etchant. Accordingly, the height of the stem portion of the Y-shaped openings 802 may have been tailored to enable at least some amount of the cell materials 128 to remain after the atomic layer etching or vapor etching process.

Figure 29A:
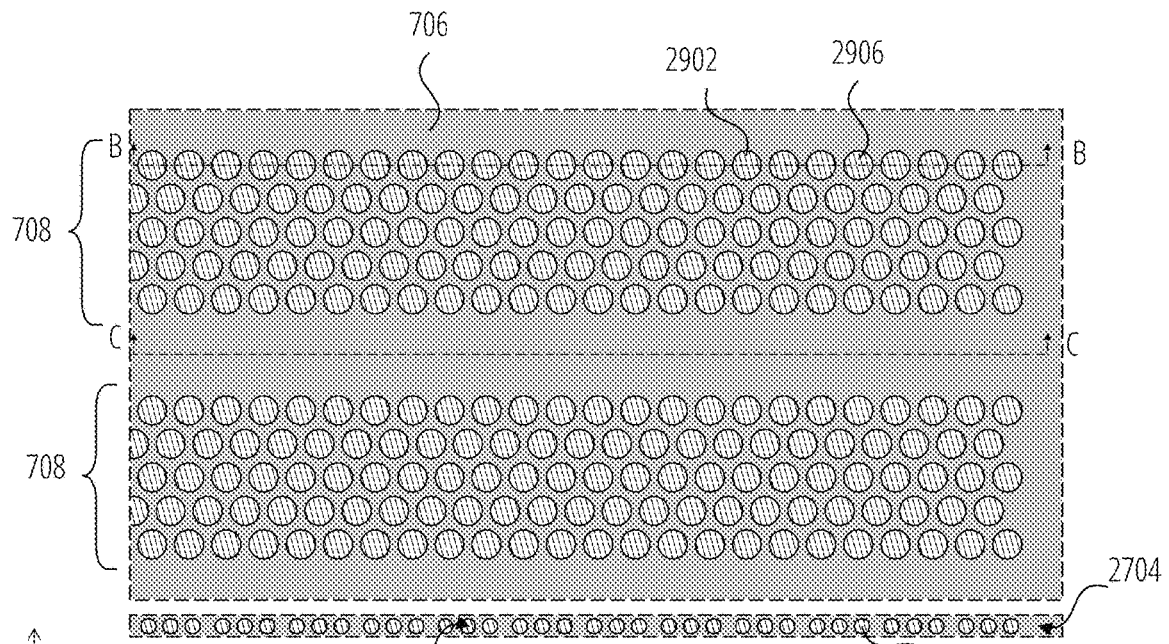
FIG. 29A is a top plan, schematic illustration of the microelectronic device structure during a stage of processing following that of FIG. 28A through FIG. 28C.
Figure 29B:
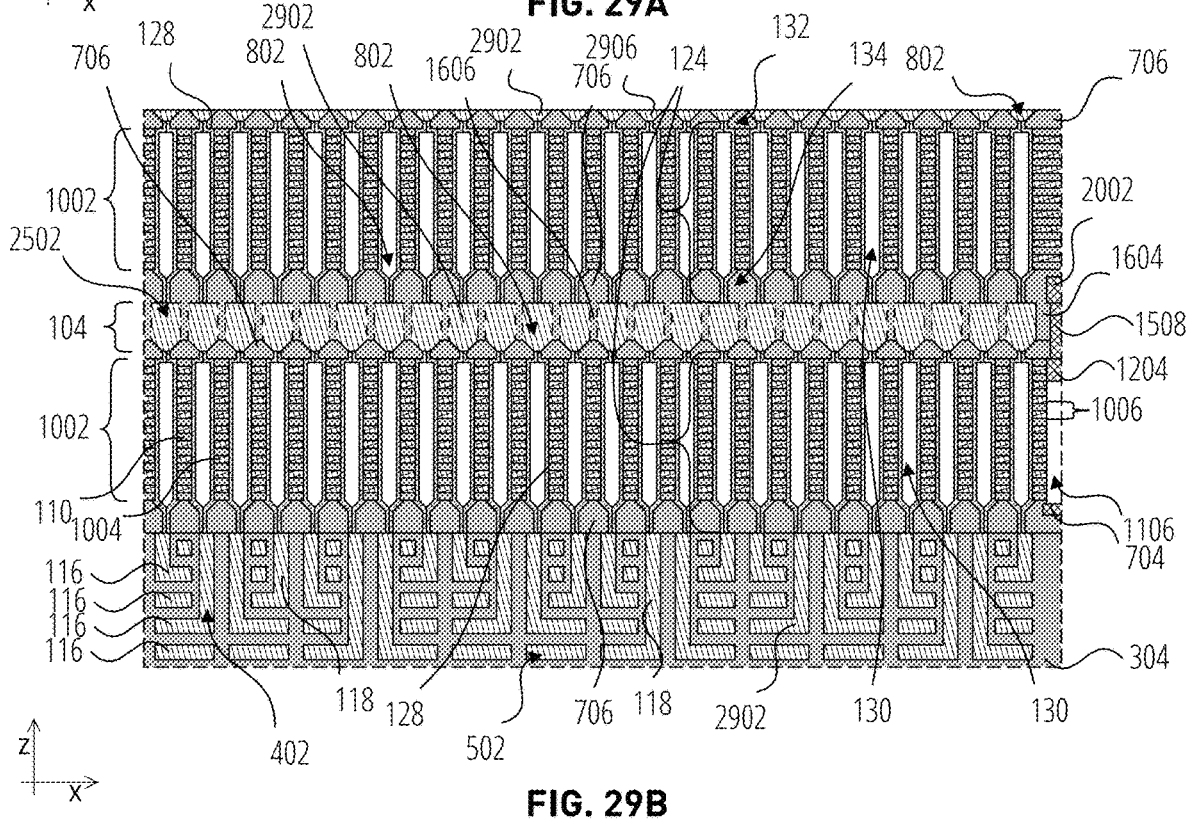
FIG. 29B is a cross-sectional, elevational, schematic illustration taken along section line B-B of FIG. 29A.
Figure 29C:
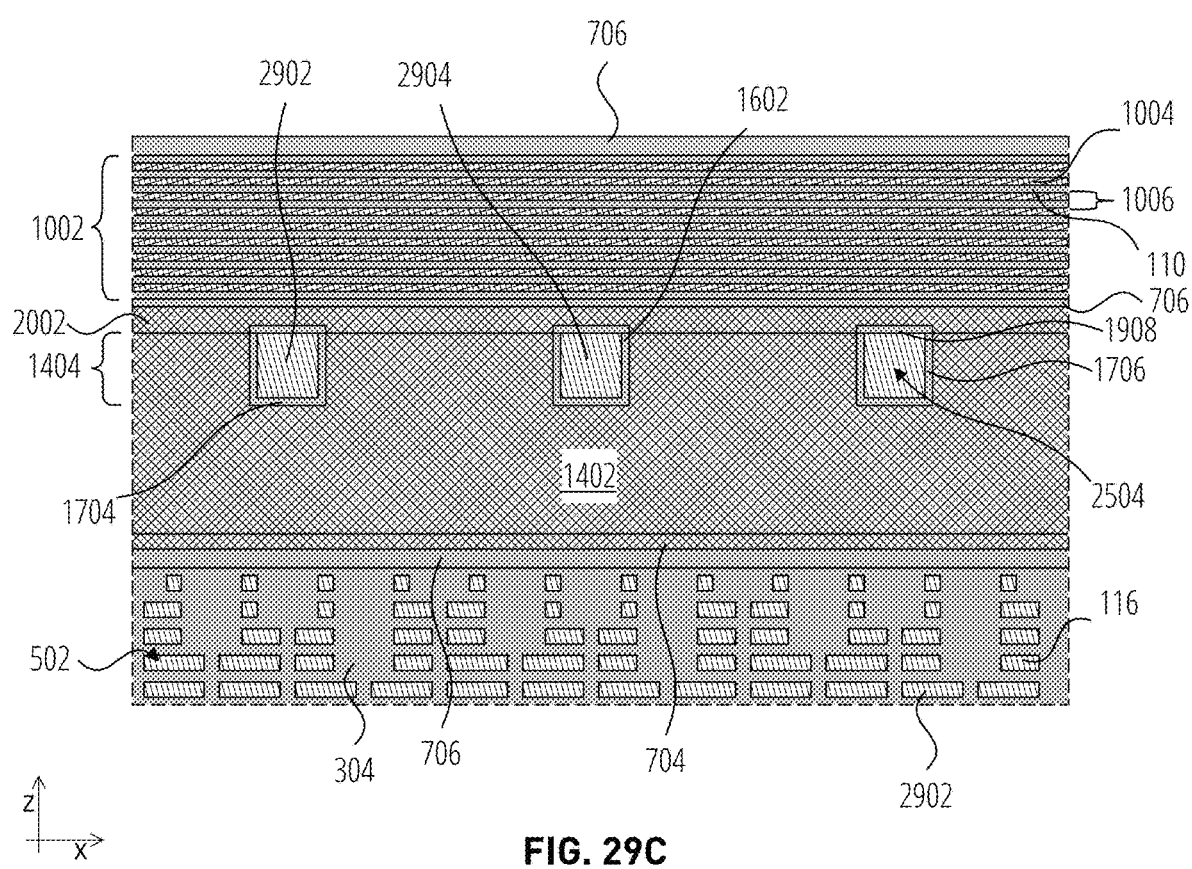
FIG. 29C is a cross-sectional, elevational, schematic illustration taken along section line C-C of FIG. 29A.

With reference to FIG. 29A, FIG. 29B, and FIG. 29C, one or more conductive material(s) 2902 may then be formed (e.g., by ALD) in the contact openings 2702 of the additional contact areas 2704 to fill the source cavities 2502 (forming the interdeck source region 104), the source-to-source bridge openings 2504 (forming conductive bridge structures 2904), the bit contact openings 402 (forming the bit line contacts 118), and the bit line voids 502 (forming the bit lines 116). The conductive material(s) 2902 are also formed in the top of the uppermost Y-shaped openings 802 to form top conductive structures 2906 in direct contact with the cell materials 128 at the upper pinch-off portions 132 of the upper stack structure 1002.

By forming the conductive material(s) 2902 in the source cavity 2502, the resulting interdeck source region 104 includes, along its lower surface, an array of V-shaped extensions that correspond to the tapering portion of the Y-shaped openings 802. Accordingly, at least a lower surface of the interdeck source region 104 is at least partially nonplanar.

The conductive material(s) 2902 (and therefore the interdeck source region 104, the conductive bridge structures 2904, the bit lines 116, and the bit line contacts 118) may be formed of and include N+ doped polysilicon, titanium with a titanium nitride liner, and/or tungsten.

The cell materials 128—with a channel region formed from the channel material 208 (FIG. 2A or FIG. 2B)—extend between the conductive material(s) 2902 of the source cavity 2502 and either the top conductive structures 2906 above the uppermost stack structure 1002 or the bit line contacts 118 below the lowermost stack structure 1002.

Figure 30A:
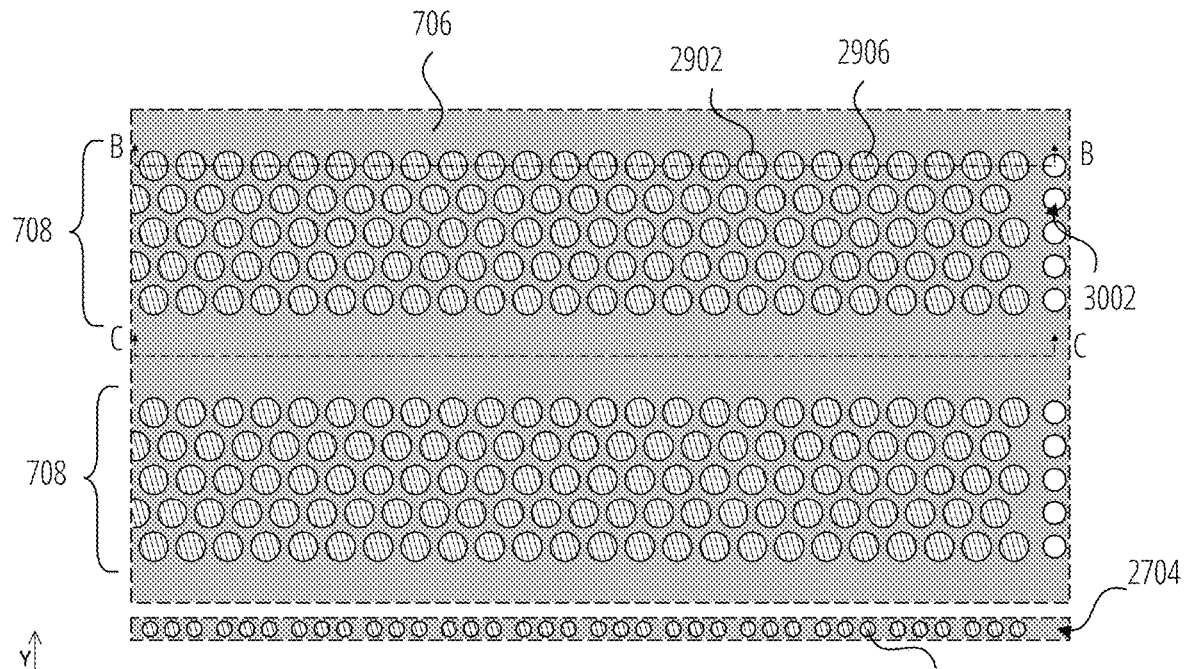
FIG. 30A is a top plan, schematic illustration of the microelectronic device structure during a stage of processing following that of FIG. 29A through FIG. 29C.
Figure 30B:
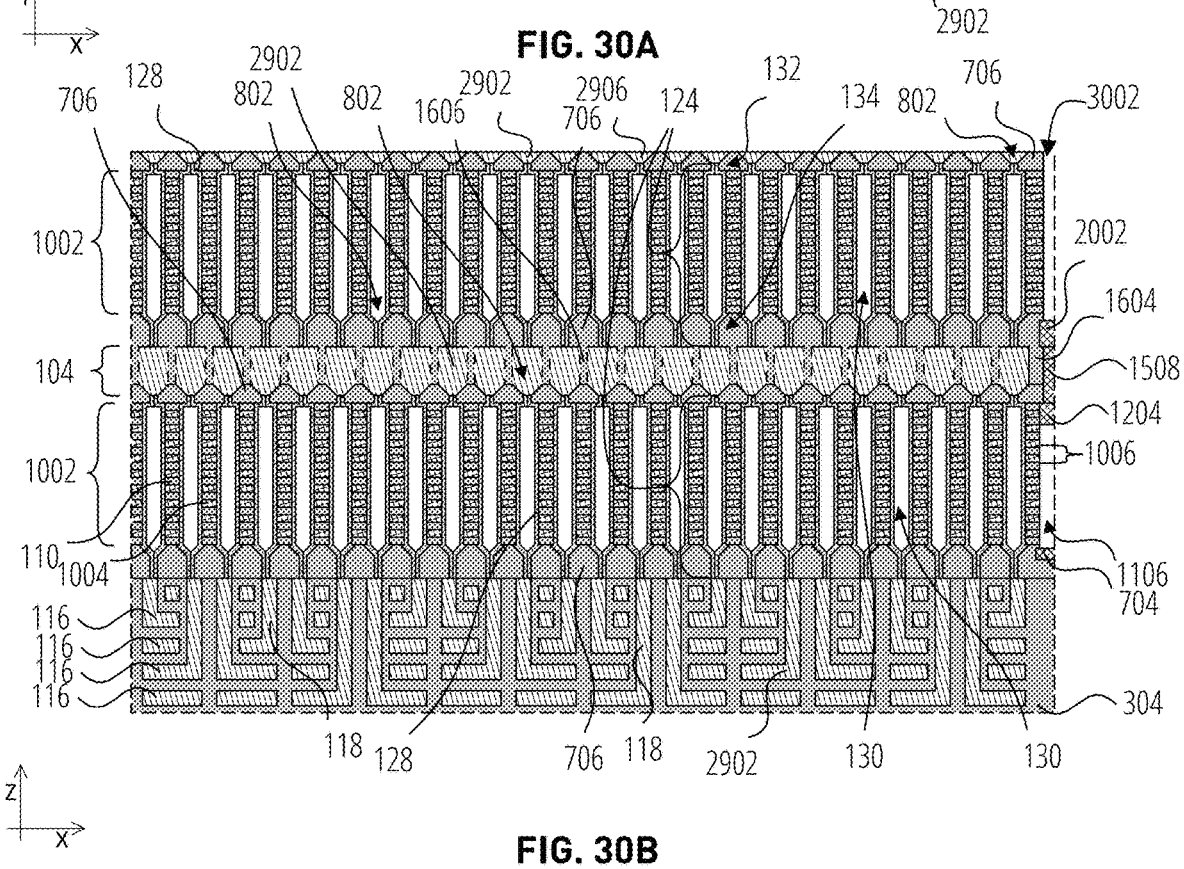
FIG. 30B is a cross-sectional, elevational, schematic illustration taken along section line B-B of FIG. 30A.
Figure 30C:
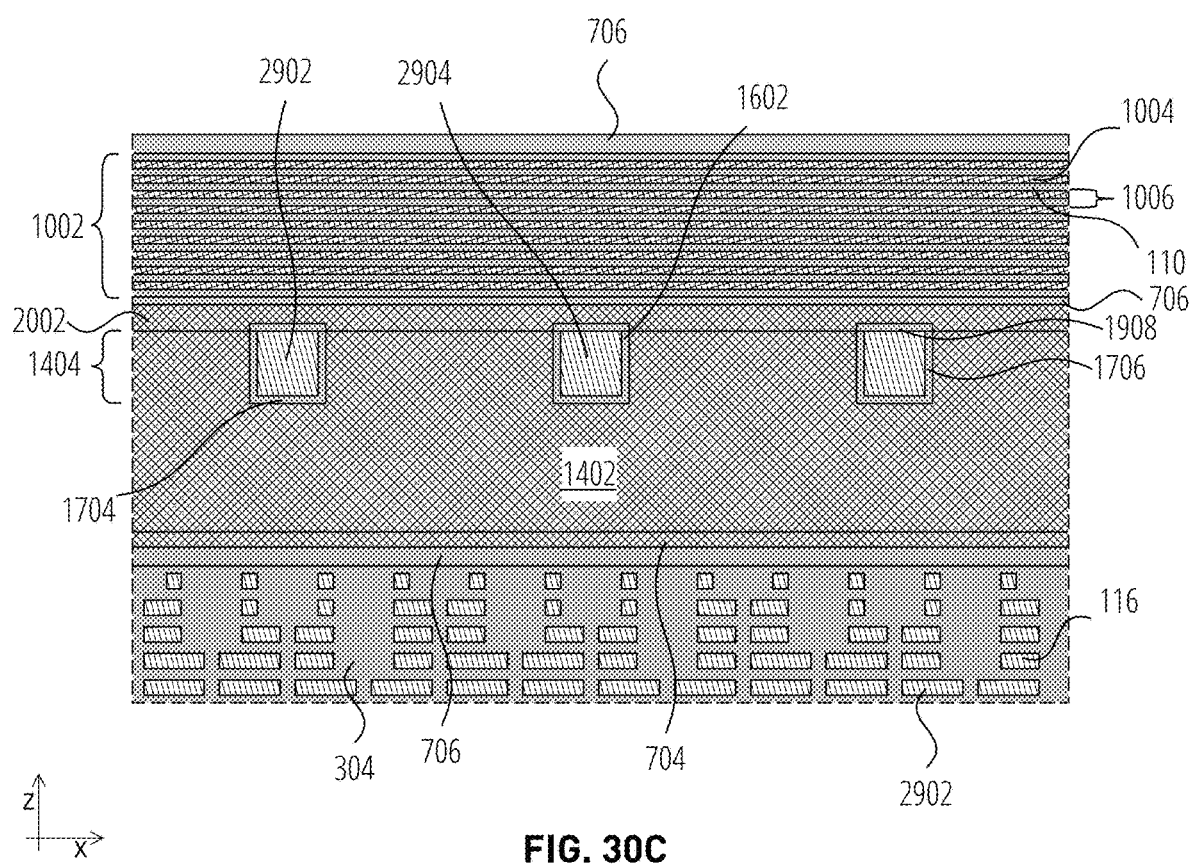
FIG. 30C is a cross-sectional, elevational, schematic illustration taken along section line C-C of FIG. 30A.

With reference to FIG. 30A, FIG. 30B, and FIG. 30C, upper contact openings 3002 may be formed (e.g., etched), in an area laterally adjacent the block portions 708. The upper contact openings 3002 may be formed through the dielectric material 706 atop the upper stack structure 1002 as well as through the upper stack structure 1002 to the sacrificial etch stop material 2002, as most clearly illustrated in FIG. 30B.

Figures 31A, 31B:
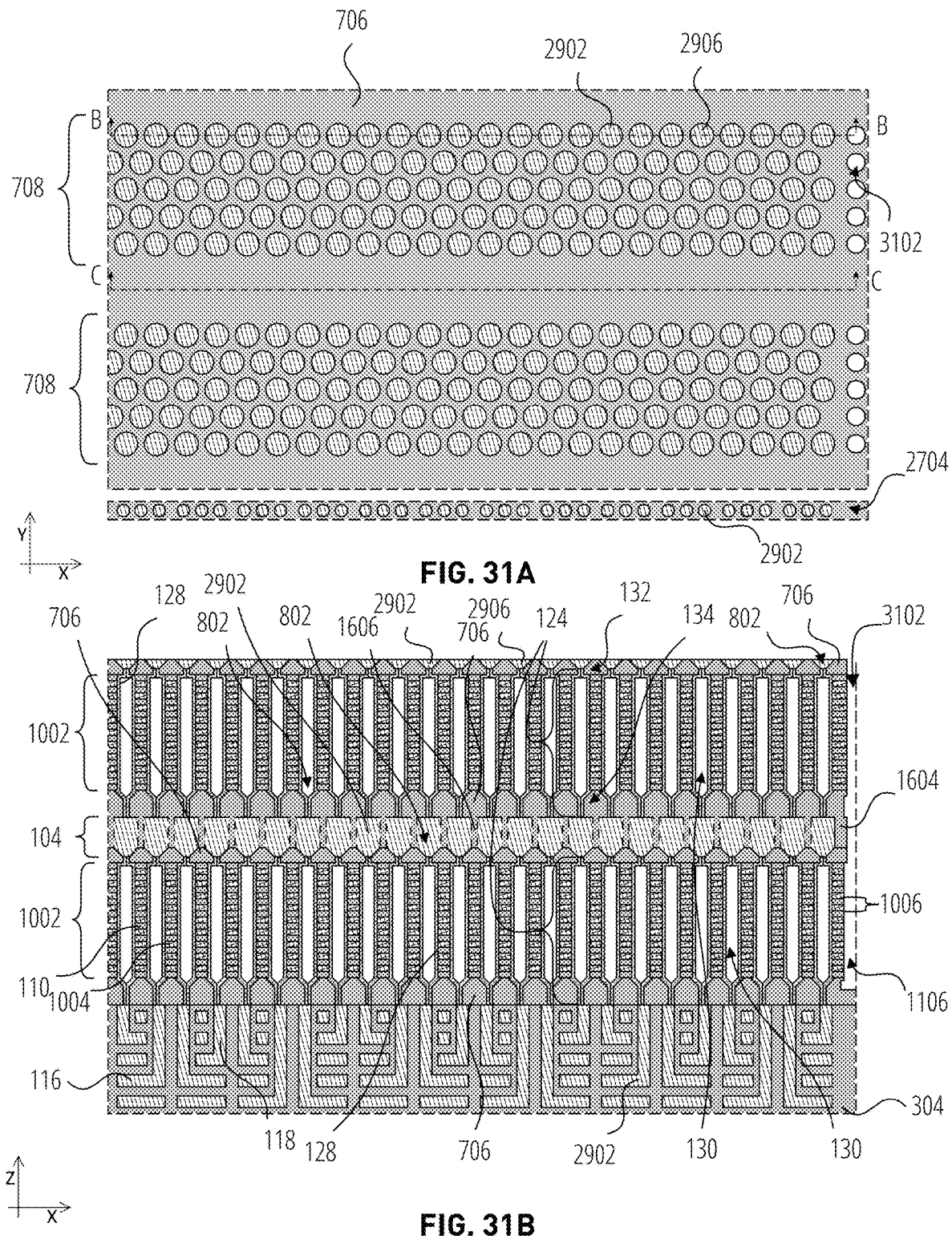
FIG. 31A is a top plan, schematic illustration of the microelectronic device structure during a stage of processing following that of FIG. 30A through FIG. 30C.
FIG. 31B is a cross-sectional, elevational, schematic illustration taken along section line B-B of FIG. 31A.
Figure 31C:
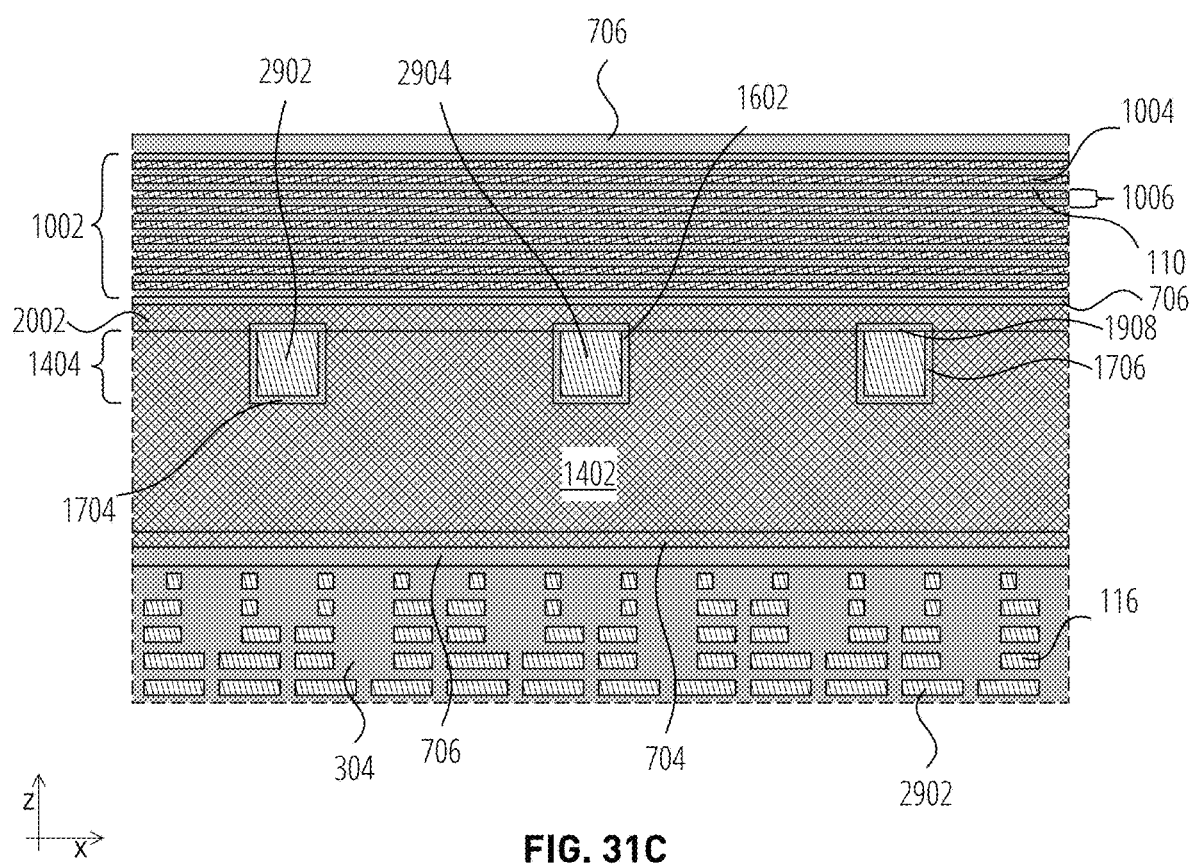
FIG. 31C is a cross-sectional, elevational, schematic illustration taken along section line C-C of FIG. 31A.

The upper contact openings 3002 may then be expanded downward by removing (e.g., etching)—at least in the footprint area of the contact openings 1106—the sacrificial etch stop material 2002, the sacrificial contact structure 1508, the contact plugs 1204, and the sacrificial etch stop material 704. These materials and structures may be removed by an etchant selective for, e.g., metal relative to the oxides and nitrides of the stack structures 1002 and the dielectric materials 706. With reference to FIG. 31A, FIG. 31B, and FIG. 31C, the selective removal of the sacrificial materials and structures forms extended contact openings 3102 extending from an upper surface of the structure down through the lower stack structure 1002.

In some embodiments, the duration of the selective removal of the sacrificial materials may be tailored to inhibit full removal of, e.g., the sacrificial etch stop material 704 so that at least a substantial portion of the sacrificial etch stop material 704 remains below the lower stack structure 1002, as illustrated in FIG. 31C.

Figure 32A:
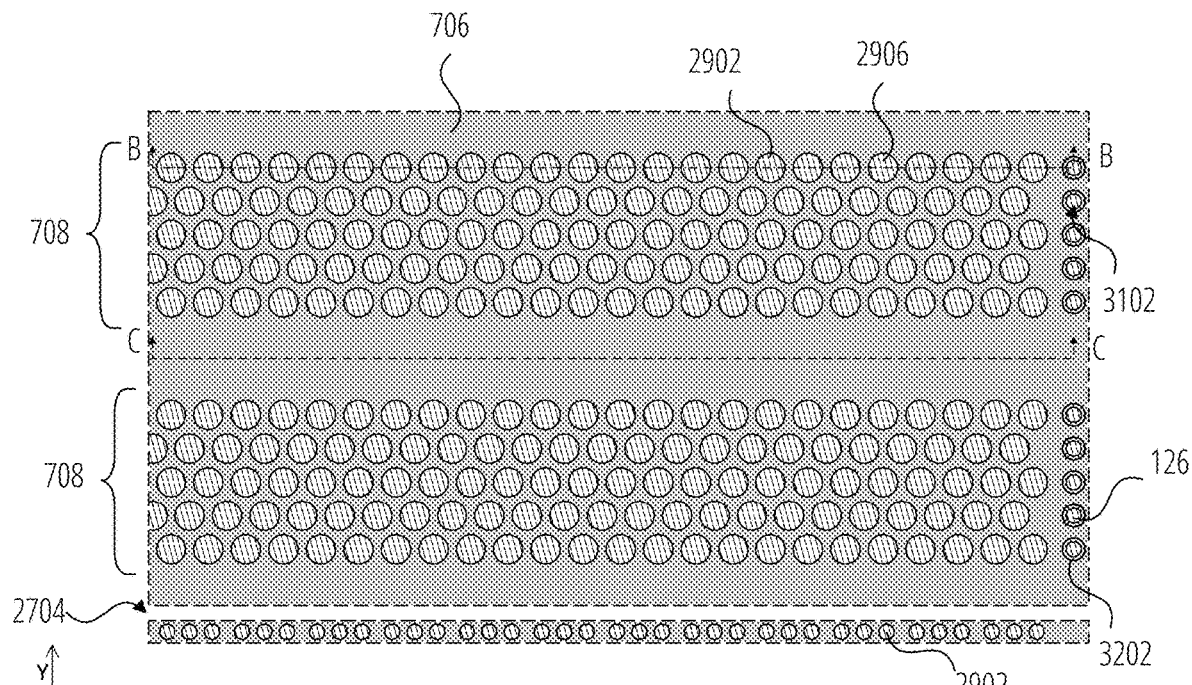
FIG. 32A is a top plan, schematic illustration of the microelectronic device structure during a stage of processing following that of FIG. 31A through FIG. 31C.
Figure 32B:
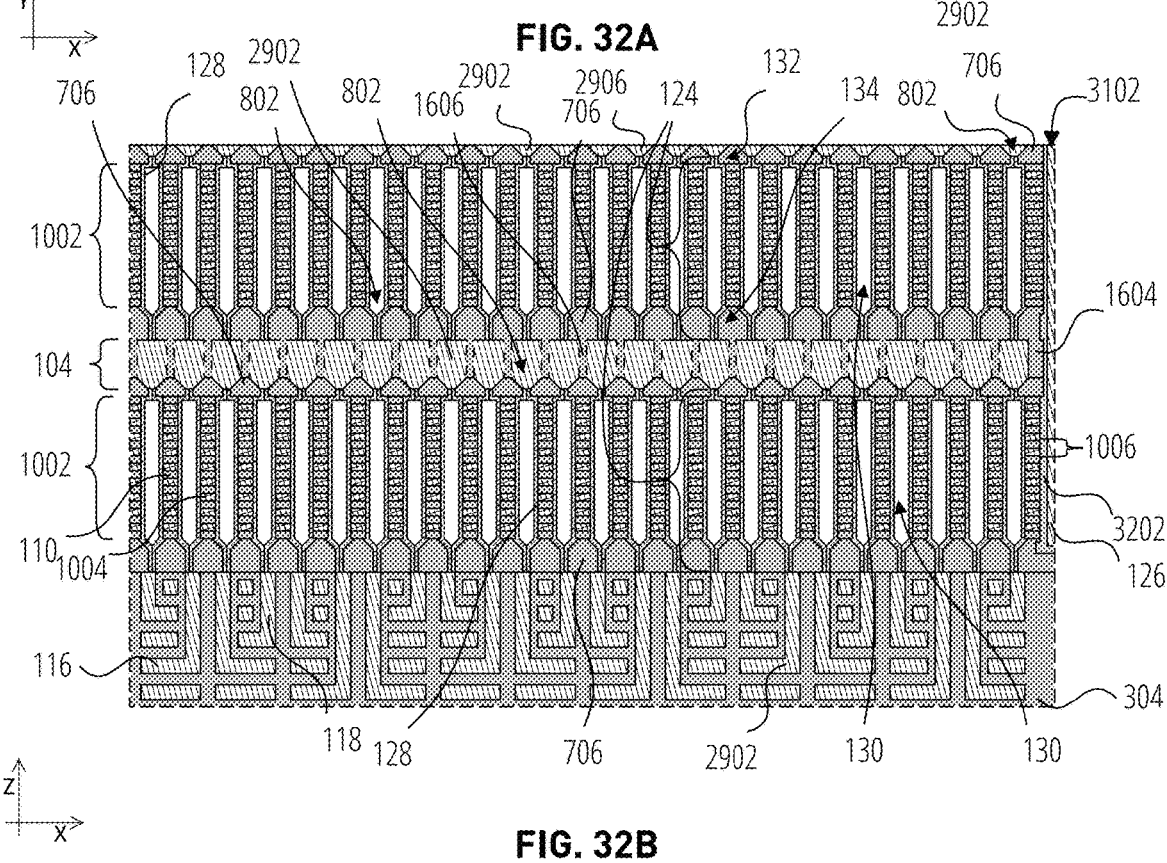
FIG. 32B is a cross-sectional, elevational, schematic illustration taken along section line B-B of FIG. 32A.
Figure 32C:
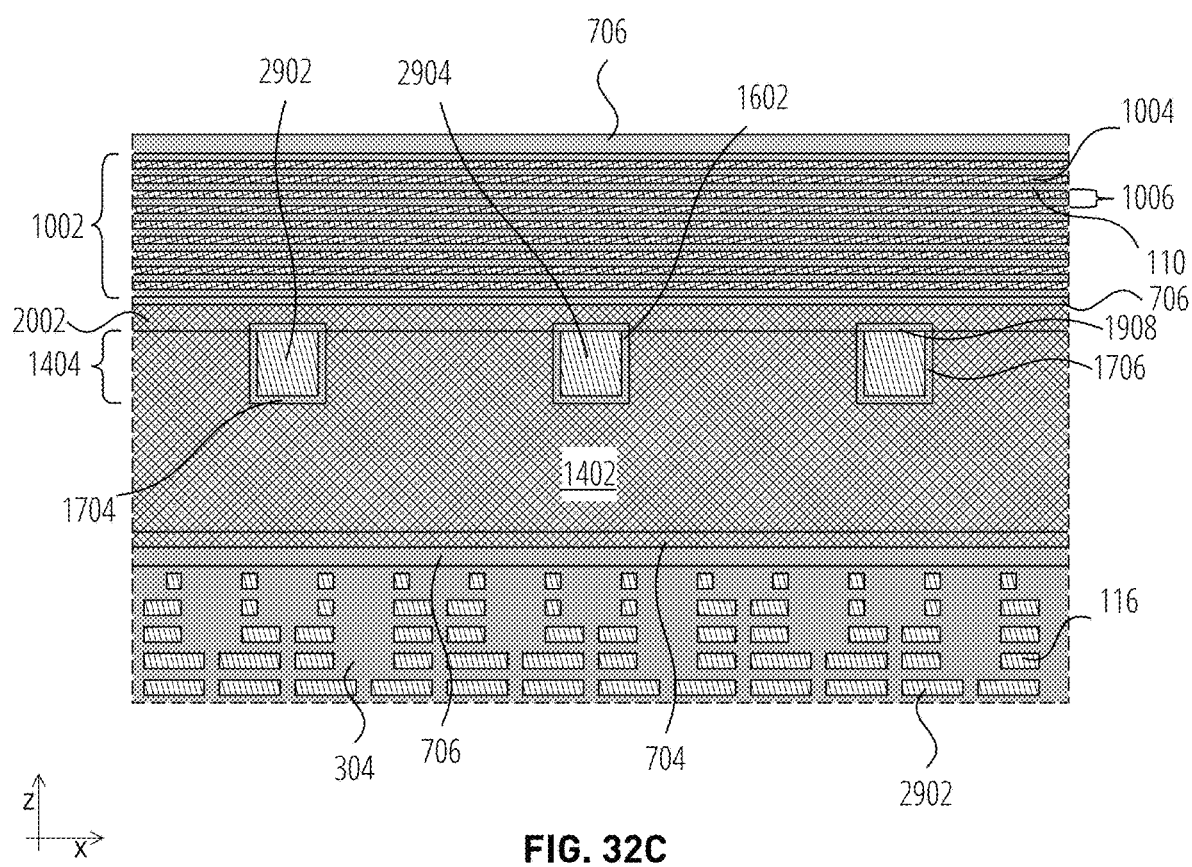
FIG. 32C is a cross-sectional, elevational, schematic illustration taken along section line C-C of FIG. 32A.

With reference to FIG. 32A, FIG. 32B, and FIG. 32C, the contacts 126 may be formed in the extended contact openings 3102. In some embodiments, a dielectric liner 3202 is formed (e.g., conformally deposited) in the extended contact openings 3102, bottom openings (not visible in, e.g., FIG. 32B) are formed (e.g., "punched") through the dielectric liner 3202, before one or more conductive material(s) are formed to fill the extended contact openings 3102 and form the contacts 126. The contacts 126 physically contact other conductive features that are not included in the figures.

Figures 33A, 33B:
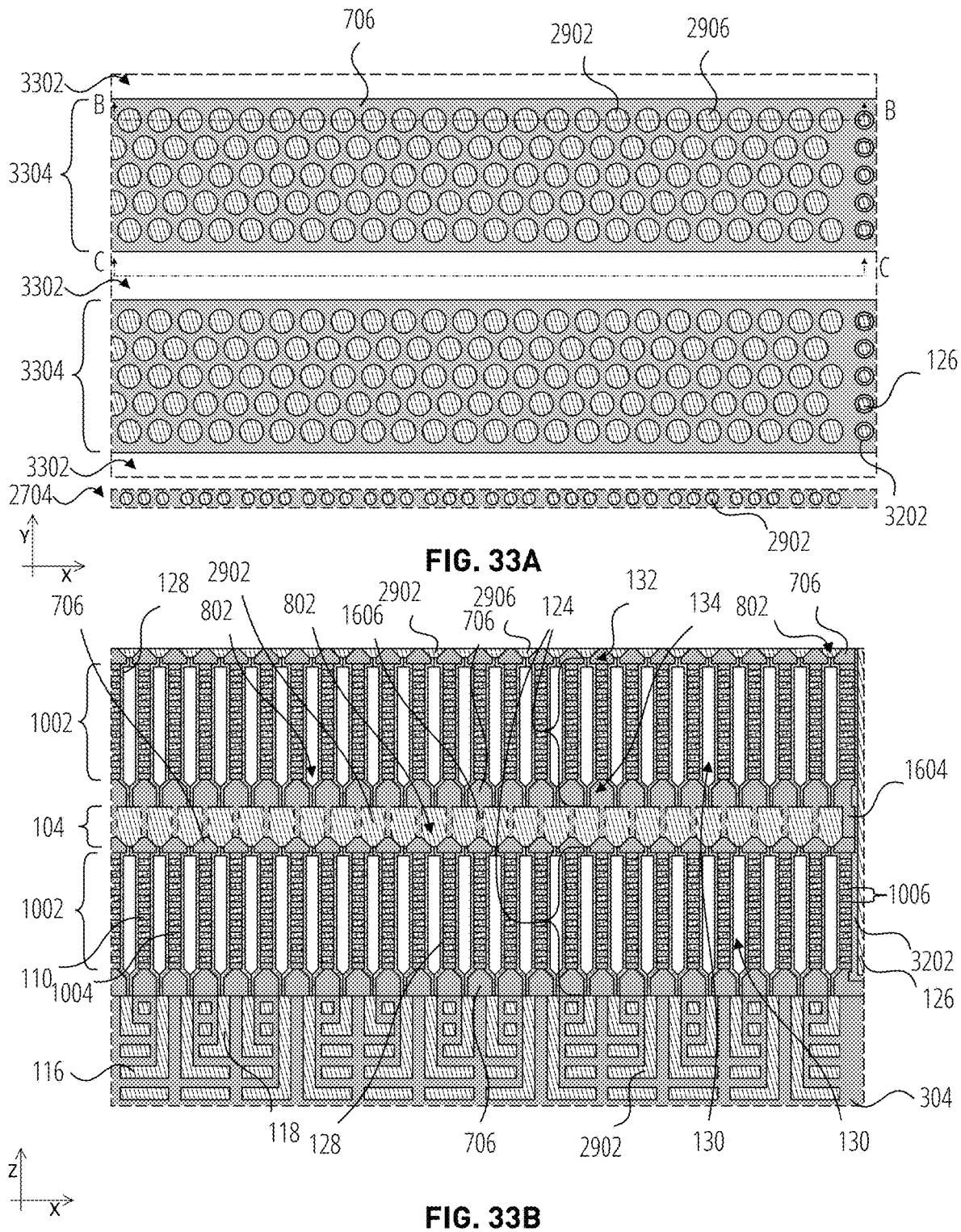
FIG. 33A is a top plan, schematic illustration of the microelectronic device structure during a stage of processing following that of FIG. 32A through FIG. 32C.
FIG. 33B is a cross-sectional, elevational, schematic illustration taken along section line B-B of FIG. 33A.
Figure 33C:
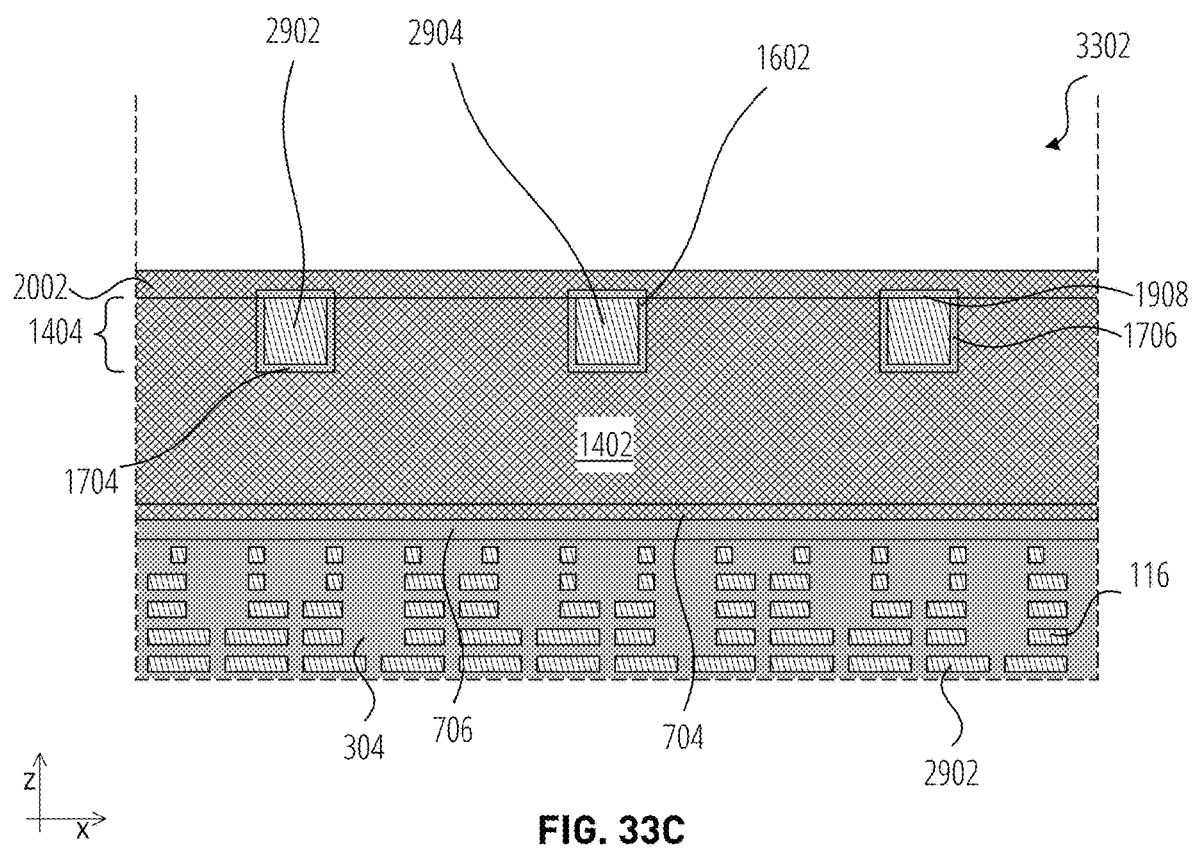
FIG. 33C is a cross-sectional, elevational, schematic illustration taken along section line C-C of FIG. 33A.

With reference to FIG. 33A, FIG. 33B, and FIG. 33C, upper slits 3302 are formed between what was the block portions 708 (FIG. 32A) to form pillar array blocks 3304 that each include a respective one of the upper decks 108. The upper slits 3302 may be formed by etching through the dielectric material 706 above the stack structure 1002 (FIG. 32C) as well as through the materials of the stack structure 1002 to the sacrificial etch stop material 2002, as illustrated in FIG. 33C. The upper slits 3302 may be formed by an etching process that is selective for oxide and nitride materials (e.g., of the dielectric material 706 and the stack structure 1002) relative to metals (e.g., of the sacrificial etch stop material 2002).

The upper slits 3302 may then be expanded, to the dielectric material 706 below the lower stack structure 1002, by selectively removing (e.g., etching) the sacrificial etch stop material 2002 and the source region sacrificial material 1402 relative to oxide and nitride materials, so as not to remove the materials of the upper stack structure 1002, the lower stack structure 1002, the dielectric materials 706, or the insulative material 1602.

Figure 34A:
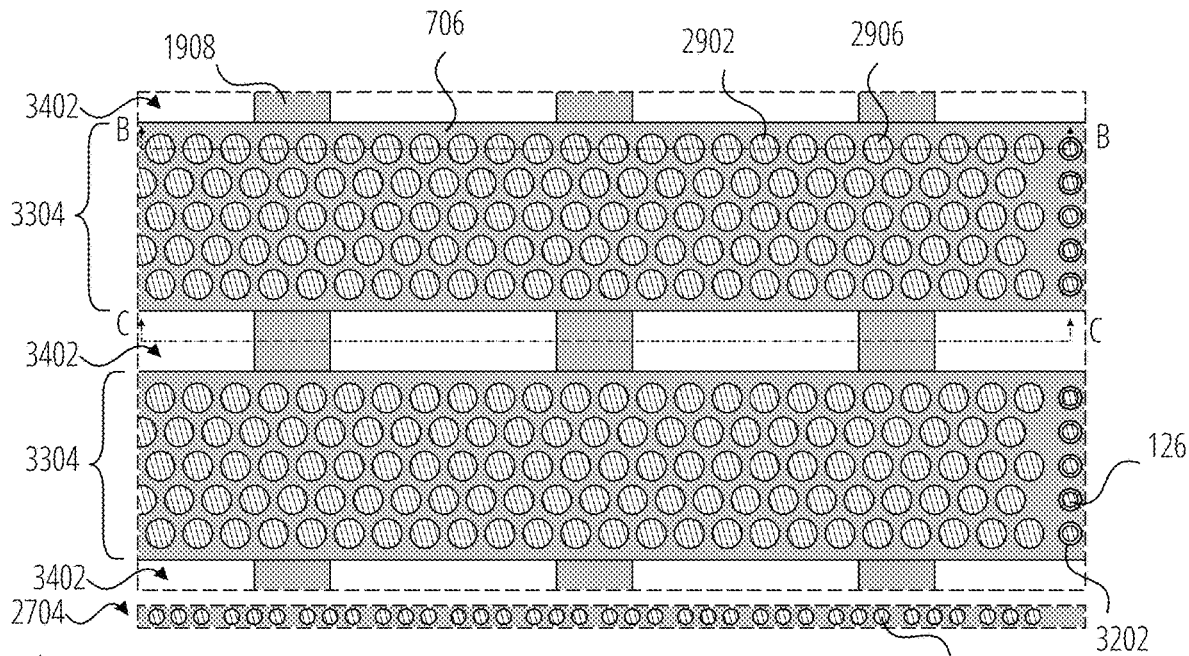
FIG. 34A is a top plan, schematic illustration of the microelectronic device structure during a stage of processing following that of FIG. 33A through FIG. 33C.
Figure 34B:
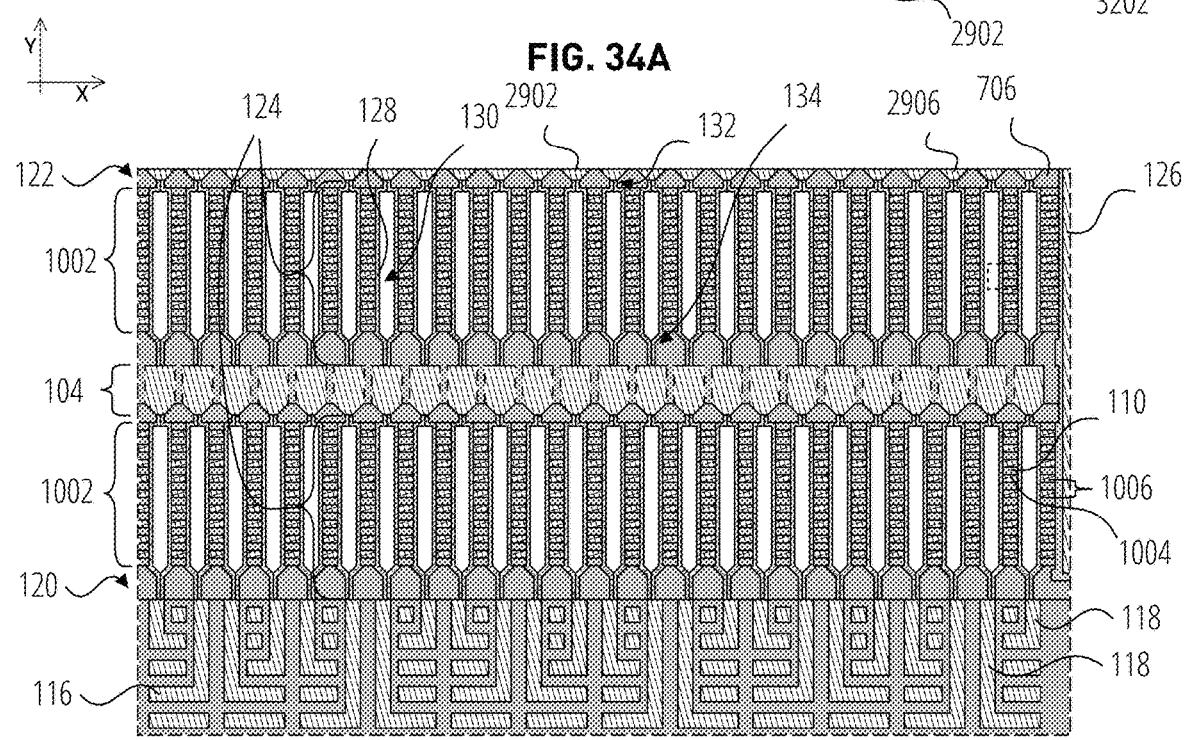
FIG. 34B is a cross-sectional, elevational, schematic illustration taken along section line B-B of FIG. 34A.
Figure 34C:
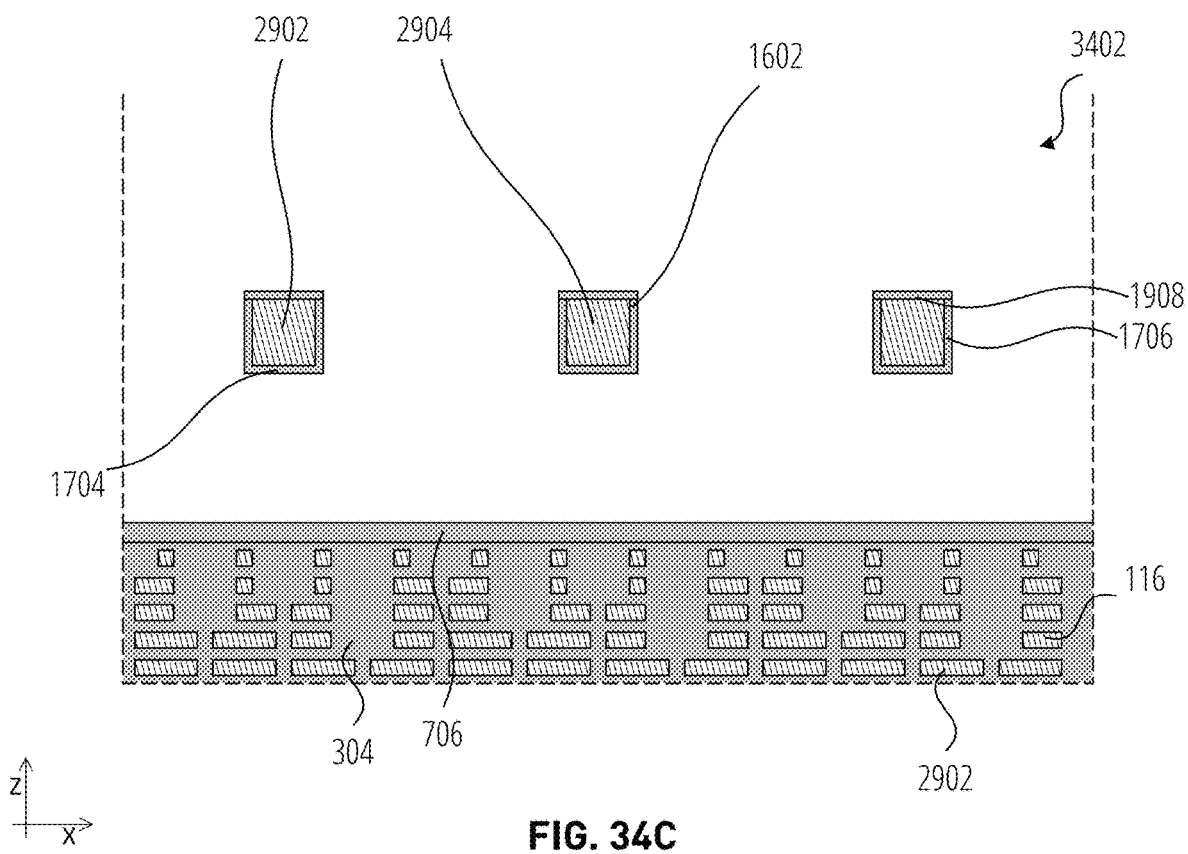
FIG. 34C is a cross-sectional, elevational, schematic illustration taken along section line C-C of FIG. 34A.

Expanding the upper slits 3302 in the aforementioned manner forms extended slits 3402, illustrated in FIG. 34A and FIG. 34C. With reference to FIG. 34A, FIG. 34B, and FIG. 34C—forming the extended slits 3402 does not remove material from the pillar array blocks 3304 (which, in some embodiments, may be covered by a protective insulative material during the selective removal process to form the extended slits 3402). The selective removal also does not remove the insulative materials 1602 of the bridge isolation sidewalls 1706, the bridge isolation bases 1704, and the bridge isolation tops 1908 that surround the conductive bridge structures 2904 between the pillar array blocks 3304. Due to the previous formation of the source isolation regions 1604 (and bridge isolation sidewalls 1706)—as illustrated in FIG. 18A, for example—along the region that became the interdeck source region 104 (FIG. 34B), with the exception of those portions of the sidewalls that connected to the conductive bridge structures 2904, the formation of the extended slits 3402 also does not remove material from the interdeck source regions 104.

Though, as discussed above, the top plan illustrations of this disclosure generally illustrate only those elements that appear in the single plane illustrated, the bridge isolation tops 1908—which are at a lower elevation than the upper surface illustrated in FIG. 34A—are illustrated in FIG. 34A for ease of understanding of the respective relationships between the conductive bridge structures 2904 (covered by the bridge isolation tops 1908) and the interdeck source regions 104 within the pillar array blocks 3304.

Accordingly, forming the upper slits 3302 exposes the materials of the stack structures 1002 at vertical sidewalls that border the extended slits 3402, without exposing the conductive material(s) 2902 of the interdeck source region 104 or the conductive bridge structures 2904.

Figures 35A, 35B:
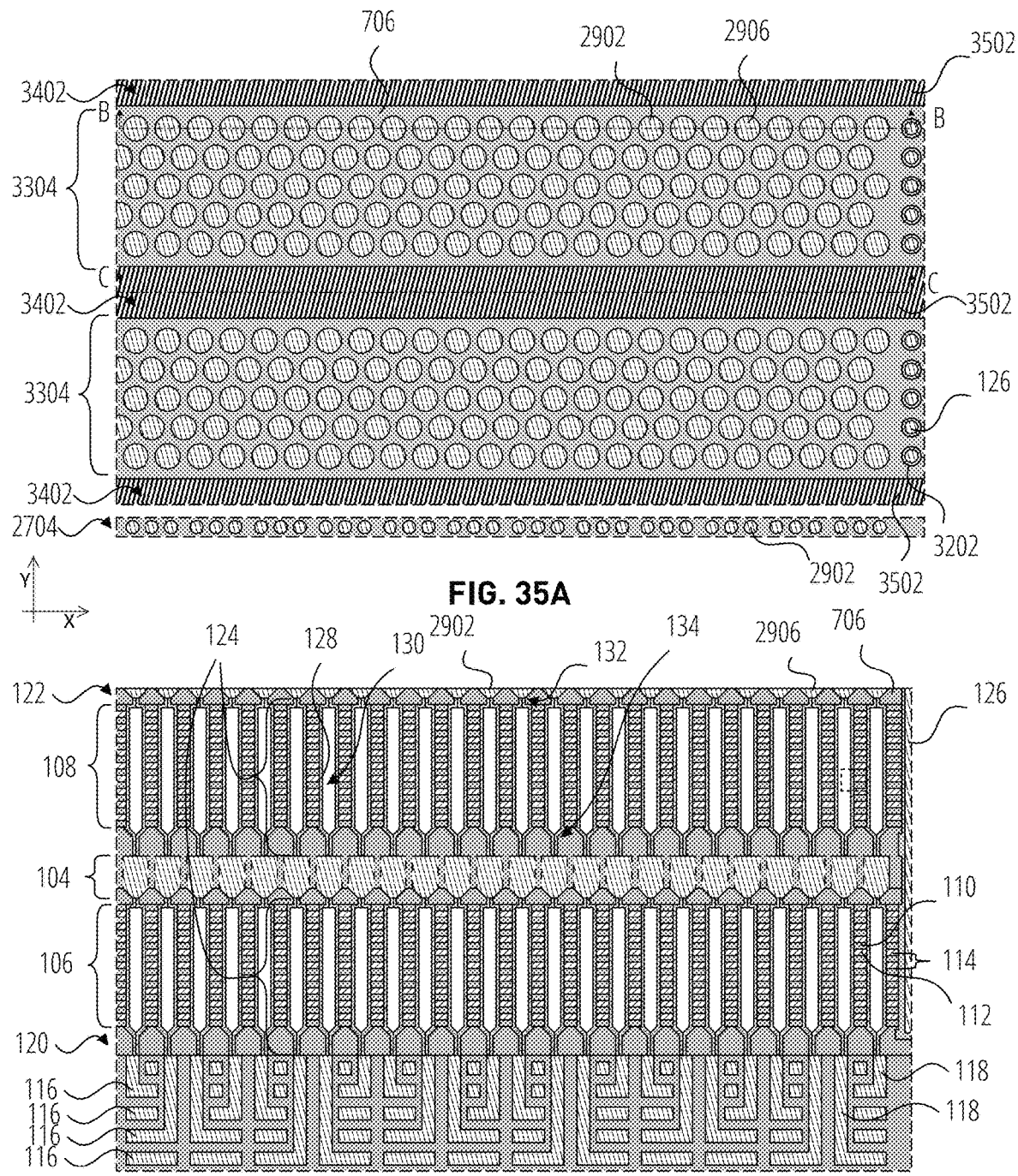
FIG. 35A is a top plan, schematic illustration of the microelectronic device structure during a stage of processing following that of FIG. 34A through FIG. 34C.
FIG. 35B is a cross-sectional, elevational, schematic illustration taken along section line B-B of FIG. 35A.
Figure 35C:
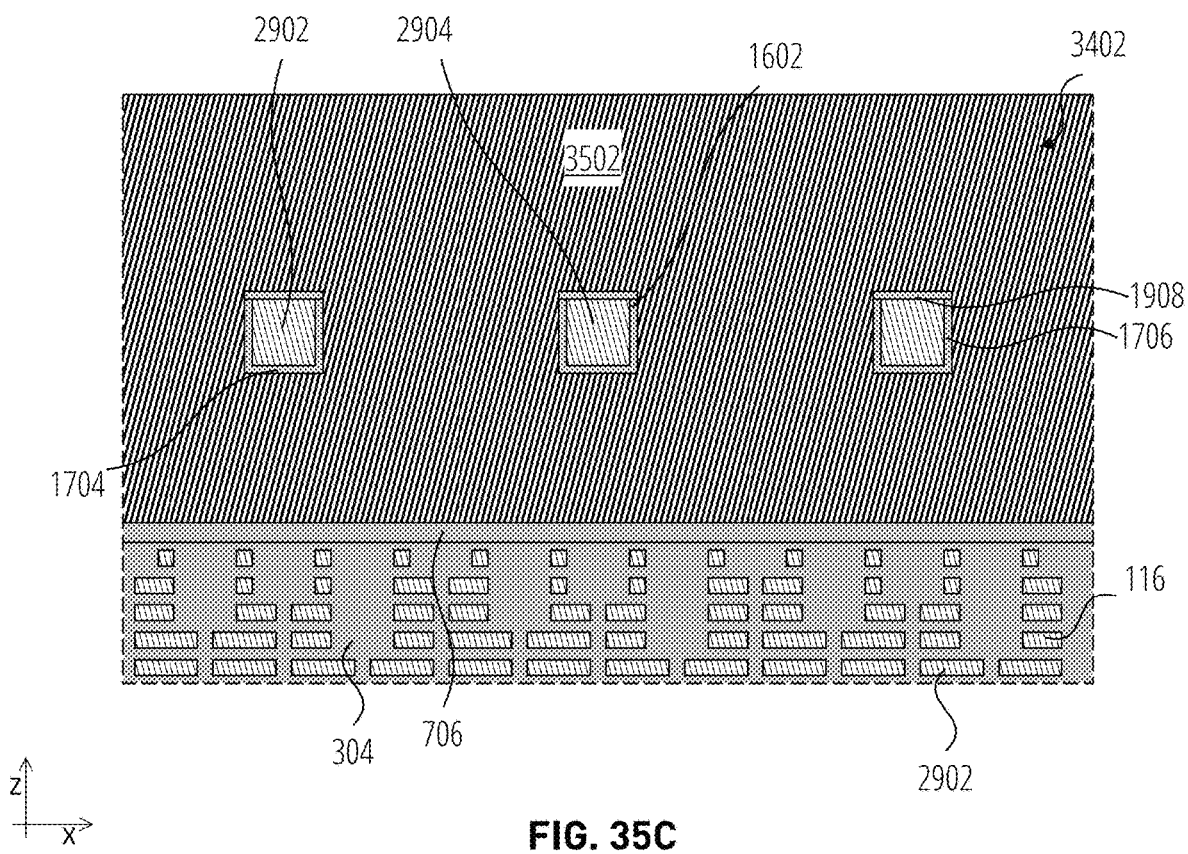

With reference to FIG. 35A, FIG. 35B, and FIG. 35C, while the materials of the stack structures 1002 (FIG. 34B) are exposed, a replacement gate process may be performed to exhume the sacrificial structures 1004 (FIG. 34B) of the stack structures 1002 and to form the conductive material(s) (e.g., the conductive material(s) 204 of FIG. 2A; the conductive liner material 220 and the conductive material 218 of FIG. 2B) in place of the sacrificial structures (FIG. 34B). The replacement gate process forms the conductive structures 112 of the tiers 114 of the lower deck 106 and of the upper deck 108, as illustrated in FIG. 35B.

In some embodiments, rather than substantially removing (e.g., exhuming) the sacrificial structures 1004, the material of the sacrificial structures 1004 is chemically converted into the conductive material(s) 204 (FIG. 2A) to form the conductive structures 112. Nonetheless, the sacrificial structures 1004 are substantially "replaced" with the conductive structures 112.

After replacing the sacrificial structures 1004 with the conductive structures 112 to complete the formation of the lower deck 106 and the upper deck 108, one or more dielectric materials (e.g., any one or more of the aforementioned insulative materials followed by a semiconductive material, such as polysilicon, or a conductive material, such as a metal) may be formed (e.g., deposited) in the extended slits 3402 to form slit structures 3502 that separate the pillar array blocks 3304. As illustrated in FIG. 35C, the conductive bridge structures 2904 extend across the slit structures 3502 with the conductive material(s) 2902 of the conductive bridge structures 2904 isolated from the material of the slit structures 3502 by the bridge isolation sidewalls 1706, the bridge isolation bases 1704, and the bridge isolation tops 1908.

Next, additional bit line contacts 118 and bit lines 116 may be formed above the conductive material(s) top conductive structures 2906 that are in communication with the upper pinch-off portions 132 of cell materials 128 of the upper deck 108. The additional bit line contacts 118 and the bit lines 116 above the top conductive structures 2906 may be configured as stacked bit lines (e.g., vertically inverse of the bit lines 116 and bit line contacts 118 below the stack structures 1002). In other embodiments, the bit line contacts 118 and the bit lines 116 above the top conductive structures 2906 may be otherwise configured, as known in the art. The interdeck source region 104 provides a source region vertically interposed between a pair of decks (e.g., the lower deck 106 and the upper deck 108) with a drain region at the opposing ends of the pillars 124 of the decks (e.g., the lower drain region 120 below the pillars 124 of the lower deck 106 and the upper drain region 122 above the pillars 124 of the upper deck 108). Therefore, the channel material 208 (FIG. 2A, FIG. 2B) of the cell materials 128 facilitate channel regions that are about half the height between the lower drain region 120 and the upper drain region 122 such that the electrical resistance exhibited by the channel material 208 may enable about twice as many conductive structures 112 and about twice as many memory cells 202 (FIG. 2A, FIG. 2B) compared to a structure with the same channel material 208 defining a channel region between a source region and drain region above and below, respectively, a dual-deck structure.

Accordingly, disclosed is a method of forming a microelectronic device. The method comprises forming a lower stack structure comprising a vertically alternating sequence of insulative structures and sacrificial structures arranged in tiers. A lower array of pillar openings is formed with the pillar openings extending through the lower stack structure. Above the lower stack structure and in at least upper portions of the pillar openings of the lower array, at least one sacrificial material is formed. Above the at least one sacrificial material, an upper stack structure is formed. The upper stack structure comprises an additional vertically alternating sequence of additional insulative structures and additional sacrificial structures arranged in tiers. An upper array of pillar openings is formed with the pillar openings extending through the upper stack structure. The at least one sacrificial material is removed to form extended openings. The extended openings comprise the pillar openings of the upper array, the pillar openings of the lower array, and a cavity formed by removing the at least one sacrificial material. Cell material is conformally formed in the extended openings. The cell material is removed from the cavity, leaving the cell material in the pillar openings of the upper array, to form an upper array of pillars, and leaving the cell material in the pillar openings of the lower array to form a lower array of pillars. At least one conductive material is formed in the cavity to form an interdeck source region vertically interposed between the upper array of pillars and the lower array of pillars.

Moreover, disclosed is a microelectronic device comprising at least two blocks. Each of the blocks comprises a source region, a lower pillar array, an upper pillar array, a lower drain region, and an upper drain region. The source region is vertically interposed between a lower stack structure and an upper stack structure. The lower stack structure and the upper stack structure each comprise insulative structures vertically alternating with conductive structures. The lower pillar array extends through the lower stack structure. The upper pillar array extends through the upper stack structure. The lower drain region is below the lower pillar array, and the upper drain region is above the upper pillar array. A slit structure is horizontally interposed between neighboring blocks of the at least two blocks. Conductive bridge structures span the slit structure, from the source region of one of the neighboring blocks to the source region of another of the neighboring blocks.

Figure 36:
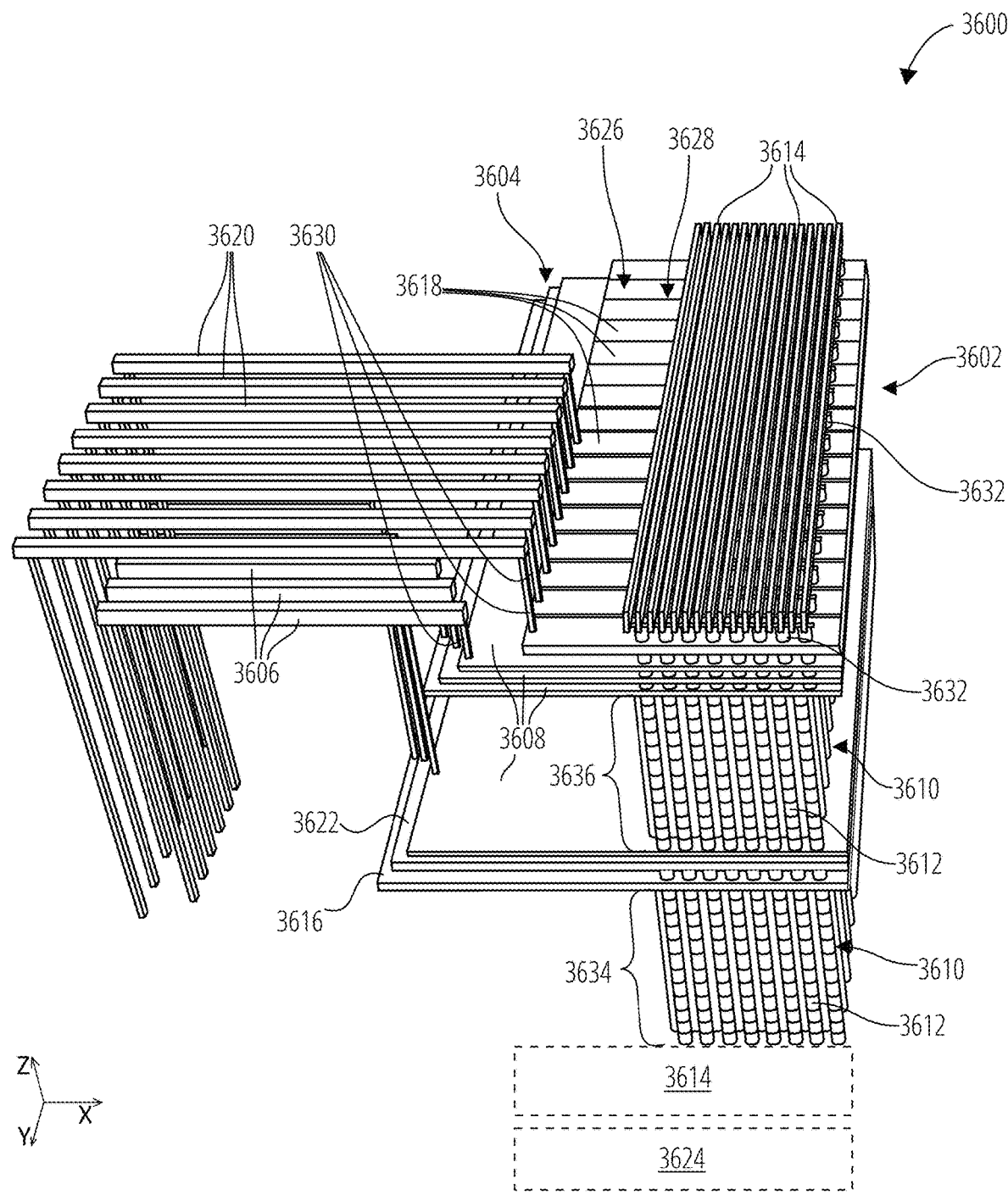
FIG. 36 is a partial, cutaway, perspective, schematic illustration of a microelectronic device, in accordance with embodiments of the disclosure.

With reference to FIG. 36, illustrated is a partial cutaway, perspective, schematic illustration of a portion of a microelectronic device 3600 (e.g., a memory device, such as a 3D NAND Flash memory device) including a microelectronic device structure 3602. The microelectronic device structure 3602 may be substantially similar to, e.g., the microelectronic device structure 100 of FIG. 1.

As illustrated in FIG. 36, the microelectronic device structure 3602 may include a staircase structure 3604 defining contact regions for connecting access lines 3606 to conductive tiers 3608 (e.g., conductive layers, conductive plates, such as the conductive structures 112 (FIG. 1) of the lower deck 106 and the upper deck 108 of FIG. 1). The microelectronic device structure 3602 may include pillars 124 (FIG. 1) forming strings 3610 of memory cells 3612, such as strings of one or more of the memory cells 202 previously described with reference to FIG. 2A and FIG. 2B. The pillars 124 forming the strings 3610 of memory cells 3612 may extend at least somewhat vertically (e.g., in the Z-direction) and orthogonally relative to the conductive tiers 3608, relative to data lines 3614 (e.g., the bit lines above the upper deck 108 (FIG. 1)), relative to a source tier 3616 (e.g., the interdeck source region 104 (FIG. 1)), relative to access lines 3606 (e.g., which may connect with the contacts 126 of FIG. 1), relative to first select gates 3618 (e.g., upper select gates, such as drain select gates (SGDs) in the upper deck 108), relative to select lines 3620, and/or relative to a second select gate 3622 (e.g., a lower select gate, a source select gate (SGS) within the upper deck 108 (FIG. 1)).

The pillars 124 (FIG. 1) forming the strings 3610 below the source tier 3616 (e.g., the interdeck source region 104 (FIG. 1)) provide a lower deck 3634 (e.g., the lower deck 106). The pillars 124 (FIG. 1) forming the strings 3610 above the source tier 3616 provide an upper deck (e.g., the upper deck 108 (FIG. 1)). The boxed area—for data lines 3614—illustrated below the lower deck 3634 of FIG. 36 is an area representing the bit lines 116 and bit line contacts 118 below the lower deck 106 of FIG. 1. Understandably, though not illustrated for ease of illustration, the lower deck 3634 would also include additional structures, such as the conductive tiers 3608.

The first select gates 3618 may be horizontally divided (e.g., in the Y-axis direction) into multiple blocks 3626 (e.g., each of the blocks 3626 comprising one of the pillar array blocks 3304 of FIG. 35A) spaced apart (e.g., in the Y-axis direction) from one another by slits 3628 (e.g., the extended slits 3402 of FIG. 34A and FIG. 34C, filled to form the slit structures 3502 of FIG. 35A and FIG. 35C) and including the conductive bridge structures 2904 (FIG. 35C) extending across the slits 3628 from one source tier 3616 to a neighboring source tier 3616.

Vertical conductive contacts 3630 (e.g., the contacts 126 of FIG. 1) may electrically couple components to each other, as illustrated. For example, the select lines 3620 may be electrically coupled to the first select gates 3618, and the access lines 3606 may be electrically coupled to the conductive tiers 3608.

The microelectronic device 3600 may also include a control unit 3624 positioned under the memory array (e.g., under the boxed area for the data lines 3614 (e.g., for the bit lines 116 below the lower deck 106 (FIG. 1), not illustrated in FIG. 36, as discussed above)). The control unit 3624 may include control logic devices configured to control various operations of other features (e.g., the memory strings 3610, the memory cells 3612) of the microelectronic device 3600. By way of non-limiting example, the control unit 3624 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and/or other chip/deck control circuitry. The control unit 3624 may be electrically coupled to the data lines 3614 (e.g., bit lines above the upper deck 3636 (e.g., the upper deck 108), the bit lines 116 below the lower deck 3634 (e.g., the lower deck 106), which lower bit lines 116 may be included in that which is represented by the boxed area for data lines 3614), the source tier 3616 (e.g., the interdeck source region 104 (FIG. 1)), the access lines 3606, the first select gates 3618, and/or the second select gates 3622, for example. In some embodiments, the control unit 3624 includes CMOS (complementary metal-oxide-semiconductor) circuitry. In such embodiments, the control unit 3624 may be characterized as having a "CMOS under Array" ("CuA") configuration.

The first select gates 3618 may be included in an upper elevation of the upper deck 108 (FIG. 1) and may extend horizontally in a first direction (e.g., the X-axis direction). The first select gate 3618 of the upper deck 108 (FIG. 1) may be coupled to respective first groups of strings 3610 of memory cells 3612 (in the upper deck 3636 (e.g., the upper deck 108 of FIG. 1)) at a first end (e.g., an upper end) of the strings 3610. Another first select gate 3618 (not illustrated in FIG. 36) may be included in a lower elevation of the lower deck 3634 (e.g., the lower deck 106 of FIG. 1) and may extend horizontally in the first direction (e.g., the X-axis direction). The first select gate 3618 of the lower deck 3634 may be coupled to respective first groups of strings 3610 of memory cells 3612 in the lower deck 3634 at another first end (e.g., the lower end) of the strings 3610.

The second select gate 3622 may be included in a lower elevation of the upper deck 3636 and may be formed in a substantially planar configuration. In the upper deck 3636, the second select gate 3622 may be coupled to the strings 3610 of memory cells 3612 of the upper deck 3636 at a lower end of the strings 3610 of the memory cells 3612. Another second select gate 3622 (not illustrated in FIG. 36) may be included in an upper elevation of the lower deck 3634 and may also be formed in a substantially planar configuration. In the lower deck 3634, the second select gate 3622 may be coupled to the strings 3610 of memory cells 3612 of the lower deck 3634 at an upper end of the strings 3610 of the memory cells 3612.

Above the upper deck 3636 and below the lower deck 3634, the data lines 3614 (e.g., bit lines 116) may extend horizontally in a second direction (e.g., in the Y-axis direction) that is at an angle (e.g., perpendicular) to the first direction in which the first select gates 3618 extend. For ease of illustration, FIG. 36 illustrates only one elevation of the data lines 3614 above the upper deck 3636, but the microelectronic device 3600 may include stacks of the data lines 3614 above the upper deck 3636, as illustrated with the bit lines 116 below the lower deck 106 of FIG. 1. Accordingly, the data lines 3614 below the lower deck 3634 may be arranged in a stacked configuration with the data lines 3614 at lower elevations laterally wider than the data lines 3614 at upper elevations, and with the conductive structures 3632 extending to the various elevations of the data lines 3614. Likewise, the data lines 3614 above the upper deck 3636 may be arranged in a stacked configuration, but with the data lines 3614 at upper elevations laterally wider than the data lines 3614 at lower elevations, and with the conductive structures 3632 extending to the various elevations of the data lines 3614. In other embodiments, the data lines 3614 above the upper deck 3636 may be otherwise arranged than the stacked structure, such as by data line arrangements known in the art.

Above the upper deck 3636, the data lines 3614 may be coupled to respective groups of the strings 3610 of memory cells 3612 of the upper deck 3636 at an upper end of the strings 3610. Below the lower deck 3634, additional data lines 3614 may be coupled to respective groups of the strings 3610 of memory cells 3612 of the lower deck 3634 at a lower end of the strings 3610. Within each of the upper deck 3636 and the lower deck 3634, a first group of strings 3610 coupled to a respective first select gate 3618 may share a particular string 3610 with a second group of strings 3610 coupled to a respective data line 3614. Thus, a particular string 3610 of a particular deck (e.g., the upper deck 3636, the lower deck 3634) may be selected at an intersection of a particular first select gate 3618 and a particular data line 3614. Accordingly, the first select gates 3618 may be used for selecting memory cells 3612 of the strings 3610 of memory cells 3612 in a respective one of the decks (e.g., the upper deck 3636, the lower deck 3634).

The conductive tiers 3608 (e.g., word line plates, such as the conductive structures 112 (FIG. 1)) may extend in respective horizontal planes. The conductive tiers 3608 may be stacked vertically, such that each conductive tier 3608 is coupled to all of the strings 3610 of memory cells 3612 of one of the decks (e.g., the upper deck 3636, the lower deck 3634), and the strings 3610 of the memory cells 3612 extend vertically through the stack (e.g., the upper deck 3636, the lower deck 3634) of conductive tiers 3608. The conductive tiers 3608 may be coupled to, or may form control gates of, the memory cells 3612 to which the conductive tiers 3608 are coupled. Each conductive tier 3608 may be coupled to one memory cell 3612 of a particular string 3610 of memory cells 3612.

Within each of the decks (e.g., the upper deck 3636, the lower deck 3634), the first select gates 3618 and the second select gates 3622 may operate to select a particular string 3610 of the memory cells 3612 between a particular data line 3614 and the source tier 3616. Thus, a particular memory cell 3612 may be selected and electrically coupled to a data line 3614 by operation of (e.g., by selecting) the appropriate first select gate 3618, second select gate 3622, and conductive tier 3608 that are coupled to the particular memory cell 3612.

The staircase structure 3604 may be configured to provide electrical connection between the access lines 3606 and the conductive tiers 3608 through the vertical conductive contacts 3630 (e.g., the contacts 126 of FIG. 1). In other words, a particular level of the conductive tiers 3608 may be selected via one of the access lines 3606 that is in electrical communication with a respective one of the conductive contacts 3630 in electrical communication with the particular conductive tier 3608.

The data lines 3614 may be electrically coupled to the strings 3610 of memory cells 3612 through conductive structures 3632 (e.g., bit line contacts 118 of FIG. 1).

Figure 37:
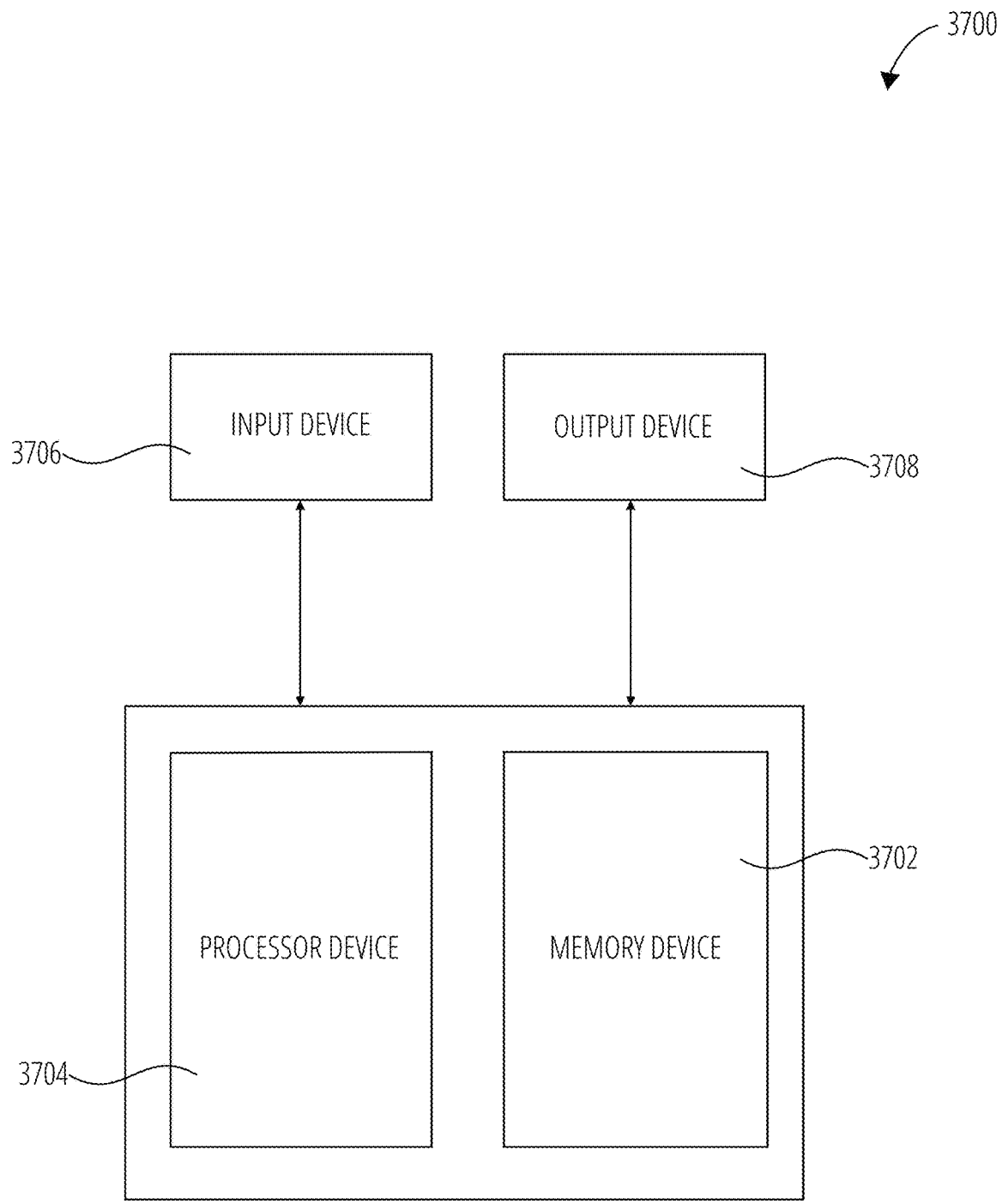
FIG. 37 is a block diagram of an electronic system, in accordance with embodiments of the disclosure.

Microelectronic devices (e.g., the microelectronic device 3600) including microelectronic device structures (e.g., the microelectronic device structure 100 of FIG. 1) may be used in embodiments of electronic systems of the disclosure. For example, FIG. 37 is a block diagram of an electronic system 3700, in accordance with embodiments of the disclosure. The electronic system 3700 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet (e.g., an iPAD® or SURFACE® tablet, an electronic book, a navigation device), etc. The electronic system 3700 includes at least one memory device 3702. The memory device 3702 may include, for example, one or more embodiment(s) of a microelectronic device and/or structure previously described herein (e.g., the microelectronic device 3600 of FIG. 36, and/or the microelectronic device structure 100 of FIG. 1), e.g., with structures formed according to embodiments previously described herein.

The electronic system 3700 may further include at least one electronic signal processor device 3704 (often referred to as a "microprocessor"). The processor device 3704 may, optionally, include an embodiment of a microelectronic device and/or a microelectronic device structure previously described herein (e.g., the microelectronic device 3600 of FIG. 36, and/or the microelectronic device structure 100 of FIG. 1). The electronic system 3700 may further include one or more input devices 3706 for inputting information into the electronic system 3700 by a user, such as, for example, a mouse or other pointing device, a keyboard, a touchpad, a button, or a control panel. The electronic system 3700 may further include one or more output devices 3708 for outputting information (e.g., visual or audio output) to a user such as, for example, a monitor, a display, a printer, an audio output jack, a speaker, etc. In some embodiments, the input device 3706 and the output device 3708 may comprise a single touchscreen device that can be used both to input information into the electronic system 3700 and to output visual information to a user. The input device 3706 and the output device 3708 may communicate electrically with one or more of the memory device 3702 and the electronic signal processor device 3704.

Accordingly, disclosed is an electronic system comprising an input device, an output device, a processor device, and a memory device. The processor device is operably coupled to the input device and to the output device. The memory device is operably coupled to the processor device. The memory device comprises at least one microelectronic device structure. The at least one microelectronic device structure comprises a source region vertically interposed between a pair of stack structures. Each of the stack structures comprises insulative structures vertically interleaved with conductive structures. Pillars extend through one stack structure of the pair of stack structures. The pillars comprise a channel material extending from the source region either to an upper drain region above the pair of stack structures or to a lower drain region below the pair of stack structures.

Figure 38:
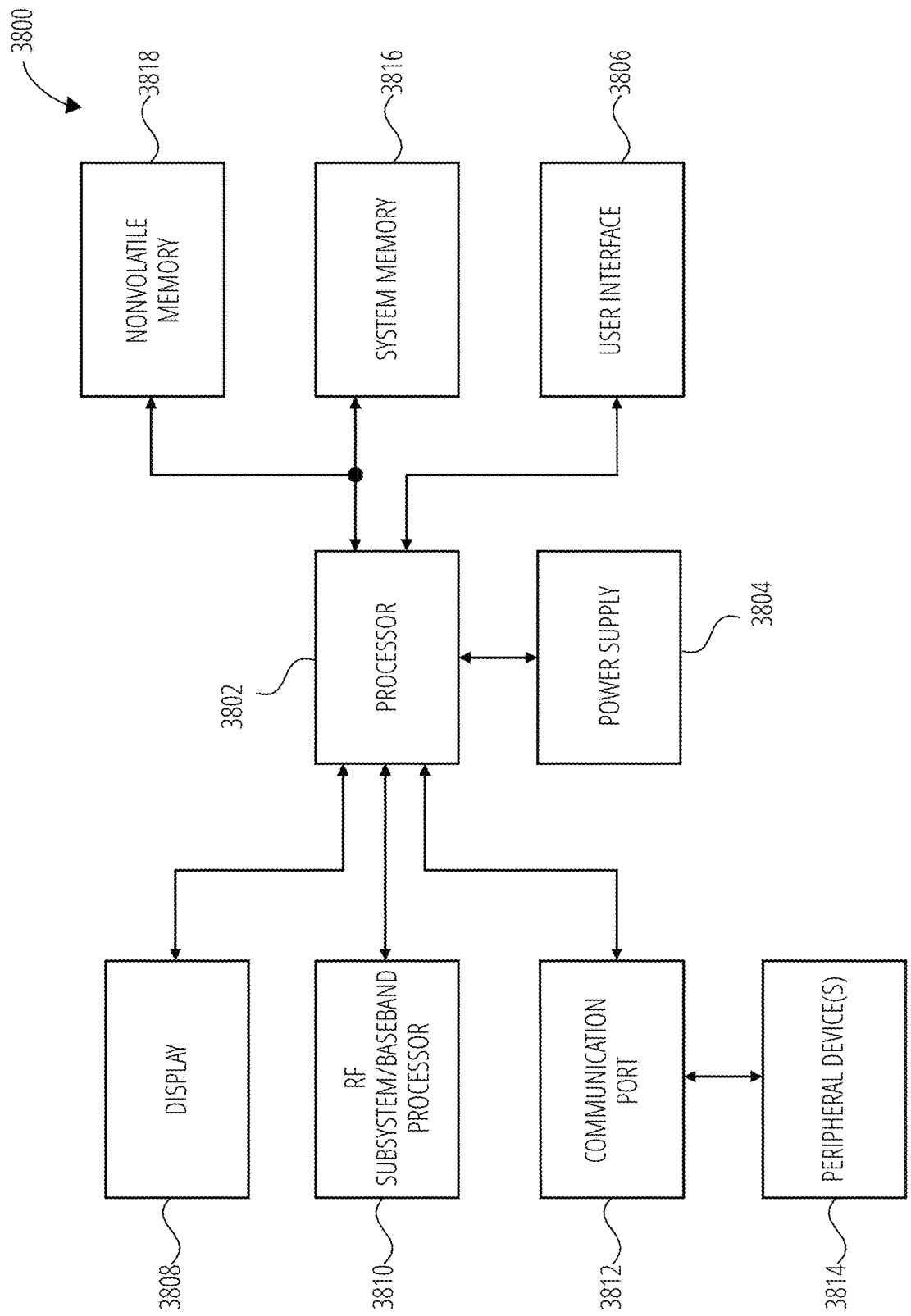
FIG. 38 is a block diagram of a processor-based system, in accordance with embodiments of the disclosure.

With reference to FIG. 38, shown is a block diagram of a processor-based system 3800. The processor-based system 3800 may include various microelectronic devices (e.g., the microelectronic device 3600 of FIG. 36) and microelectronic device structures (e.g., the microelectronic device structure 100 of FIG. 1) manufactured in accordance with embodiments of the present disclosure. The processor-based system 3800 may be any of a variety of types, such as a computer, a pager, a cellular phone, a personal organizer, a control circuit, or another electronic device. The processor-based system 3800 may include one or more processors 3802, such as a microprocessor, to control the processing of system functions and requests in the processor-based system 3800. The processor 3802 and other subcomponents of the processor-based system 3800 may include microelectronic devices (e.g., the microelectronic device 3600 of FIG. 36) and microelectronic device structures (e.g., the microelectronic device structure 100 of FIG. 1) manufactured in accordance with embodiments of the present disclosure.

The processor-based system 3800 may include a power supply 3804 in operable communication with the processor 3802. For example, if the processor-based system 3800 is a portable system, the power supply 3804 may include one or more of a fuel cell, a power scavenging device, permanent batteries, replaceable batteries, and/or rechargeable batteries. The power supply 3804 may also include an AC adapter; therefore, the processor-based system 3800 may be plugged into a wall outlet, for example. The power supply 3804 may also include a DC adapter such that the processor-based system 3800 may be plugged into a vehicle cigarette lighter or a vehicle power port, for example.

Various other devices may be coupled to the processor 3802 depending on the functions that the processor-based system 3800 performs. For example, a user interface 3806 may be coupled to the processor 3802. The user interface 3806 may include one or more input devices, such as buttons, switches, a keyboard, a light pen, a mouse, a digitizer and stylus, a touch screen, a voice recognition system, a microphone, or a combination thereof. A display 3808 may also be coupled to the processor 3802. The display 3808 may include an LCD display, an SED display, a CRT display, a DLP display, a plasma display, an OLED display, an LED display, a three-dimensional projection, an audio display, or a combination thereof. Furthermore, an RF subsystem/baseband processor 3810 may also be coupled to the processor 3802. The RF subsystem/baseband processor 3810 may include an antenna that is coupled to an RF receiver and to an RF transmitter. A communication port 3812, or more than one communication port 3812, may also be coupled to the processor 3802. The communication port 3812 may be adapted to be coupled to one or more peripheral devices 3814 (e.g., a modem, a printer, a computer, a scanner, a camera) and/or to a network (e.g., a local area network (LAN), a remote area network, an intranet, or the Internet).

The processor 3802 may control the processor-based system 3800 by implementing software programs stored in the memory (e.g., system memory 3816). The software programs may include an operating system, database software, drafting software, word processing software, media editing software, and/or media-playing software, for example. The memory (e.g., the system memory 3816) is operably coupled to the processor 3802 to store and facilitate execution of various programs. For example, the processor 3802 may be coupled to system memory 3816, which may include one or more of spin torque transfer magnetic random access memory (STT-MRAM), magnetic random access memory (MRAM), dynamic random access memory (DRAM), static random access memory (SRAM), racetrack memory, and/or other known memory types. The system memory 3816 may include volatile memory, nonvolatile memory, or a combination thereof. The system memory 3816 is typically large so it can store dynamically loaded applications and data. In some embodiments, the system memory 3816 may include semiconductor devices (e.g., the microelectronic device 3600 of FIG. 36) and structures (e.g., the microelectronic device structure 100 of FIG. 1) described above, or a combination thereof.

The processor 3802 may also be coupled to nonvolatile memory 3818, which is not to suggest that system memory 3816 is necessarily volatile. The nonvolatile memory 3818 may include one or more of STT-MRAM, MRAM, read-only memory (ROM) (e.g., EPROM, resistive read-only memory (RROM)), and Flash memory to be used in conjunction with the system memory 3816. The size of the nonvolatile memory 3818 is typically selected to be just large enough to store any necessary operating system, application programs, and fixed data. Additionally, the nonvolatile memory 3818 may include a high-capacity memory (e.g., disk drive memory, such as a hybrid-drive including resistive memory or other types of nonvolatile solid-state memory, for example). The nonvolatile memory 3818 may include microelectronic devices (e.g., the microelectronic device 3600 of FIG. 36) and structures (e.g., the microelectronic device structure 100 of FIG. 1) described above, or a combination thereof.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:
1. A microelectronic device, comprising:
 a pair of stack structures, the pair comprising:
  a lower stack structure; and
  an upper stack structure overlying the lower stack structure, the lower stack structure and the upper stack structure each comprising a vertically alternating sequence of insulative structures and conductive structures arranged in tiers;
a source region vertically interposed between the lower stack structure and the upper stack structure, the source region comprising at least one conductive material comprising, along a lower surface thereof, an array of V-shaped extensions;
a first array of pillars extending, through the upper stack structure, from proximate the source region toward a first drain region above the upper stack structure; and
a second array of pillars extending, through the lower stack structure, from proximate the source region toward a second drain region below the lower stack structure.

2. The microelectronic device of claim 1, further comprising vertically stacked bit lines below the lower stack structure.

3. The microelectronic device of claim 1, wherein at least one pillar, of one or more of the first array of pillars and the second array of pillars, comprises cell material enclosing an insulative void.

4. The microelectronic device of claim 3, wherein the cell material tapers to define a V-shape along a lower end of the at least one pillar.

5. The microelectronic device of claim 3, wherein:
the at least one pillar comprises a first pillar within the first array of pillars; and
the cell material, of the first pillar, extends through an insulative material vertically interposed between the upper stack structure and the source region.

6. The microelectronic device of claim 5, wherein:
the at least one pillar further comprises a second pillar within the second array of pillars; and
the cell material, of the second pillar, extends through an additional insulative material vertically interposed between the lower stack structure and bit line contacts below the lower stack structure.

7. The microelectronic device of claim 1, further comprising an array of support structures extending through the source region, the support structures comprising an insulative material.

8. The microelectronic device of claim 1, further comprising at least one slit structure horizontally interposed between the pair of stack structures and a neighboring pair of additional stack structures.

9. The microelectronic device of claim 8, further comprising conductive bridge structures extending laterally through the at least one slit structure, from the source region to an additional source region vertically interposed between the additional stack structures of the neighboring pair of additional stack structures.

10. A method of forming a microelectronic device, the method comprising:
forming a lower stack structure comprising a vertically alternating sequence of insulative structures and sacrificial structures arranged in tiers;
forming a lower array of pillar openings extending through the lower stack structure;
forming, above the lower stack structure and in at least upper portions of the pillar openings of the lower array, at least one sacrificial material;
forming, above the at least one sacrificial material, an upper stack structure comprising an additional vertically alternating sequence of additional insulative structures and additional sacrificial structures arranged in additional tiers;
forming an upper array of pillar openings extending through the upper stack structure;
removing the at least one sacrificial material to form extended openings, the extended openings comprising:
the pillar openings of the upper array,
the pillar openings of the lower array, and
a cavity formed by removing the at least one sacrificial material;
conformally forming cell material in the extended openings;
removing the cell material from the cavity, leaving the cell material in the pillar openings of the upper array to form an upper array of pillars, and leaving the cell material in the pillar openings of the lower array to form a lower array of pillars; and
forming at least one conductive material in the cavity to form an interdeck source region vertically interposed between the upper array of pillars and the lower array of pillars; and
replacing the sacrificial structures of the lower stack structure and of the upper stack structure with conductive structures,
the method forming a microelectronic device comprising:
a pair of stack structures, the pair comprising:
the lower stack structure; and
the upper stack structure overlying the lower stack structure,
the lower stack structure and the upper stack structure each comprising a respective group of the vertically alternating sequence of the insulative structures and the conductive structures arranged in the tiers;
the interdeck source region vertically interposed between the lower stack structure and the upper stack structure, the interdeck source region comprising at least one conductive material comprising, along a lower surface thereof, an array of V-shaped extensions;
the upper array of pillars extending, through the upper stack structure, from proximate the interdeck source region toward a first drain region above the upper stack structure; and
the lower array of pillars extending, through the lower stack structure, from proximate the interdeck source region toward a second drain region below the lower stack structure.

11. The method of claim 10, further comprising, before forming the lower stack structure:
forming an insulative material on a base structure;
forming Y-shaped openings extending through the insulative material; and
filling the Y-shaped openings with additional sacrificial material.

12. The method of claim 10, wherein forming the lower stack structure comprises forming the vertically alternating sequence of the insulative structures and the sacrificial structures above a series of stacked bit lines.

13. The method of claim 10, wherein forming, above the lower stack structure and in at least upper portions of the pillar openings of the lower array, the at least one sacrificial material comprises:
forming a first sacrificial material in the upper portions of the pillar openings of the lower array of pillar openings;
forming an insulative material above the first sacrificial material;

forming Y-shaped openings extending through the insulative material; and forming a second sacrificial material in the Y-shaped openings and above the lower stack structure.

14. The method of claim 10, further comprising, after forming the at least one sacrificial material and before forming the upper stack structure:

forming an insulative material on the at least one sacrificial material;

forming Y-shaped openings extending through the insulative material; and filling the Y-shaped openings with additional sacrificial material.

15. The method of claim 10, further comprising, after forming the upper array of pillar openings and before removing the at least one sacrificial material:

forming an additional sacrificial material in at least upper portions of the pillar openings of the upper array of pillar openings; and forming an insulative material on the additional sacrificial material; and forming Y-shaped openings extending through the insulative material.

16. The method of claim 10, further comprising, before replacing the sacrificial structures, forming at least one slit extending through the upper stack structure and through the lower stack structure to expose the sacrificial structures of the lower stack structure and of the upper stack structure.

17. The method of claim 10, further comprising, before forming the upper stack structure, forming an insulative material along a lateral periphery of a region, of the at least one sacrificial material, vertically above the lower array of pillar openings to isolate the region from laterally adjacent regions of the at least one sacrificial material.

18. The method of claim 17, further comprising forming an additional amount of the at least one sacrificial material in a portion of the insulative material extending laterally from the region of the at least one sacrificial material, the portion of the insulative material isolating the additional amount of the at least one sacrificial material from the laterally adjacent regions of the at least one sacrificial material.

19. The method of claim 18, wherein removing the at least one sacrificial material to form the extended openings further comprises removing the additional amount of the at least one sacrificial material to form a bridge opening communicating with the cavity.

20. A microelectronic device, comprising:

at least two blocks, each of the blocks comprising:

a source region vertically interposed between a lower stack structure and an upper stack structure, the lower stack structure and the upper stack structure each comprising insulative structures vertically alternating with conductive structures, the source region comprising at least one conductive material comprising, along a lower surface thereof, an array of V-shaped extensions;

a lower pillar array extending through the lower stack structure;

an upper pillar array extending through the upper stack structure;

a lower drain region below the lower pillar array; and an upper drain region above the upper pillar array;

a slit structure horizontally interposed between neighboring blocks of the at least two blocks; and conductive bridge structures spanning the slit structure, from the source region of one of the neighboring blocks to the source region of another of the neighboring blocks.

21. The microelectronic device of claim 20, wherein bases of pillars of the lower pillar array and bases of additional pillars of the upper pillar array taper in lateral width.

22. The microelectronic device of claim 21, further comprising stacked bit lines below the lower drain region.

23. An electronic system, comprising:

an input device;

an output device;

a processor device operably coupled to the input device and to the output device; and a memory device operably coupled to the processor device and comprising at least one microelectronic device structure, the at least one microelectronic device structure comprising:

a source region vertically interposed between a pair of stack structures, each of the stack structures comprising insulative structures vertically interleaved with conductive structures;

an array of support structures extending through the source region, the support structures comprising an insulative material; and pillars extending through one stack structure of the pair of stack structures, the pillars comprising a channel material extending from the source region either to an upper drain region above the pair of stack structures or to a lower drain region below the pair of stack structures.

* * * * *